US011682701B2

(12) United States Patent
Bojarski et al.

(10) Patent No.: US 11,682,701 B2
(45) Date of Patent: Jun. 20, 2023

(54) QUANTUM DOT DEVICES

(71) Applicant: Intel Corporation, Santa Clara, CA (US)

(72) Inventors: Stephanie A. Bojarski, Beaverton, OR (US); Hubert C. George, Portland, OR (US); Sarah Atanasov, Beaverton, OR (US); Nicole K. Thomas, Portland, OR (US); Ravi Pillarisetty, Portland, OR (US); Lester Lampert, Portland, OR (US); Thomas Francis Watson, Portland, OR (US); David J. Michalak, Portland, OR (US); Roman Caudillo, Portland, OR (US); Jeanette M. Roberts, North Plains, OR (US); James S. Clarke, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 759 days.

(21) Appl. No.: 16/367,155

(22) Filed: Mar. 27, 2019

(65) Prior Publication Data

US 2020/0312963 A1  Oct. 1, 2020

(51) Int. Cl.
*H01L 29/12* (2006.01)
*H01L 29/78* (2006.01)
(Continued)

(52) U.S. Cl.
CPC ........... *H01L 29/122* (2013.01); *G06N 10/00* (2019.01); *H01L 21/76802* (2013.01);
(Continued)

(58) Field of Classification Search
CPC ............. H01L 29/122; H01L 21/76802; H01L 29/7851; H01L 29/7613; G06N 10/00
See application file for complete search history.

(56) References Cited

U.S. PATENT DOCUMENTS

2010/0006821 A1  1/2010  Choi et al.
2012/0074386 A1  3/2012  Rachmady et al.
(Continued)

FOREIGN PATENT DOCUMENTS

WO  2017155531 A1  9/2017
WO  2017213638 A1  12/2017
(Continued)

OTHER PUBLICATIONS

U.S. Appl. No. 16/018,751, filed Jun. 29, 2018, Quantum Dot Devices with Overlapping Gates.
(Continued)

*Primary Examiner* — Syed I Gheyas
(74) *Attorney, Agent, or Firm* — Akona IP; Natalya Hartmann

(57) ABSTRACT

Disclosed herein are quantum dot devices, as well as related computing devices and methods. For example, in some embodiments, a quantum dot device may include: a quantum well stack and a plurality of linear arrays of gates above the quantum well stack to control quantum dot formation in the quantum well stack. An insulating material may be between a first linear array of gates and a second linear array of gates, the insulating material may be between individual gates in the first linear array of gates, and gate metal of the first linear array of gates may extend over the insulating material.

22 Claims, 43 Drawing Sheets

(51) Int. Cl.
*H01L 27/088* (2006.01)
*H01L 23/528* (2006.01)
*G06N 10/00* (2022.01)
*H01L 21/768* (2006.01)
*H01L 23/522* (2006.01)
*H01L 29/66* (2006.01)

(52) U.S. Cl.
CPC ...... *H01L 23/5226* (2013.01); *H01L 23/5283* (2013.01); *H01L 27/0886* (2013.01); *H01L 29/66795* (2013.01); *H01L 29/7851* (2013.01)

(56) References Cited

U.S. PATENT DOCUMENTS

| | | |
|---|---|---|
| 2013/0264617 A1 | 10/2013 | Joshi et al. |
| 2019/0006572 A1 | 1/2019 | Falcon et al. |
| 2019/0042964 A1 | 2/2019 | Elsherbini et al. |
| 2019/0042967 A1 | 2/2019 | Yoscovits et al. |
| 2019/0042968 A1 | 2/2019 | Lampert et al. |
| 2019/0043822 A1 | 2/2019 | Falcon et al. |
| 2019/0043919 A1 | 2/2019 | George et al. |
| 2019/0043950 A1 | 2/2019 | George et al. |
| 2019/0043951 A1 | 2/2019 | Thomas et al. |
| 2019/0043952 A1 | 2/2019 | Thomas et al. |
| 2019/0043953 A1 | 2/2019 | George et al. |
| 2019/0043955 A1 | 2/2019 | George et al. |
| 2019/0043968 A1 | 2/2019 | Lampert et al. |
| 2019/0043973 A1 | 2/2019 | George et al. |
| 2019/0043974 A1 | 2/2019 | Thomas et al. |
| 2019/0043975 A1 | 2/2019 | George et al. |
| 2019/0043989 A1 | 2/2019 | Thomas et al. |
| 2019/0044044 A1 | 2/2019 | Lampert et al. |
| 2019/0044045 A1 | 2/2019 | Thomas et al. |
| 2019/0044046 A1 | 2/2019 | Caudillo et al. |
| 2019/0044047 A1 | 2/2019 | Elsherbini et al. |
| 2019/0044048 A1 | 2/2019 | George et al. |
| 2019/0044049 A1 | 2/2019 | Thomas et al. |
| 2019/0044050 A1 | 2/2019 | Pillarisetty et al. |
| 2019/0044051 A1 | 2/2019 | Caudillo et al. |
| 2019/0044066 A1 | 2/2019 | Thomas et al. |
| 2019/0044668 A1 | 2/2019 | Elsherbini et al. |
| 2019/0055038 A1 | 3/2019 | Jeon et al. |
| 2019/0066840 A1 | 4/2019 | Schoenberg |
| 2019/0066843 A1 | 4/2019 | Carlson |
| 2019/0131511 A1 | 5/2019 | Clarke et al. |
| 2019/0140073 A1 | 5/2019 | Pillarisetty et al. |
| 2019/0148530 A1 | 5/2019 | Pillarisetty et al. |
| 2019/0157393 A1 | 5/2019 | Roberts et al. |
| 2019/0164077 A1 | 5/2019 | Roberts et al. |
| 2019/0164959 A1 | 5/2019 | Thomas et al. |
| 2019/0165152 A1 | 5/2019 | Roberts et al. |
| 2019/0117883 A1 | 6/2019 | Abrams et al. |
| 2019/0117929 A1 | 6/2019 | Reinberg |
| 2019/0117930 A1 | 6/2019 | Al-Ali |
| 2019/0117972 A1 | 6/2019 | Schmidt et al. |
| 2019/0117973 A1 | 6/2019 | Schmidt et al. |
| 2019/0117974 A1 | 6/2019 | Creasey et al. |
| 2019/0117975 A1 | 6/2019 | Grossman et al. |
| 2019/0117977 A1 | 6/2019 | Puleo et al. |
| 2019/0125348 A1 | 6/2019 | Shelton, IV et al. |
| 2019/0125423 A1 | 6/2019 | Hinton et al. |
| 2019/0125456 A1 | 6/2019 | Shelton, IV et al. |
| 2019/0125498 A1 | 6/2019 | Bernhard |
| 2019/0125499 A1 | 6/2019 | Uchitel et al. |
| 2019/0125500 A1 | 6/2019 | Oskam et al. |
| 2019/0125501 A1 | 6/2019 | Esbech et al. |
| 2019/0181256 A1 | 6/2019 | Roberts et al. |
| 2019/0194016 A1 | 6/2019 | Roberts et al. |
| 2019/0198618 A1 | 6/2019 | George et al. |
| 2019/0132963 A1 | 7/2019 | Yu et al. |
| 2019/0133027 A1 | 7/2019 | Herbster |
| 2019/0135769 A1 | 7/2019 | Thimmaiah et al. |
| 2019/0135770 A1 | 7/2019 | Plemper et al. |
| 2019/0135771 A1 | 7/2019 | Teverovskiy et al. |
| 2019/0206991 A1 | 7/2019 | Pillarisetty et al. |
| 2019/0206992 A1 | 7/2019 | George et al. |
| 2019/0206993 A1 | 7/2019 | Pillarisetty et al. |
| 2019/0214385 A1 | 7/2019 | Roberts et al. |
| 2019/0221659 A1 | 7/2019 | George et al. |
| 2019/0229188 A1 | 7/2019 | Clarke et al. |
| 2019/0229189 A1 | 7/2019 | Clarke et al. |
| 2019/0252377 A1 | 8/2019 | Clarke et al. |
| 2019/0252536 A1 | 8/2019 | George et al. |
| 2019/0259850 A1 | 8/2019 | Pillarisetty et al. |
| 2019/0266511 A1 | 8/2019 | Pillarisetty et al. |
| 2019/0267692 A1 | 8/2019 | Roberts et al. |
| 2019/0273197 A1 | 9/2019 | Roberts et al. |
| 2019/0288176 A1 | 9/2019 | Yoscovits et al. |
| 2019/0296214 A1 | 9/2019 | Yoscovits et al. |
| 2019/0305037 A1 | 10/2019 | Michalak et al. |
| 2019/0305038 A1 | 10/2019 | Michalak et al. |
| 2019/0312128 A1 | 10/2019 | Roberts et al. |
| 2019/0334020 A1 | 10/2019 | Amin et al. |
| 2019/0341459 A1 | 11/2019 | Pillarisetty et al. |
| 2019/0363181 A1 | 11/2019 | Pillarisetty et al. |
| 2019/0363239 A1 | 11/2019 | Yoscovits et al. |
| 2019/0392352 A1 | 12/2019 | Lampert et al. |

FOREIGN PATENT DOCUMENTS

| | | |
|---|---|---|
| WO | 2017213639 A1 | 12/2017 |
| WO | 2017213641 A1 | 12/2017 |
| WO | 2017213645 A1 | 12/2017 |
| WO | 2017213646 A1 | 12/2017 |
| WO | 2017213647 A1 | 12/2017 |
| WO | 2017213648 A1 | 12/2017 |
| WO | 2017213649 A1 | 12/2017 |
| WO | 2017213651 A1 | 12/2017 |
| WO | 2017213661 A1 | 12/2017 |
| WO | 2017217958 A1 | 12/2017 |
| WO | 2018030977 A1 | 2/2018 |
| WO | 2018044267 A1 | 3/2018 |
| WO | 2018057013 A1 | 3/2018 |
| WO | 2018057015 A1 | 3/2018 |
| WO | 2018057018 A1 | 3/2018 |
| WO | 2018057023 A1 | 3/2018 |
| WO | 2018057024 A1 | 3/2018 |
| WO | 2018057027 A1 | 3/2018 |
| WO | WO-2018044267 A1 * | 3/2018 |
| WO | 2018063139 A1 | 4/2018 |
| WO | 2018063168 A1 | 4/2018 |
| WO | 2018063170 A1 | 4/2018 |
| WO | 2018063202 A1 | 4/2018 |
| WO | 2018063203 A1 | 4/2018 |
| WO | 2018063205 A1 | 4/2018 |
| WO | 2018106215 A1 | 6/2018 |
| WO | 2018118098 A1 | 6/2018 |
| WO | 2018143986 A1 | 8/2018 |
| WO | 2018160184 A1 | 9/2018 |
| WO | 2018160185 A1 | 9/2018 |
| WO | 2018160187 A1 | 9/2018 |
| WO | 2018164656 A1 | 9/2018 |
| WO | 2018182571 A1 | 10/2018 |
| WO | 2018182584 A1 | 10/2018 |
| WO | 2018200006 A1 | 11/2018 |
| WO | 2018231212 A1 | 12/2018 |
| WO | 2018231241 A1 | 12/2018 |
| WO | 2018236374 A1 | 12/2018 |
| WO | 2018236403 A1 | 12/2018 |
| WO | 2018236404 A1 | 12/2018 |
| WO | 2018236405 A1 | 12/2018 |
| WO | 2019004990 A1 | 1/2019 |
| WO | 2019004991 A1 | 1/2019 |
| WO | 2019032114 A1 | 2/2019 |
| WO | 2019032115 A1 | 2/2019 |
| WO | 2019117883 A1 | 6/2019 |
| WO | 2019117929 A1 | 6/2019 |
| WO | 2019117972 A1 | 6/2019 |
| WO | 2019117974 A1 | 6/2019 |
| WO | 2019117975 A1 | 6/2019 |
| WO | 2019125348 A1 | 6/2019 |

(56) References Cited

FOREIGN PATENT DOCUMENTS

| WO | 2019125423 A1 | 6/2019 |
|---|---|---|
| WO | 2019125500 A1 | 6/2019 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.

"A two-qubit logic gate in silicon," Veldhorst et al., Nature, vol. 526, Oct. 15, 2015, pp. 410-414.

"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.

"Independent, extensible control of same-frequency superconducting qubits by selective broadcasting," Asaad et al., Netherlands Organisation for Applied Scientific Research, Aug. 28, 2015, 17 pages.

"Fast sensing of double-dot charge arrangement and spin state with an rf sensor quantum dot," Barthel et al, Materials Department, University of California, Santa Barbara, Jan. 16, 2014, 4 pages.

"Undoped accumulation-mode Si/SiGe quantum dots," Borselli et al, HRL Laboratories, LLC., Jul. 15, 2014, 4 pages.

"Multilayer microwave integrated quantum circuits for scalable quantum computing," Brecht et al, Department of Applied Physics, Yale University, Sep. 4, 2015, 5 pages.

"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.

"Spin Relaxation and Decoherence of Holes in Quantum Dots," Bulaev et al., Phys. Rev. Lett. 95, 076805, Aug. 11, 2005, 1 page.

"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.

"Ultrafast optical control of individual quantum dot spin qubits," De Greve et al, Reports on Progress in Physics, vol. 76, No. 9, Sep. 4, 2013, 2 pages.

"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.

"How it's built: Micron/Intel3D NAND Micron Opens the Veil a Little," Moyer, Bryon, retrieved from https://www.eejournal.com/article/20160201-micron/ on Nov. 29, 2017, 9 pages.

"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.

"Platinum single-electron transistors with tunnel barriers made by atomic layer deposition", George et al., Department of Electrical Engineering, University of Notre Dame, Received Jul. 7, 2010:Published Nov. 5, 2010, 3 pages.

"Surface loss simulations of superconducting coplanar waveguide resonators," Wenner et al, Applied Physics Letters 99, 113513 (2011), pp. 113513-1 through 3.

"Quantum computation with quantum dots," Loss et al , Physical Review A, vol. 57, No. 1, Jan. 1998, pp. 120-126.

"Ultafast high-fidelity initialization of a quantum-dot spin qubit without magnetic fields," Mar et al., Phys. Rev. B 90 241303®, published Dec. 15, 2014, 1 page.

"Delaying Forever: Uniaxial Strained Silicon Transistors in a 90nm CMOS Technology," Mistry et al Portland Technology Department, TCAD, Intel Corp., 2 pages.

Supplementary Information, retrieved from www.nature.com, doi:10.1038/nature 15263, 8 pages.

"Magnetic field tuning of coplanar waveguide resonators," Healey, et al., Applied Physics Letters 93, 043513 (2008), pp. 043513-1 through 3 (4 pages with cover sheet).

"Embracing the quantum limit in silicon computing," Morton et al, Macmillan Publishers, Nov. 17, 2011, vol. 479, Nature, pp. 345-353.

"Review : Towards Spintronic Quantum Technologies with Dopants in Silicon," Morley, Gavin, Department of Physics, University of Warwich, 13 pages.

"A Reconfigurable Gate Architecture for Si/SiGe Quantum Dots," Zajac et al., Department of Physics, Princeton University; Department of Physics, University of California; Feb. 6, 2015, 5 pages.

"Scalable quantum circuit and control for a superconducting surface code," Versluis et al, Netherlands Organisation for Applied Scientific Research, Dec. 28, 2016, 9 pages.

"Defect reduction of selective Ge epitaxy in trenches on Si(001) substrates using aspect ratio trapping," Park et al., Applied Physics Letter 90, 052113 (2007), pp. 052113-1 through 3.

"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).

"Radio frequency measurements of tunnel couplings and singlet-triplet spin states in Si:P quantum dots," House et al., Nature Communications, 6:884, DOI: 10.1038/ncomms9848, pp. 1-6.

"Detecting bit-flip errors in a logical qubit using stabilizer measurements," Riste et al., Nature Communications, 6:6983, DOI: 10.1038/ncomms7983, pp. 1-6.

"Scalable gate architecture for densely packed semiconductor spin qubits," Zajac et al, Department of Physics, Princeton University; Sandia National Laboratories, 8 pages.

"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

"Single-electron Transistors fabricated with sidewall spacer patterning," Park et al., Superlattices and Microstructures 34 (2003) 231-239.

"Single-electron Transistors with wide operating temperature range," Dubuc et al., Applied Physics Letters 90, 113104 (2007) pp. 113104-1 through 3.

"Single-shot read-out of an individual electron spin in a quantum dot," Elzerman et al., Nature, vol. 430, Jul. 22, 2004, pp. 431-435.

"Suspending superconducting qubits by silicon micromachining," Chu et al., Department of Applied Physics, Yale University, Jun. 10, 2016, 10 pages.

"Single-charge tunneling in ambipolar silicon quantum dots," Müller, Filipp, Dissertation, University of Twente, Jun. 19, 2015, 148 pages.

"An addressable quantum dot qubit with fault-tolerant control-fidelity," Veldhorst et al., Nature Nanotechnology vol. 9, Dec. 2014, pp. 981-985.

* cited by examiner

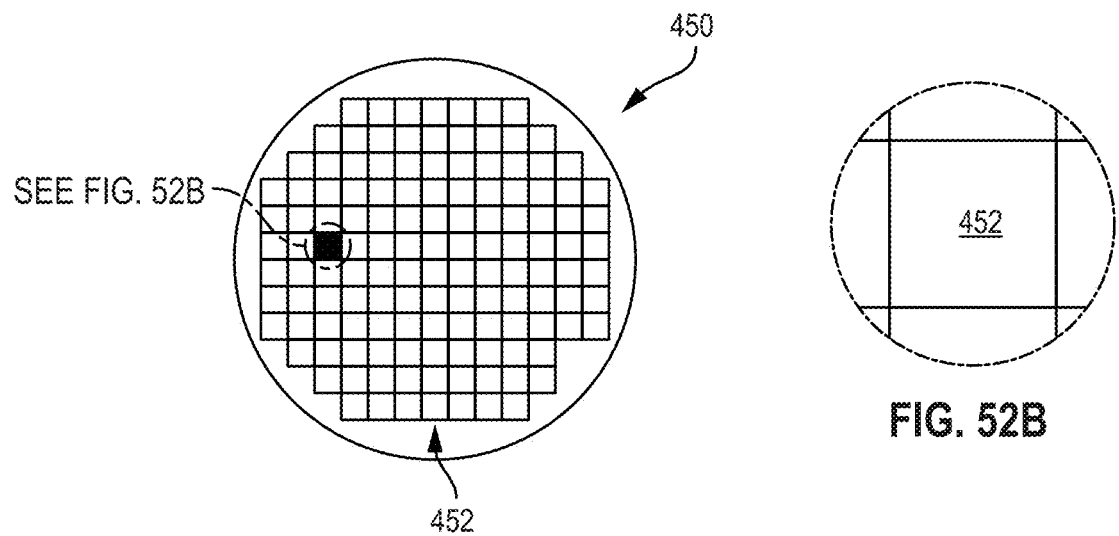
FIG. 52A
FIG. 52B
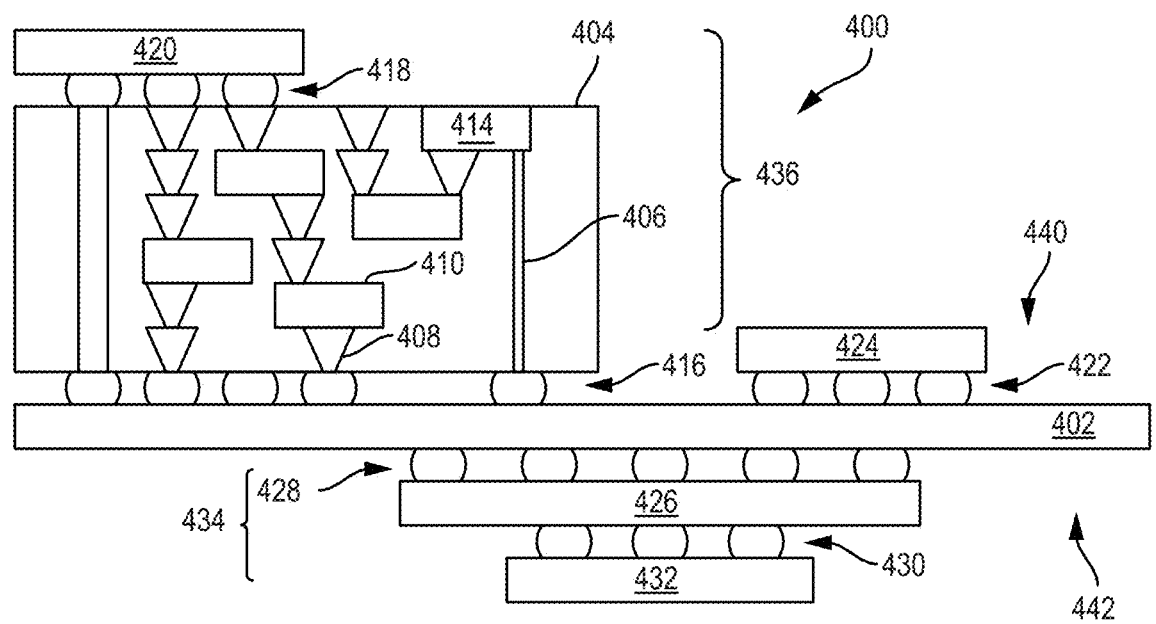
FIG. 53

QUANTUM DOT DEVICES

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 52A and 52B are top views of a wafer and dies that may include any of the quantum dot devices disclosed herein.

FIG. 53 is a cross-sectional side view of a device assembly that may include any of the quantum dot devices disclosed herein.

DETAILED DESCRIPTION

Figure 1A:
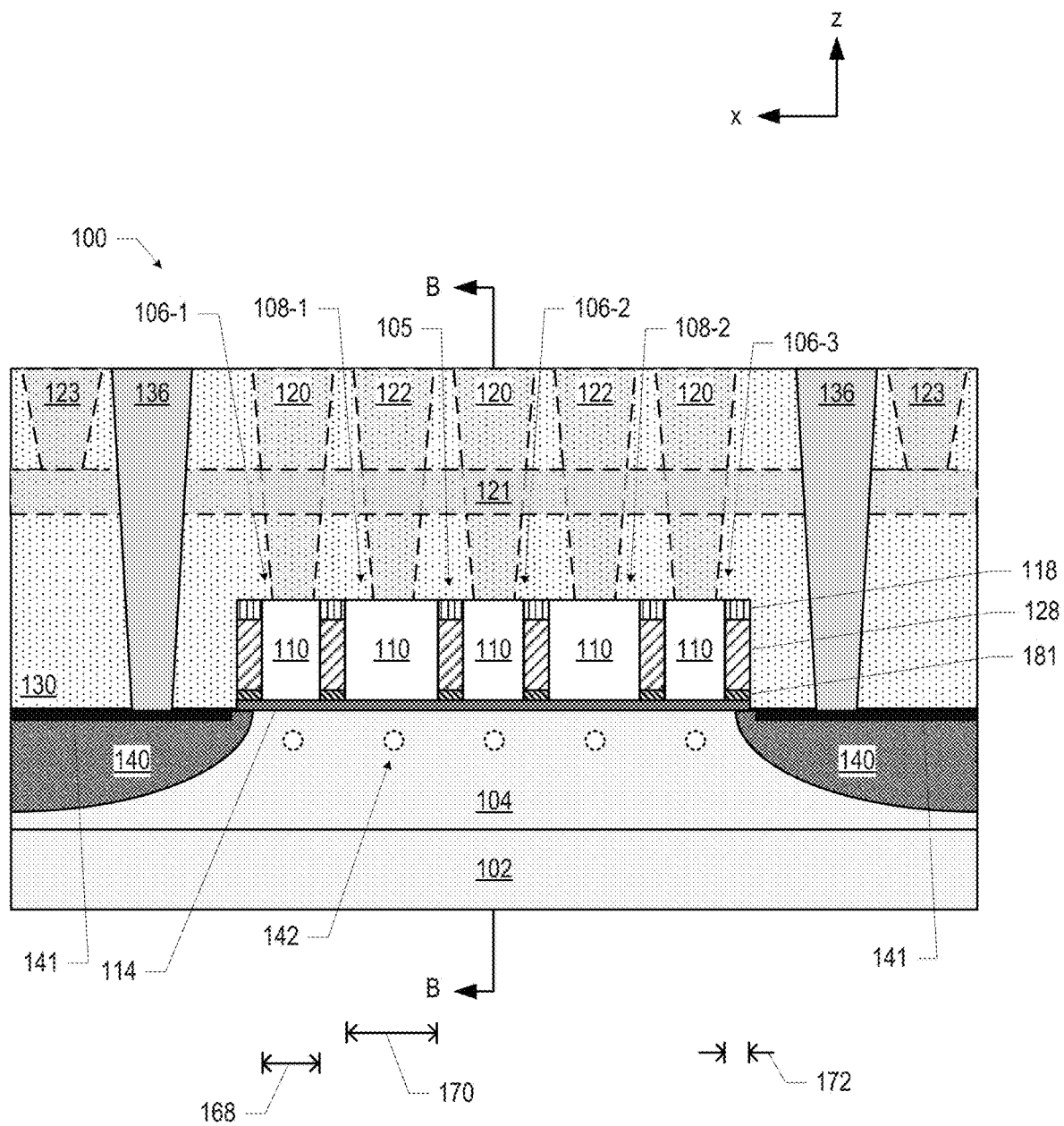
FIGS. 1A-1C are cross-sectional views of a quantum dot device, in accordance with various embodiments.

Disclosed herein are quantum dot devices, as well as related computing devices and methods. For example, in some embodiments, a quantum dot device may include: a quantum well stack and a plurality of linear arrays of gates above the quantum well stack to control quantum dot formation in the quantum well stack. An insulating material may be between a first linear array of gates and a second linear array of gates, the insulating material may be between individual gates in the first linear array of gates, and gate metal of the first linear array of gates may extend over the insulating material.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C). For convenience, the collection of drawings of FIGS. 1A-1C may be referred to herein as "FIG. 1," the collection of drawings of FIGS. 6A-6C may be referred to herein as "FIG. 6," etc.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "under," "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide. As used herein, a "magnet line" refers to a magnetic field-generating structure to influence (e.g., change, reset, scramble, or set) the spin states of quantum dots. One example of a magnet line, as discussed herein, is a conductive pathway that is proximate to an area of quantum dot formation and selectively conductive of a current pulse that generates a magnetic field to influence a spin state of a quantum dot in the area.

Figure 1B:
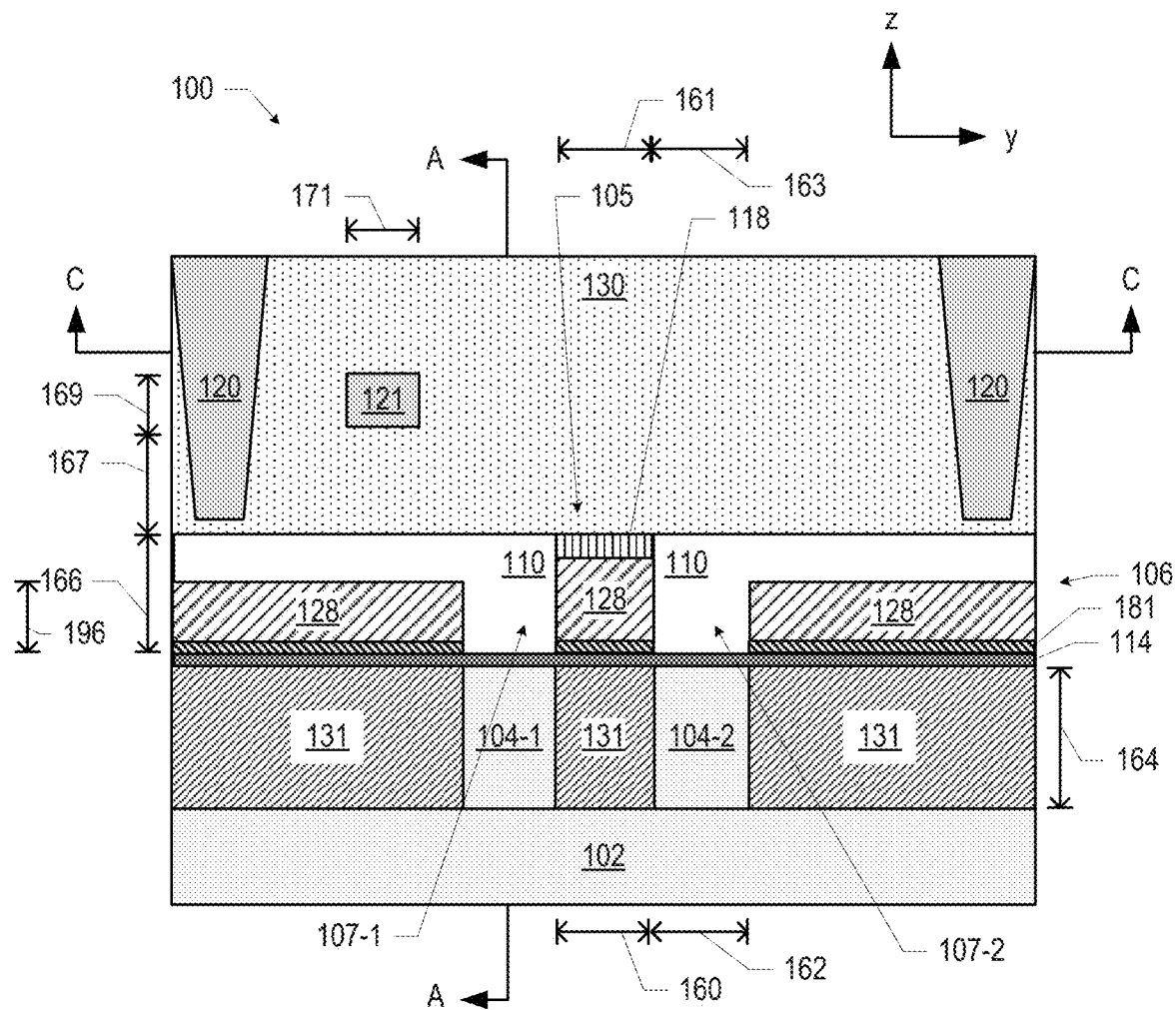
Figure 1C:
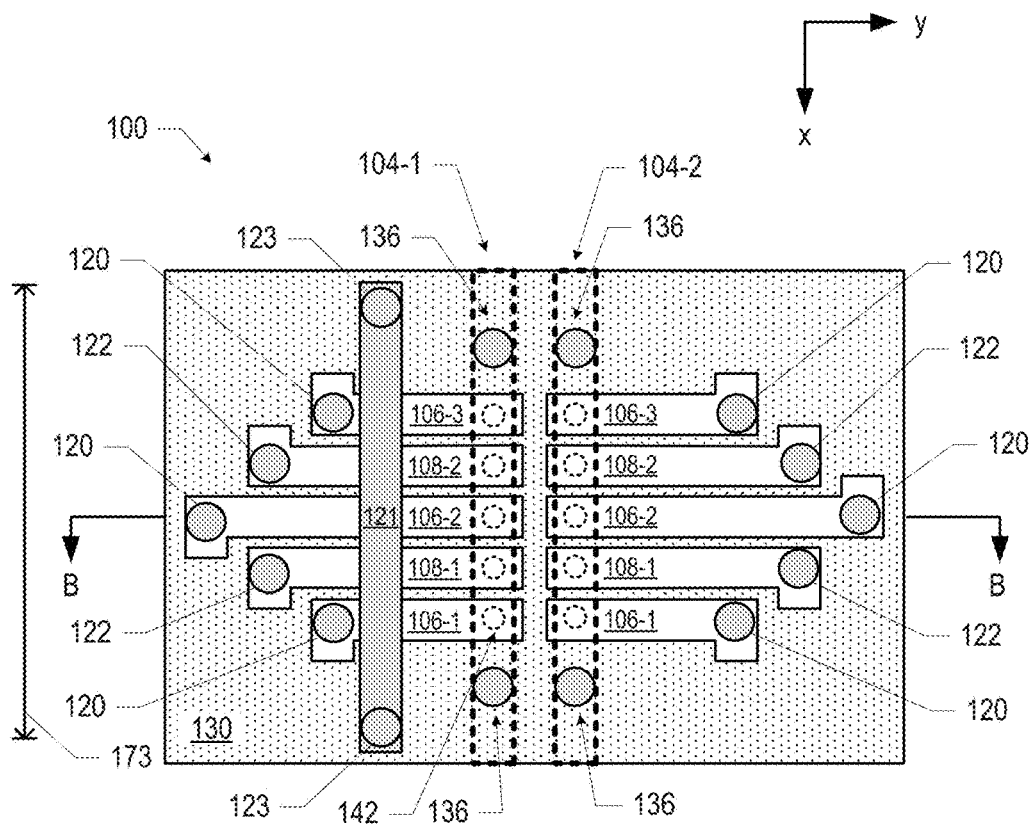

FIG. 1 presents cross-sectional views of a quantum dot device 100, in accordance with various embodiments. In particular, FIG. 1A illustrates the quantum dot device 100 taken along the section A-A of FIG. 1B (while FIG. 1B illustrates the quantum dot device 100 taken along the section B-B of FIG. 1A), and FIG. 1C illustrates the quantum dot device 100 taken along the section C-C of FIG. 1B with a number of components not shown to more readily illustrate how the gates 106/108 and the magnet line 121 may be patterned (while FIG. 1B illustrates a quantum dot device 100 taken along the section A-A of FIG. 1C). Although FIG. 1B indicates that the cross-section illustrated in FIG. 1A is taken through the fin 104-1, an analogous cross-section taken through the fin 104-2 may be identical, and thus the discussion of FIG. 1A refers generally to the "fin 104."

The quantum dot device 100 may include a base 102 and multiple fins 104 extending away from the base 102. The base 102 and the fins 104 may include a substrate and a quantum well stack (not shown in FIG. 1, but discussed below with reference to the substrate 144 and the quantum well stack 146), distributed in any of a number of ways between the base 102 and the fins 104. The base 102 may include at least some of the substrate, and the fins 104 may each include a quantum well layer of the quantum well stack (discussed below with reference to the quantum well layer 152). Examples of base/fin arrangements are discussed below with reference to the base fin arrangements 158 of FIGS. 38-44.

Although only two fins, 104-1 and 104-2, and two trench regions, 107-1 and 107-2, are shown in FIG. 1, this is simply for ease of illustration, and more than two fins 104/trench regions 107 may be included in the quantum dot device 100. In some embodiments, the total number of fins 104/trench regions 107 included in the quantum dot device 100 is an even number, with the fins 104/trench regions 107 organized into pairs including one active fin 104/trench region 107 and one read fin 104/trench region 107, as discussed in detail below. When the quantum dot device 100 includes more than two fins 104/trench regions 107, the fins 104/trench regions 107 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104/trench regions 107 for ease of illustration, but all the teachings of the present disclosure apply to quantum dot devices 100 with more fins 104/trench regions 107.

As noted above, each of the fins 104 may include a quantum well layer (not shown in FIG. 1, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 5 nanometers and 30 nanometers. In some embodiments, the fins 104 may each have a vertical dimension 164 between 90 nanometers and 400 nanometers (e.g., between 150 nanometers and 350 nanometers, or equal to 300 nanometers).

The fins 104 may be arranged in parallel, as illustrated in FIGS. 1B and 1C, and may be spaced apart by an insulating material 131, which may be disposed on opposite faces of the fins 104. The insulating material 131 may be a dielectric material, such as silicon oxide, silicon nitride, silicon carbide, silicon oxynitride, or silicon oxycarbide. The insulating material 131 may be, for example, a shallow trench isolation (STI) material. In some embodiments, the fins 104 may be spaced apart by a distance 160 between 50 nanometers and 250 nanometers.

An insulating material 128 may be disposed above the quantum well stack 146, and multiple trench regions 107 in the insulating material 128 may extend towards the quantum well stack 146. In the embodiment illustrated in FIG. 45, a gate dielectric 114 may be disposed at the "bottom" of the trench regions 107 and may extend up the "side walls" of the trench regions 107 and over adjacent portions of insulating material 128. Multiple gates may be disposed in the trench regions 107, above the fins 104. In the embodiment illustrated in FIG. 1A, three gates 106 and two gates 108 are shown as distributed on the top of the fin 104. This particular number of gates is simply illustrative, and any suitable number of gates may be used. Additionally, as discussed below with reference to FIG. 49, multiple groups of gates (like the gates illustrated in FIG. 1A) may be disposed on the fin 104. In some embodiments, the trench regions 107 may each have a vertical dimension 196 between 20 nanometers and 200 nanometers.

As shown in FIG. 1A, the gate 108-1 may be disposed between the gates 106-1 and 106-2, and the gate 108-2 may be disposed between the gates 106-2 and 106-3. A gate 106 may be spaced apart from an adjacent gate 108 by a gate wall 105. Individual gate walls 105 may include an etch stop material 181, an insulating material 128, and a hardmask 118, as shown. The etch stop material 181 may have any suitable material composition; for example, in some embodiments, the etch stop material 181 may include aluminum and oxygen (e.g., in the form of aluminum oxide). The insulating material 128 may be an interlayer dielectric material (ILD), such as silicon oxide (e.g., a chemical vapor deposition (CVD) oxide or a flowable CVD oxide), a carbon-doped oxide, silicon oxynitride, or a low-k dielectric material. The hardmask 118 may be formed of silicon nitride, silicon carbide, or another suitable material. In some embodiments, the hardmask 118 may not be present in the gate walls 105 of the quantum dot device 100 (e.g., a hardmask like the hardmask 118 may be removed during processing or not used at all, as discussed below). In some embodiments, the etch stop material 181 may not be included in the gate walls 105 of the quantum dot device 100, as discussed below.

As shown in FIG. 1B, the gate metal 110 of a gate 106/108 may extend over the insulating material 128 and into a trench region 107 in the insulating material 128. Each of the gates 106/108 may include a gate dielectric 114; in the embodiment illustrated in FIG. 1A, the gate dielectric 114 for each of the gates 106/108 is provided by a common continuous layer of gate dielectric 114 (e.g., on the fin 104); in other embodiments, the gate dielectric 114 of the gates 106/108 may be provided by separate portions of gate dielectric 114 (e.g., as discussed below with reference to FIG. 47). Further, the gate dielectric 114 used in gates 106/108 in one region of the quantum dot device 100 (e.g., in one area of a wafer used to form the quantum dot device 100) may have a different material composition than the gate dielectric 114 used in gates 106/108 in another region of the quantum dot device 100 (e.g., to tune the electrical properties of the gates 106/108 in different regions). In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 and 108 may also include a gate metal 110 between the adjacent gate walls 105. In some embodiments, the gate metal 110 may be a superconductor, such as aluminum, titanium nitride (e.g., deposited via ALD), or niobium titanium nitride. In some embodiments, the gate metal 110 may include tungsten, cobalt, or copper.

In some embodiments, the material structure of the gate metal 110 may be selected so as to induce strain in the underlying material layers (including the quantum well layer 152). As used herein, a "relaxed" material may be a material that is substantially free from compressive or tensile strain, while a "strained" material may be a material exhibiting compressive or tensile strain. Strain in the quantum well layer 152 may improve the mobility of the carriers that flow therein, which may improve performance. In particular, tensile strain may improve electron mobility (and thus may be useful for quantum dot devices 100 in which electrons are the carriers of interest, as discussed above) and compressive strain may improve hole mobility (and thus may be useful for quantum dot devices 100 in which holes are the carriers of interest, as discussed above). Strain may also increase valley splitting, and may also be used to define the location of quantum dots 142 by improved electric field control, both of which may be advantageous for the operation of a quantum dot device 100. The strain induced in the underlying material layers by the gate metal 110 may not be uniform through these underlying material layers, but may vary along the material layers depending upon the relative location below the gate metal 110. The gate metal 110 may be selected to achieve a particular differential strain landscape in the underlying material layers (e.g., in the quantum well layer 152) that may improve the electric field control of the potential energies in these material layers (e.g., the "barrier" and "plunger" potentials, as discussed below). In some embodiments, the gate metal 110 may itself may be strained (e.g., with strain induced during deposition, as known in the art). In other embodiments, the differential strain induced in the quantum well layer 152 may be a function of the interaction between the gate metals 110 and the adjacent materials (e.g., the gate dielectric 114, a barrier layer 156 (discussed below), etc.).

In some embodiments, the microstructure of the gate metal 110 may be a damascene fill grain structure. As used herein, a "damascene fill grain structure" refers to a microstructure in which the grains nucleate along the adjacent surfaces (e.g., the gate dielectric 114 and the gate walls 105), and may be contrasted with a microstructure in which the grains are columnar (which may result, for example, when the gate metal 110 is initially blanket deposited and then subtractively patterned). A gate metal 110 with a damascene fill grain structure may be formed by using a fill technique in which the gate metal 110 is deposited after the gate dielectric 114 and gate walls 105 have been formed.

A liner material (not shown) may be present between the gate metal 110 and the surrounding structures (e.g., the gate dielectric 114 and the gate walls 105). The liner material may improve adhesion of the gate metal 110 to these surrounding structures, and/or mitigate undesirable diffusion of materials into and/or out of the gate metal 110. In some embodiments, the liner material may include titanium and nitrogen (e.g., in the form of titanium nitride) or tantalum and nitrogen (e.g., in the form of tantalum nitride). In other embodiments, no liner material may be present.

The dimensions of the gates 106/108 may take any suitable values. For example, in some embodiments, the z-height 166 of the gate metal 110 may be between 40 nanometers and 400 nanometers (e.g., approximately 50 nanometers). In some embodiments, the length 168 of the gate metal 110 (i.e., in the x-direction) of the gates 106 may be between 20 nanometers and 60 nanometers (e.g., 40 nanometers). In some embodiments, the length 170 of the gate metal 110 of the gates 108 may be between 20 nanometers and 60 nanometers (e.g., 40 nanometers). In some embodiments, the length 168 may be equal to the length 170, while in other embodiments, the length 168 may be different than the length 170 (as shown in FIG. 1A). In some embodiments, the thickness 172 of the gate walls 105 (i.e., in the x-direction) may be between 3 nanometers and 30 nanometers. As indicated in FIG. 1B, the gates 106/108 on one fin 104 may be isolated from their counterpart gates on the other fin 104 by the intervening gate walls 105. The width 161 of the gate walls 105 between gates 106/108 on different fins 104 (corresponding to the distance between the trench regions 107-1 and 107-2) may take any of the forms of the distance 160 disclosed herein. For example, in some embodiments, the trench regions 107 may each have a width 163 between 10 nanometers and 30 nanometers. In some embodiments, the width 161 may be equal to the distance 160, while in other embodiments, the width 161 may be different than the distance 160. The width 163 of the gates 106/108 (i.e., in the y-direction, corresponding to the width 163 of the trench regions 107) may take any of the forms of the width 162 disclosed herein; in some embodiments, the width 163 may be equal to the width 162, while in other embodiments, the width 163 may be different than the width 162.

Although all of the gates 106 are illustrated in the accompanying drawings as having the same length 168 of the gate metal 110, in some embodiments, the "outermost" gates 106 (e.g., the gates 106-1 and 106-3 of the embodiment illustrated in FIG. 1A) may have a greater length 168 than the "inner" gates 106 (e.g., the gate 106-2 in the embodiment illustrated in FIG. 1A). For example, in some embodiments, the outermost gates 106 may have a length 168 between 100 nanometers and 500 nanometers. Such longer "outside" gates 106 may provide spatial separation between the doped regions 140 and the areas under the gates 108 and the inner gates 106 in which quantum dots 142 may form, and thus may reduce the perturbations to the potential energy landscape under the gates 108 and the inner gates 106 caused by the doped regions 140. In some embodiments, during operation of the quantum dot device 100, a 2DEG may form under the outermost gates 106; this 2DEG may separate the "active" device region (under the gates 106/108) from the doped region 140 (which has a large density of implanted charge carriers).

As shown in FIG. 1A, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 1A and 1C for ease of illustration, but five are indicated as dotted circles in each fin 104. The location of the quantum dots 142 in FIG. 1A is not intended to indicate a particular geometric positioning of the quantum dots 142. The gate walls 105 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The fins 104 may include doped regions 140 that may serve as a reservoir of charge carriers for the quantum dot device 100. For example, an n-type doped region 140 may supply electrons for electron-type quantum dots 142, and a p-type doped region 140 may supply holes for hole-type quantum dots 142. In some embodiments, an interface material 141 may be disposed at a surface of a doped region 140, as shown. The interface material 141 may facilitate electrical coupling between a conductive contact (e.g., a conductive via 136, as discussed below) and the doped region 140. The interface material 141 may be any suitable metal-semiconductor ohmic contact material; for example, in embodiments in which the doped region 140 includes silicon, the interface material 141 may include nickel silicide, aluminum silicide, titanium silicide, molybdenum silicide, cobalt silicide, tungsten silicide, or platinum silicide (e.g., as discussed below with reference to FIGS. 25-26). In some embodiments, the interface material 141 may be a non-silicide compound, such as titanium nitride. In some embodiments, the interface material 141 may be a metal (e.g., aluminum, tungsten, or indium). In some embodiments, the interface material 141 will be self-aligned to only where the conductive via 136 lands on the fin 104.

The quantum dot devices 100 disclosed herein may be used to form electron-type or hole-type quantum dots 142. Note that the polarity of the voltages applied to the gates 106/108 to form quantum wells/barriers depends on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a low potential barrier, the two quantum dots 142 may interact more strongly than if they were separated by a higher potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may contact the gates 106/108, and to the doped regions 140, to enable electrical connection to the gates 106/108 and the doped regions 140 to be made in desired locations. As shown in FIG. 1, the gates 106 may extend away from the fins 104, and conductive vias 120 may contact the gates 106 (and are drawn in dashed lines in FIG. 1A to indicate their location behind the plane of the drawing). The conductive vias 120 may contact the gate metal 110 of the gates 106. The gates 108 may extend away from the fins 104, and conductive vias 122 may contact the gates 108 (also drawn in dashed lines in FIG. 1A to indicate their location behind the plane of the drawing). The conductive vias 122 may contact the gate metal 110 of the gates 108. Conductive vias 136 may contact the interface material 141 and may thereby make electrical contact with the doped regions 140. The quantum dot device 100 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the doped regions 140 (e.g., via the conductive vias 136 and the interface material 141) to cause current to flow through the doped regions 140. When the doped regions 140 are doped with an n-type material, this voltage may be positive; when the doped regions 140 are doped with a p-type material, this voltage may be negative. The magnitude of this bias voltage may take any suitable value (e.g., between 0.25 volts and 2 volts).

The quantum dot device 100 may include one or more magnet lines 121. For example, a single magnet line 121 is illustrated in FIG. 1 proximate to the fin 104-1. The magnet line 121 may be formed of a conductive material, and may be used to conduct current pulses that generate magnetic fields to influence the spin states of one or more of the quantum dots 142 that may form in the fins 104. In some embodiments, the magnet line 121 may conduct a pulse to reset (or "scramble") nuclear and/or quantum dot spins. In some embodiments, the magnet line 121 may conduct a pulse to initialize an electron in a quantum dot in a particular spin state. In some embodiments, the magnet line 121 may conduct current to provide a continuous, oscillating magnetic field to which the spin of a qubit may couple. The magnet line 121 may provide any suitable combination of these embodiments, or any other appropriate functionality.

In some embodiments, the magnet line 121 may be formed of copper. In some embodiments, the magnet line 121 may be formed of a superconductor, such as aluminum. The magnet line 121 illustrated in FIG. 1 is non-coplanar with the fins 104, and is also non-coplanar with the gates 106/108. In some embodiments, the magnet line 121 may be spaced apart from the gates 106/108 by a distance 167. The distance 167 may take any suitable value (e.g., based on the desired strength of magnetic field interaction with the quantum dots 142); in some embodiments, the distance 167 may be between 25 nanometers and 1 micron (e.g., between 50 nanometers and 200 nanometers).

In some embodiments, the magnet line 121 may be formed of a magnetic material. For example, a magnetic material (such as cobalt) may be deposited in a trench in the insulating material 130 to provide a permanent magnetic field in the quantum dot device 100.

The magnet line 121 may have any suitable dimensions. For example, the magnet line 121 may have a thickness 169 between 25 nanometers and 100 nanometers. The magnet line 121 may have a width 171 between 25 nanometers and 100 nanometers. In some embodiments, the width 171 and thickness 169 of a magnet line 121 may be equal to the width and thickness, respectively, of other conductive lines in the quantum dot device 100 (not shown) used to provide electrical interconnects, as known in the art. The magnet line 121 may have a length 173 that may depend on the number and dimensions of the gates 106/108 that are to form quantum dots 142 with which the magnet line 121 is to interact. The magnet line 121 illustrated in FIG. 1 (and the magnet lines 121 illustrated in FIGS. 32-34 below) are substantially linear, but this need not be the case; the magnet lines 121 disclosed herein may take any suitable shape. Conductive vias 123 may contact the magnet line 121.

The conductive vias 120, 122, 136, and 123 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. In some embodiments, the insulating material 128 and the insulating material 130 may have the same material composition. As known in the art of integrated circuit manufacturing, conductive vias and lines may be formed in an iterative process in which layers of structures are formed on top of each other. In some embodiments, the conductive vias 120/122/136/123 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIG. 1 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

The quantum dot devices 100 disclosed herein may be manufactured using any suitable techniques. FIGS. 2-31 illustrate various example stages in the manufacture of the quantum dot device 100 of FIG. 1, in accordance with various embodiments. Although the particular manufacturing operations discussed below with reference to FIGS. 2-31 are illustrated as manufacturing a particular embodiment of the quantum dot device 100, these operations may be applied to manufacture many different embodiments of the quantum dot device 100, as discussed herein. Any of the elements discussed below with reference to FIGS. 2-31 may take the form of any of the embodiments of those elements discussed above (or otherwise disclosed herein).

Figure 2:
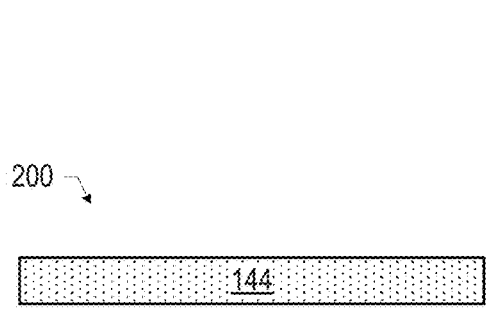
FIGS. 2-5, 6A-6C, 7A-7B, 8A-8B, 9A-9B, 10A-10B, 11A-11B, 12A-12B, 13A-13B, 14A-14B, 15A-15B, 16A-16B, 17A-17B, 18A-18B, 19A-19B, 20A-20B, 21A-21B, 22A-22B, 23-26, 27A-27B, 28A-28B, 29A-29B, 30A-30B, and 31A-31B illustrate various example stages in the manufacture of a quantum dot device, in accordance with various embodiments.

FIG. 2 illustrates a cross-sectional view of an assembly 200 including a substrate 144. The substrate 144 may include any suitable semiconductor material or materials. In some embodiments, the substrate 144 may include a semiconductor material. For example, the substrate 144 may include silicon (e.g., may be formed from a silicon wafer). Various embodiments of the substrate 144 are discussed below with reference to FIGS. 35-37.

Figure 3:
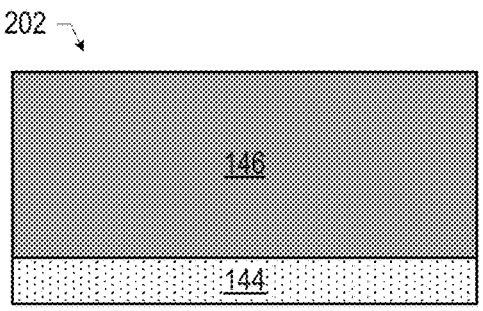

FIG. 3 illustrates a cross-sectional view of an assembly 202 subsequent to providing a quantum well stack 146 on the substrate 144 of the assembly 200 (FIG. 2). The quantum well stack 146 may include a quantum well layer (not shown) in which a 2DEG may form during operation of the quantum dot device 100. Various embodiments of the quantum well stack 146 are discussed below with reference to FIGS. 35-37.

Figure 4:
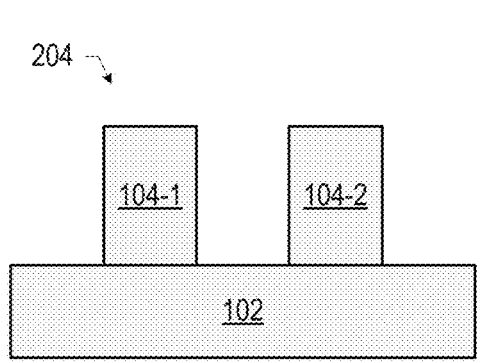

FIG. 4 illustrates a cross-sectional view of an assembly 204 subsequent to forming fins 104 in the assembly 202 (FIG. 3). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the quantum well stack 146 may be included in the fins 104. In particular, the quantum well layer (not shown) of the quantum well stack 146 may be included in the fins 104. Example arrangements in which the quantum well stack 146 and the substrate 144 are differently included in the base 102 and the fins 104 are discussed below with reference to FIGS. 38-44.

Figure 5:
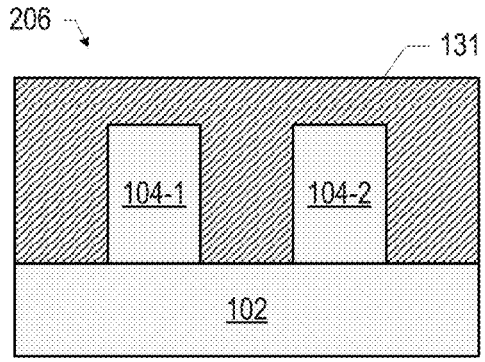

FIG. 5 illustrates a cross-sectional view of an assembly 206 subsequent to providing an insulating material 131 to the assembly 204 (FIG. 4). Any suitable material may be used as the insulating material 131 to electrically insulate the fins 104 from each other. As noted above, in some embodiments, the insulating material 131 may be a dielectric material, such as silicon oxide.

Figure 6A:
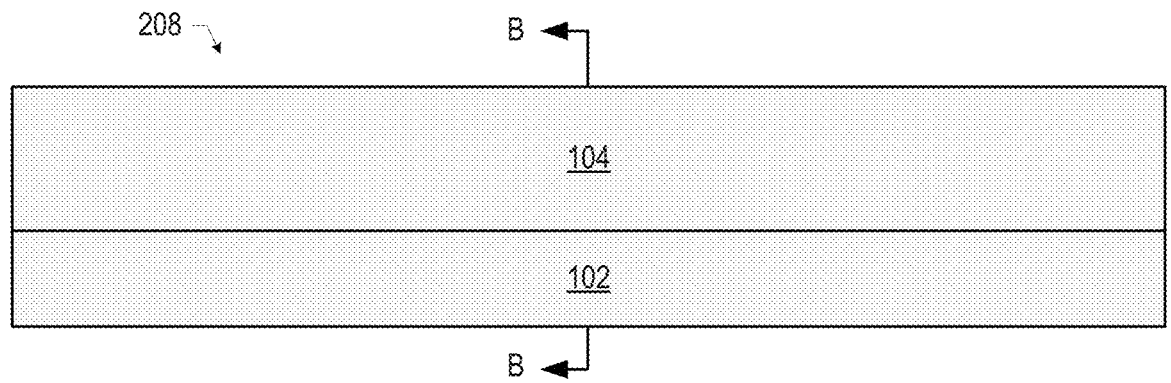
Figure 6B:
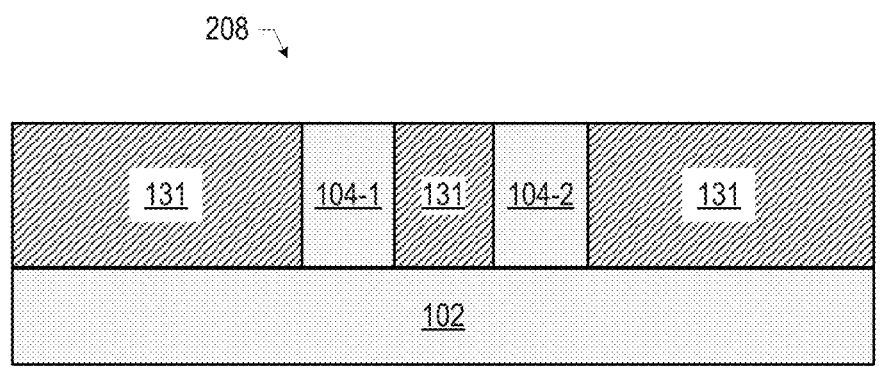
Figure 6C:
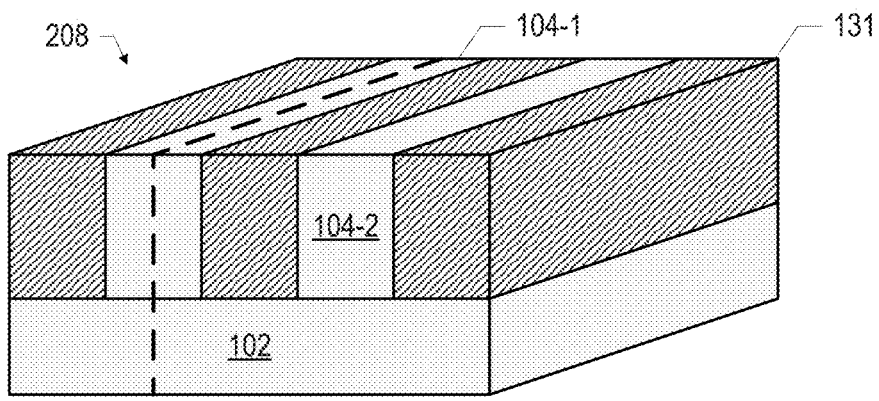

FIG. 6 illustrates an assembly 208 subsequent to planarizing the assembly 206 (FIG. 5) to remove the insulating material 131 above the fins 104. In particular, FIG. 6A is a cross-sectional view analogous to that of FIG. 1A, FIG. 6B is a cross-sectional view analogous to that of FIG. 1B, and FIG. 6C is a perspective view. The cross-sectional views of FIGS. 4-5 and 6B are taken parallel to the plane of the page of the perspective view of FIG. 6C. The cross-sectional view of FIG. 6A is taken along the dashed line along the fin 104-1 in FIG. 6C. In some embodiments, the assembly 206 may be planarized using a chemical mechanical polishing (CMP) technique.

Figure 7A:
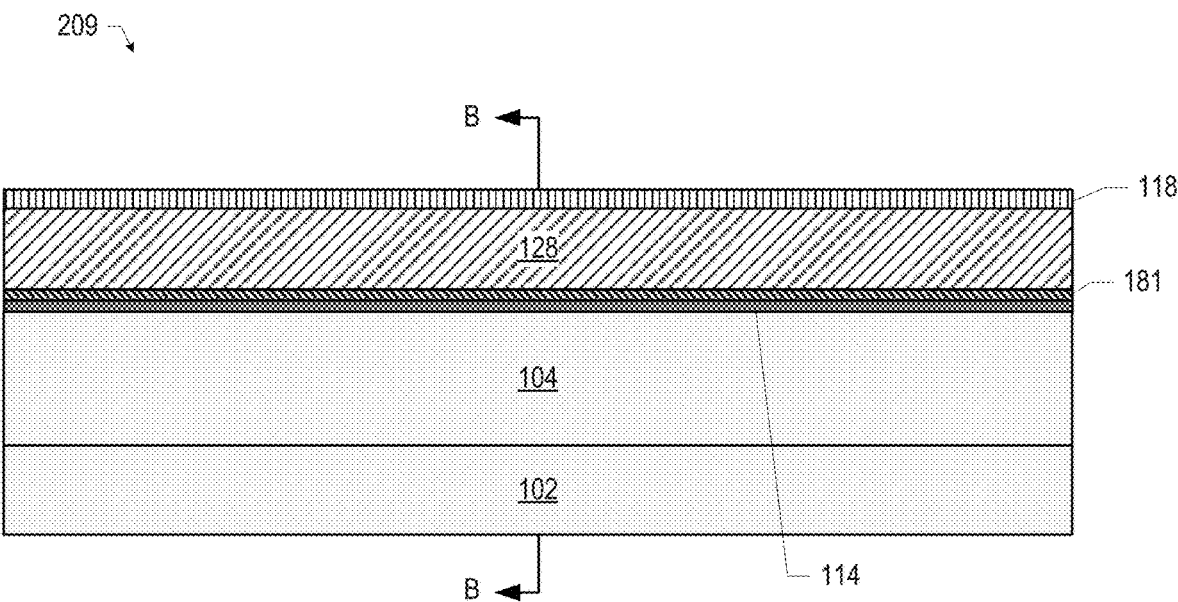
Figure 7B:
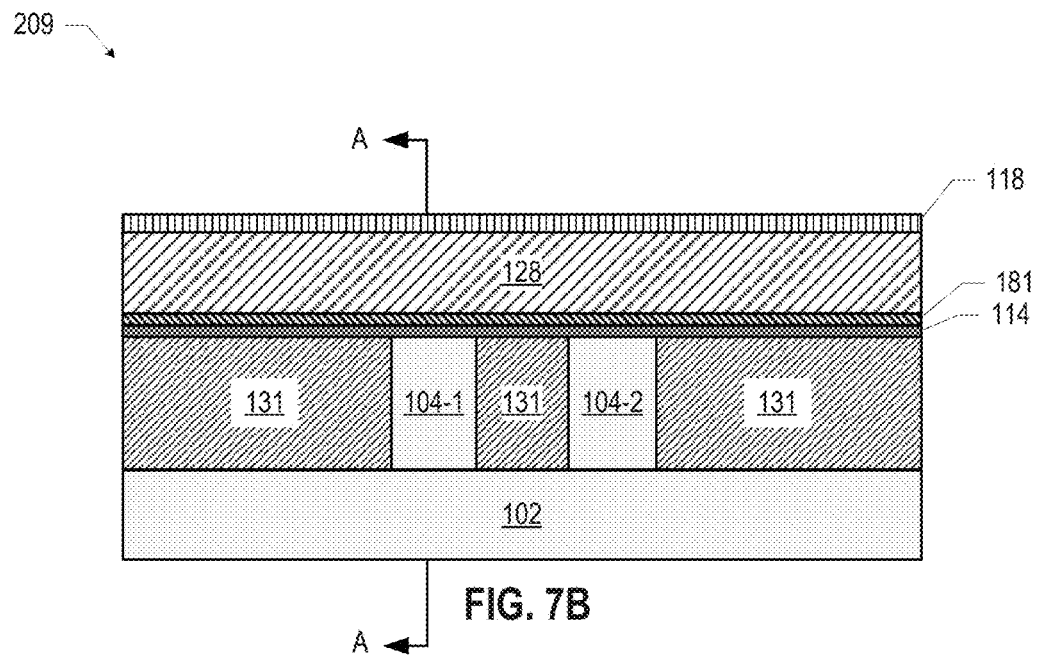

FIG. 7 illustrates an assembly 209 subsequent to depositing a layer of gate dielectric 114, a layer of etch stop material 181, a layer of insulating material 128, and a layer of hardmask 118 on the assembly 208 (FIG. 6). These materials may take any of the forms disclosed herein, and may deposited using any suitable technique. As noted above, in some embodiments, the hardmask 118 and/or the etch stop material 181 may be omitted.

Figure 8A:
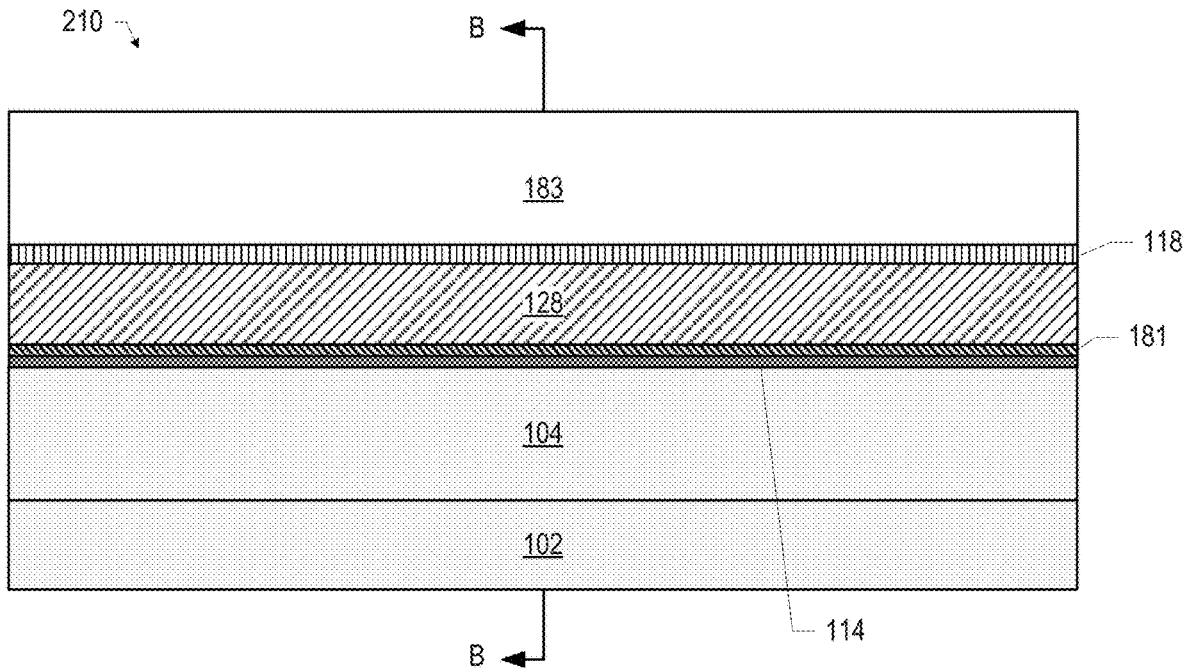
Figure 8B:
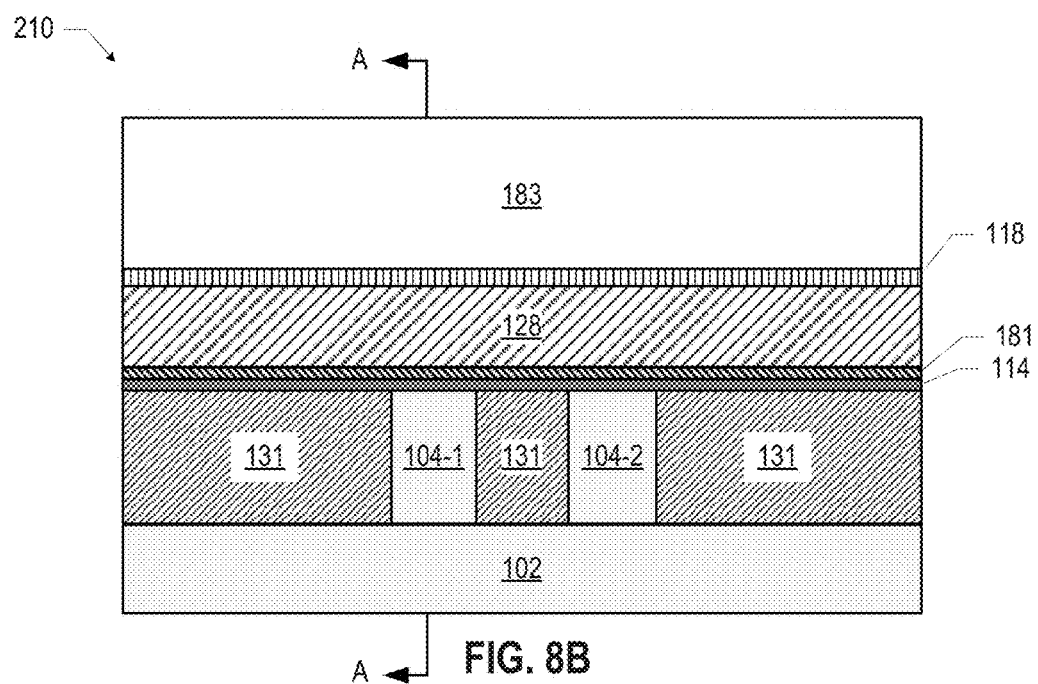

FIG. 8 illustrates an assembly 210 subsequent to depositing a layer of resist material 183 on the assembly 209 (FIG. 7). The resist material 183 may be any suitable material, such as a photoresist.

Figure 9A:
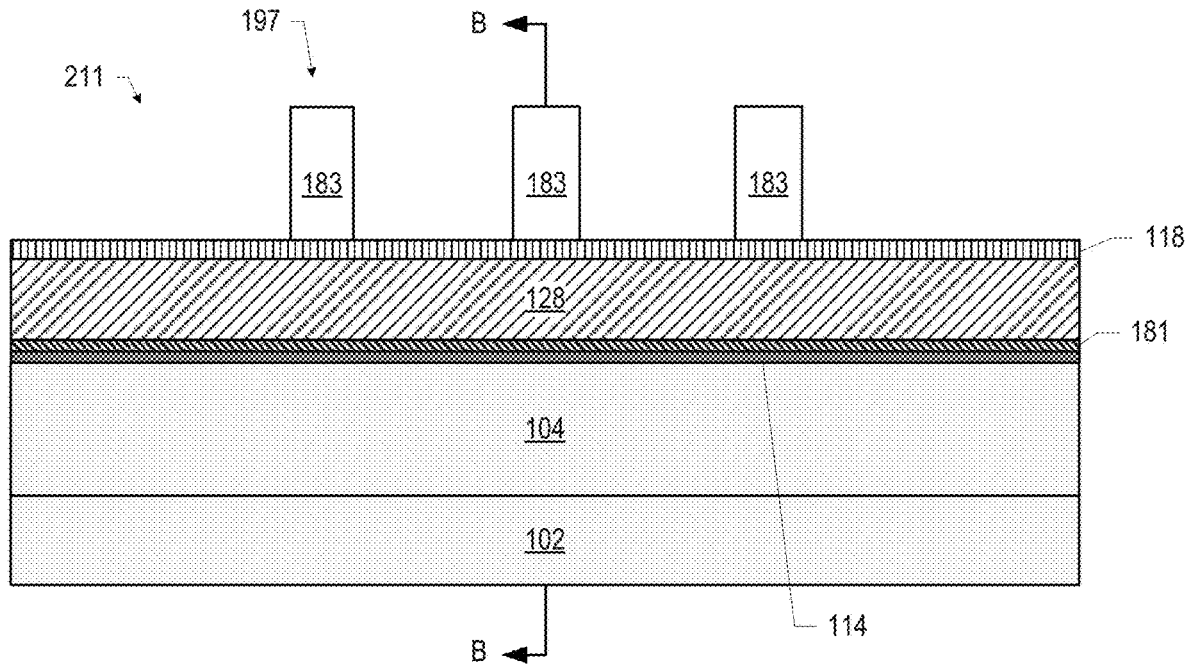
Figure 9B:
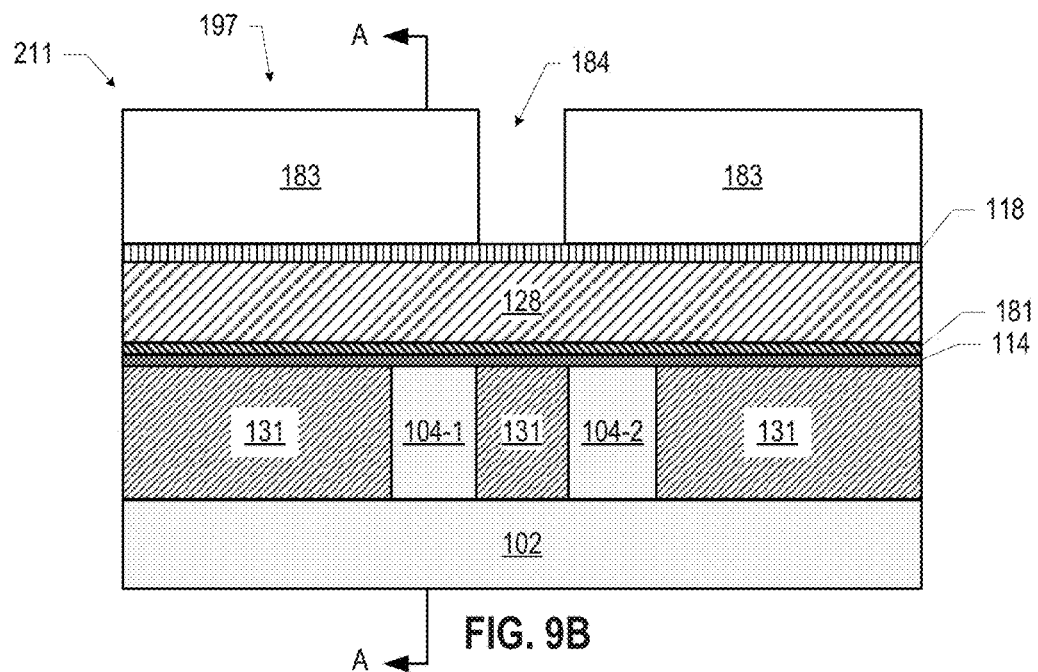

FIG. 9 illustrates an assembly 211 subsequent to patterning the resist material 183 of the assembly 210 (FIG. 8) into segments 197. The segments 197 will correspond to the locations of the gates 106 (as discussed further below), and segments 197 disposed above different fins are spaced apart by a gap 184. Any suitable technique may be used to pattern the resist material 183, such as a photolithographic technique.

Figure 10A:
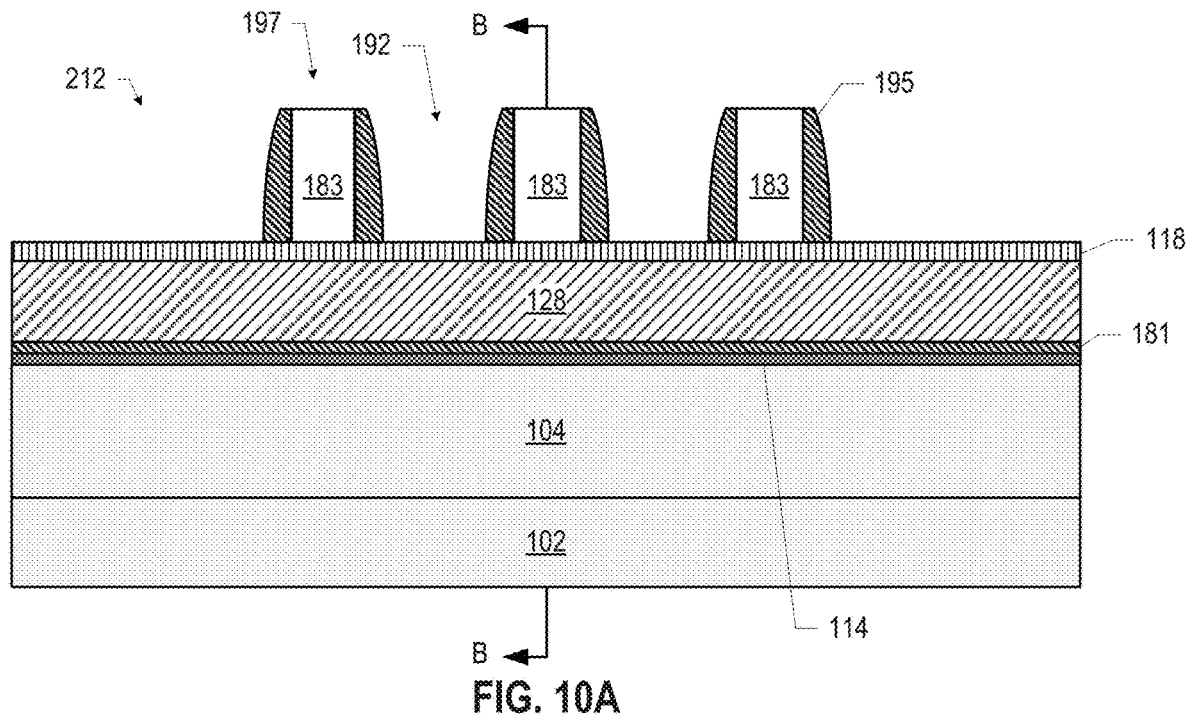
Figure 10B:
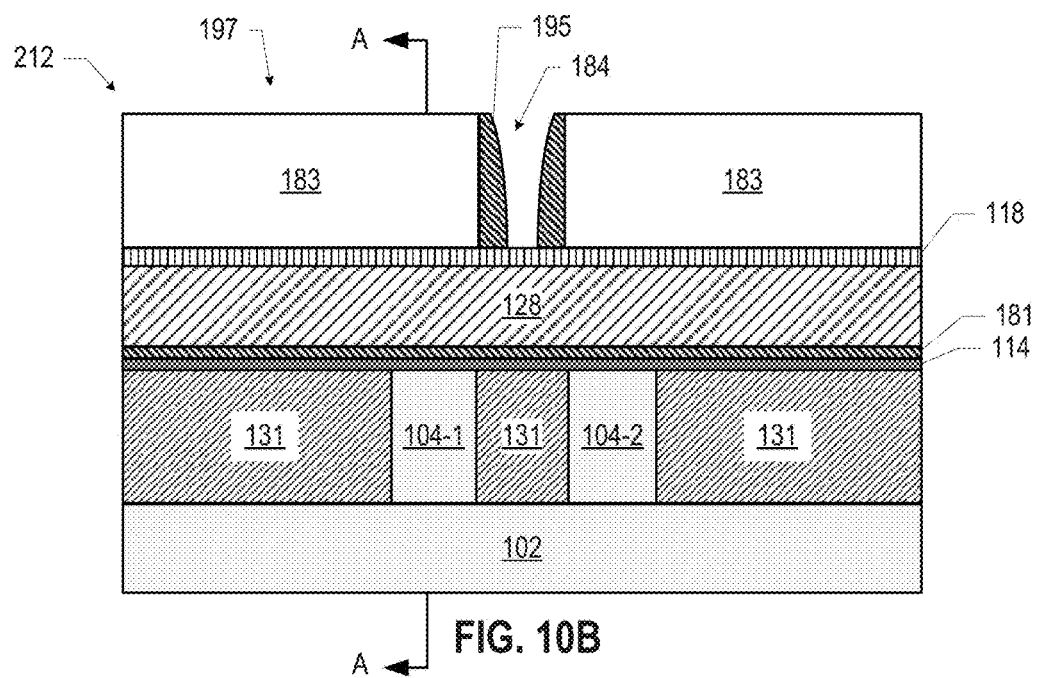

FIG. 10 illustrates an assembly 212 subsequent to forming spacers 195 on side faces of the segments 197 of the assembly 211 (FIG. 9). The spacers 195 may include any suitable material (e.g., carbon-doped oxide, silicon nitride, silicon oxide, silicon carbide, silicon nitride doped with carbon, silicon oxynitride, or other carbides or nitrides), and may be formed by conformally depositing the material of the spacers 195 over the assembly 211 (e.g., using a highly conformal deposition technique, such as ALD), then performing an anisotropic etch that etches the spacer material "downwards," removing the spacer material from the top face of the segments 197 and hardmask 118 while leaving the spacers 195 on the side faces of the segments 197. In some embodiments, the anisotropic etch may be a dry etch. The gap 192 between the segments 197 and their adjacent spacers 195 will correspond to the locations of the gates 108, as discussed further below. Using a resist material 183 as the "backbone" for forming the spacers 195 is only one embodiment, and other approaches may be used. For example, a different sacrificial backbone material, such as amorphous silicon, may be used.

Figure 11A:
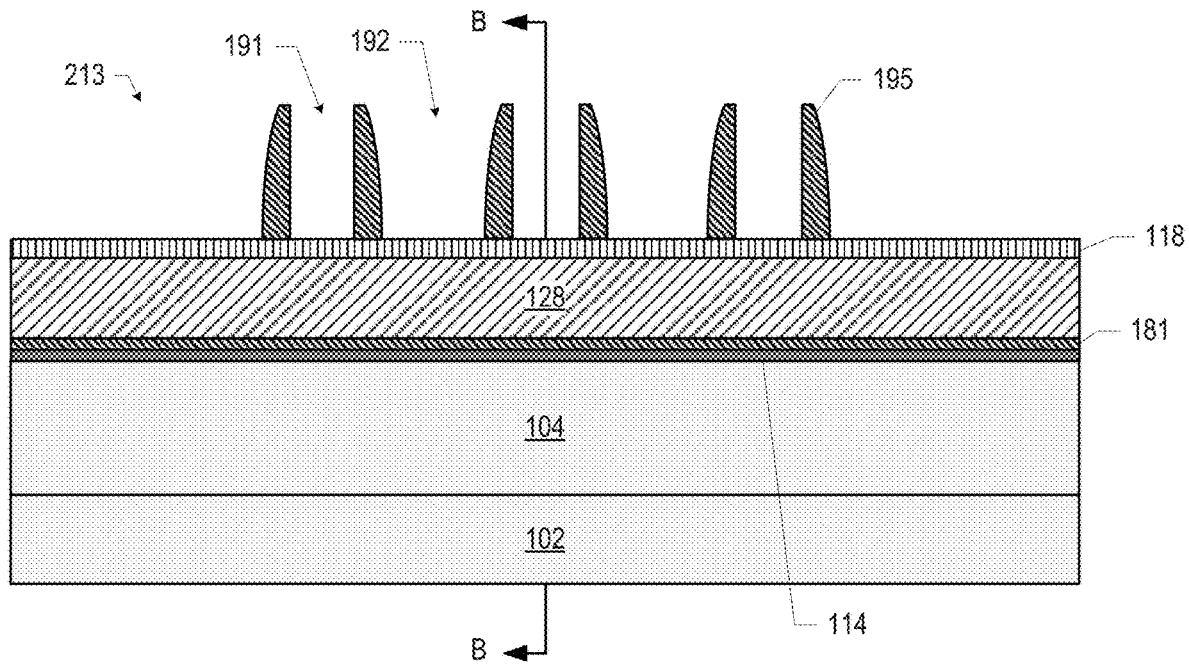
Figure 11B:
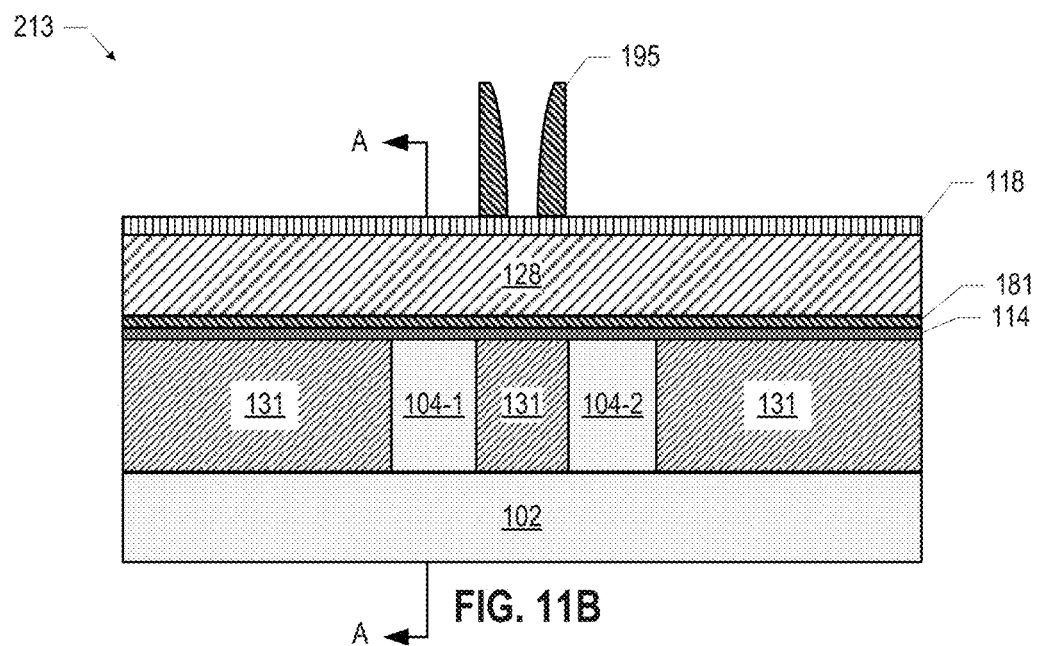

FIG. 11 illustrates an assembly 213 subsequent to removing the segments 197 from the assembly 212 (FIG. 10). Any suitable selective etch may be used to remove the resist material 183 of the segments 197, leaving the spacers 195 on the hardmask 118. Removal of the segments 197 may result in gaps 191 between adjacent spacers 195, as shown; the gaps 191 correspond to the segments 197, and thus also correspond to the locations of the gates 106, as discussed further below.

Figure 12A:
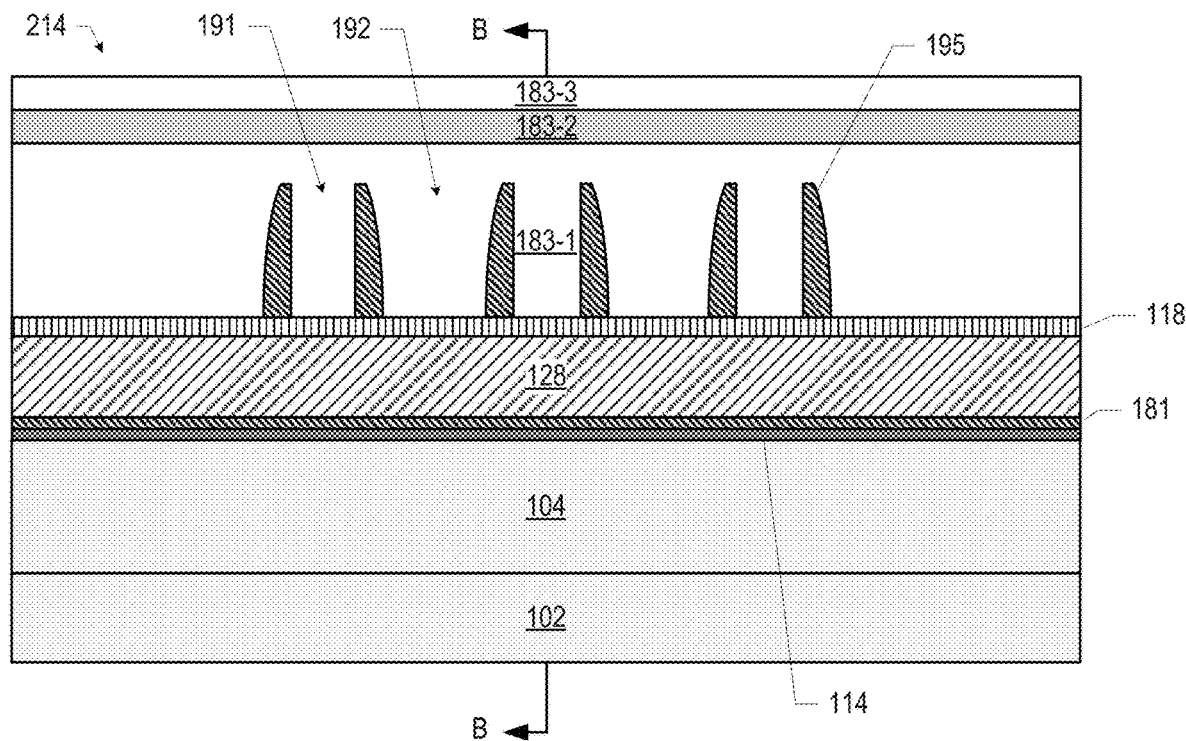
Figure 12B:
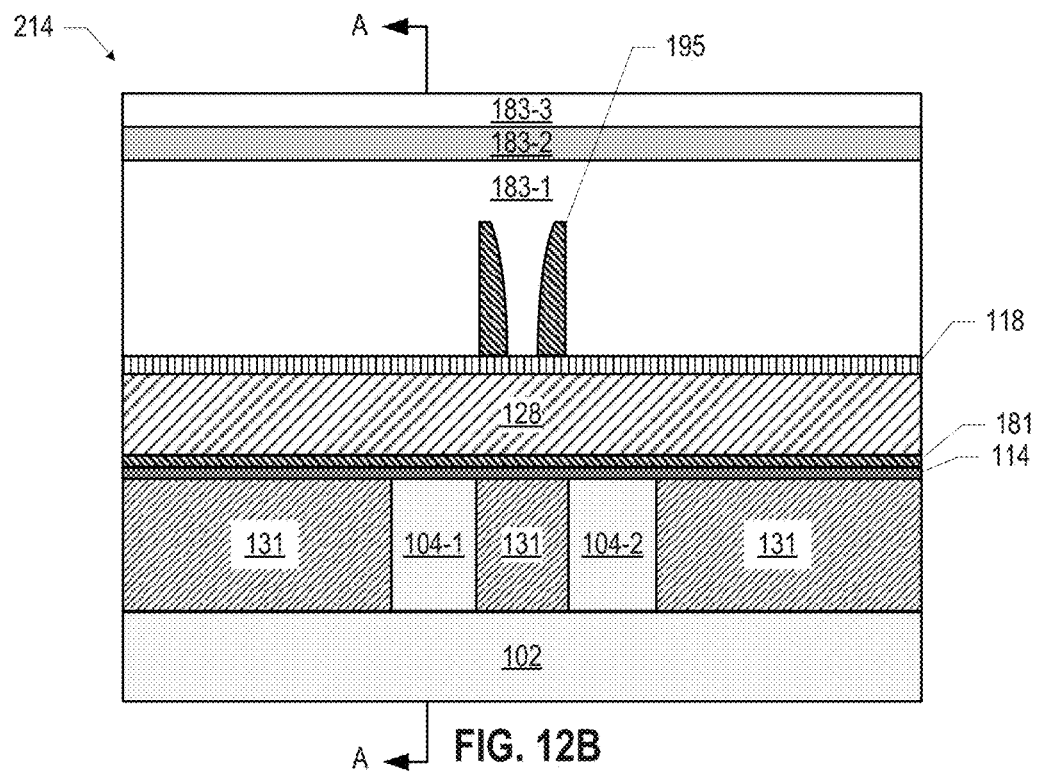

FIG. 12 illustrates an assembly 214 subsequent to depositing a layer of first resist material 183-1, a layer of second resist material 183-2, and a layer of third resist material 183-3 on the assembly 213 (FIG. 11). The first resist material 183-1 in the assembly 214 may be deposited to enough depth to cover the spacers 195, as shown. The first resist material 183-1, the second resist material 183-2, and the third resist material 183-3 may be a lithographic tri-layer, as known in the art, and may be deposited using any suitable technique.

Figure 13A:
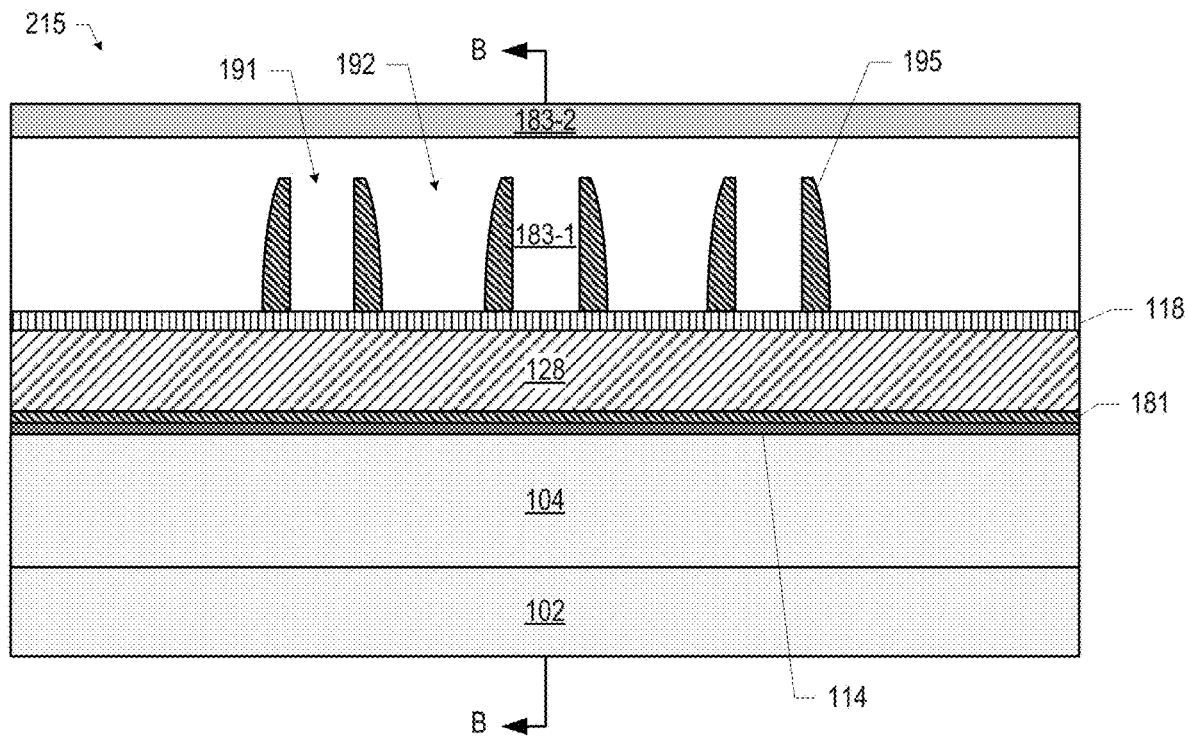
Figure 13B:
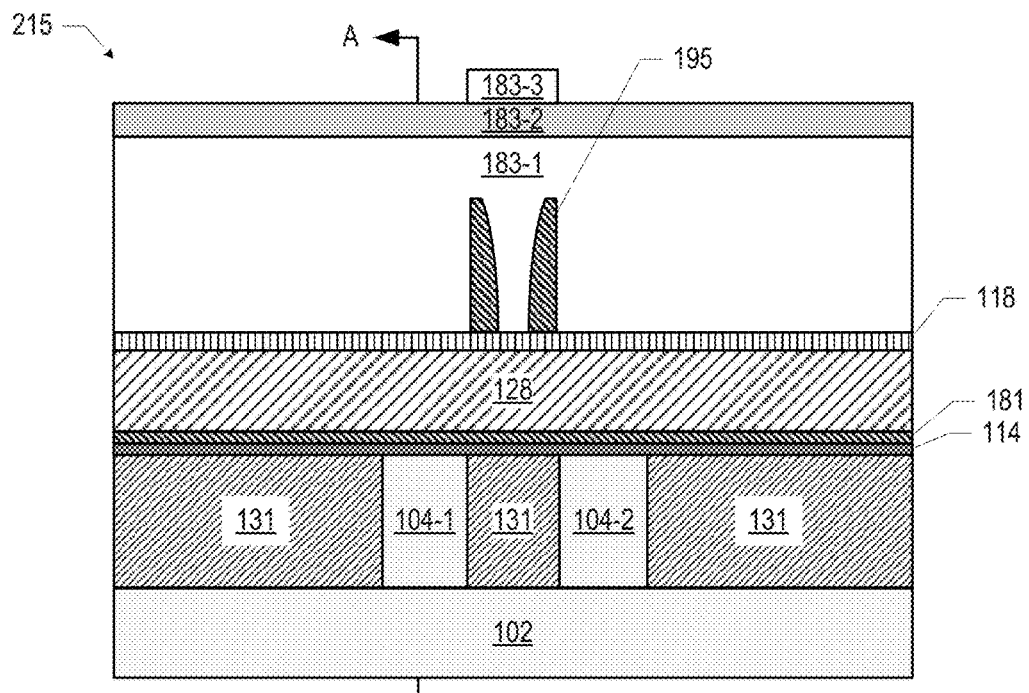

FIG. 13 illustrates an assembly 215 subsequent to patterning the third resist material 183-3 of the assembly 214 (FIG. 12) so as to leave the third resist material 183-3 only above the area that will be between the trench regions 107 in the quantum dot device 100. In particular, the third resist material 183-3 remains over the spacers 195 in the area that will be between the trench regions 107, as shown.

Figure 14A:
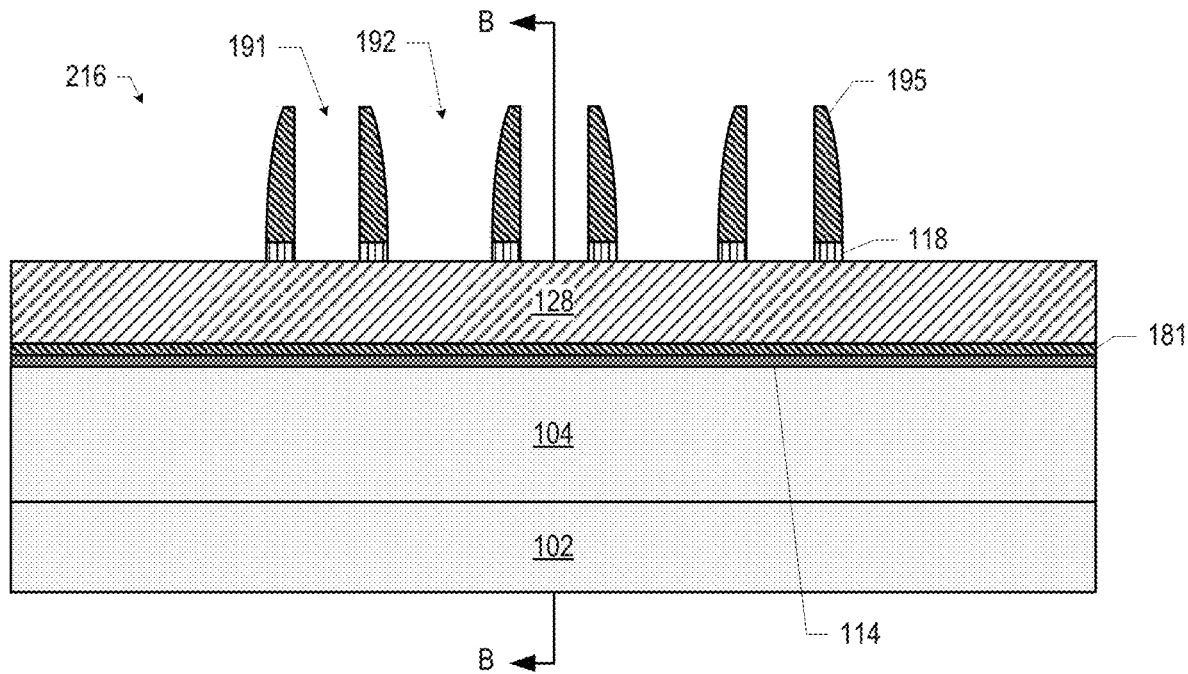
Figure 14B:
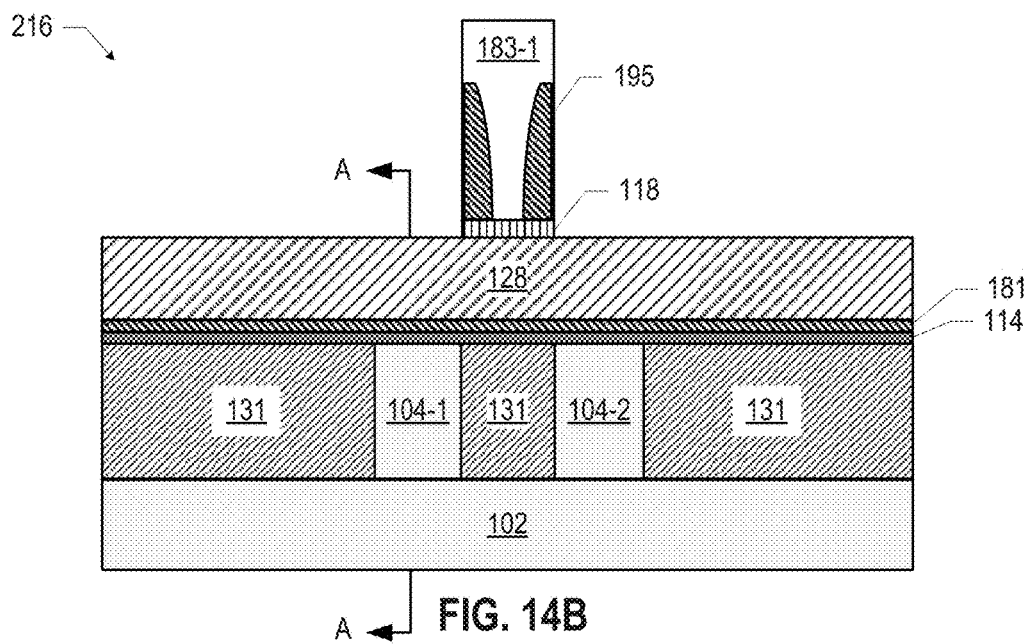

FIG. 14 illustrates an assembly 216 subsequent to patterning the second resist material 183-2 and the first resist material 183-1 in accordance with the pattern of the third resist material 183-3 in the assembly 215 (FIG. 13), patterning the hardmask 118 accordingly, then removing the remaining second resist material 183-2 and third resist material 183-3. Portions of hardmask 118 remain under the spacers 195 and under the first resist material 183-1, as shown.

Figure 15A:
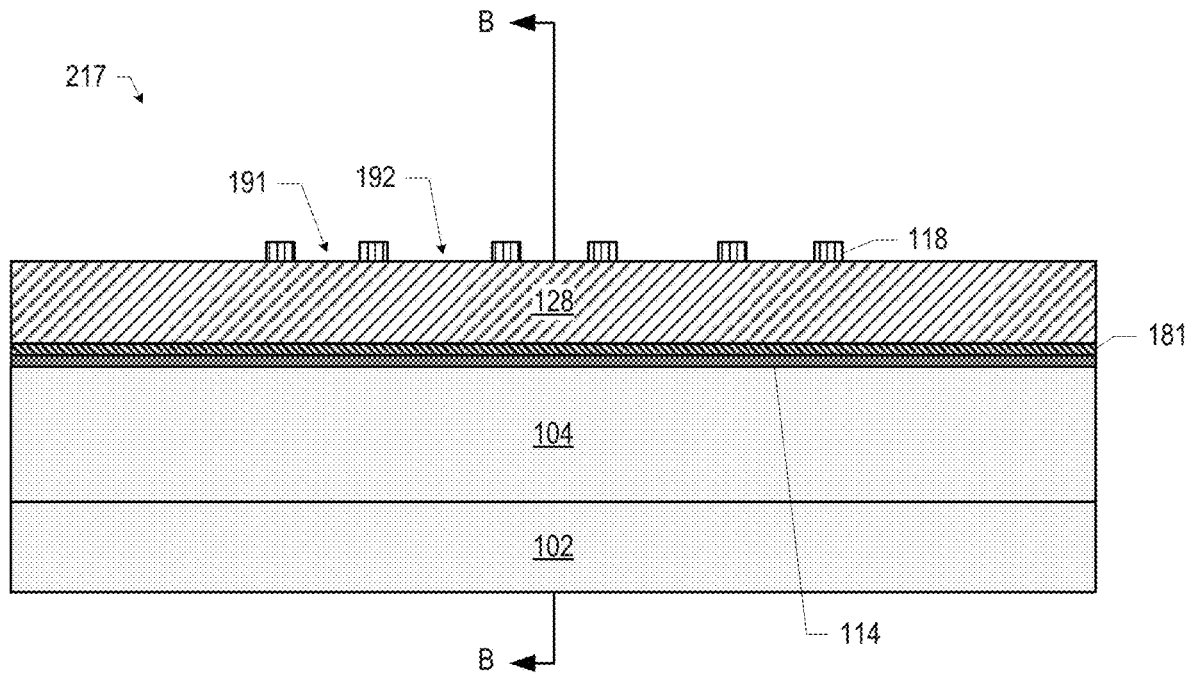
Figure 15B:
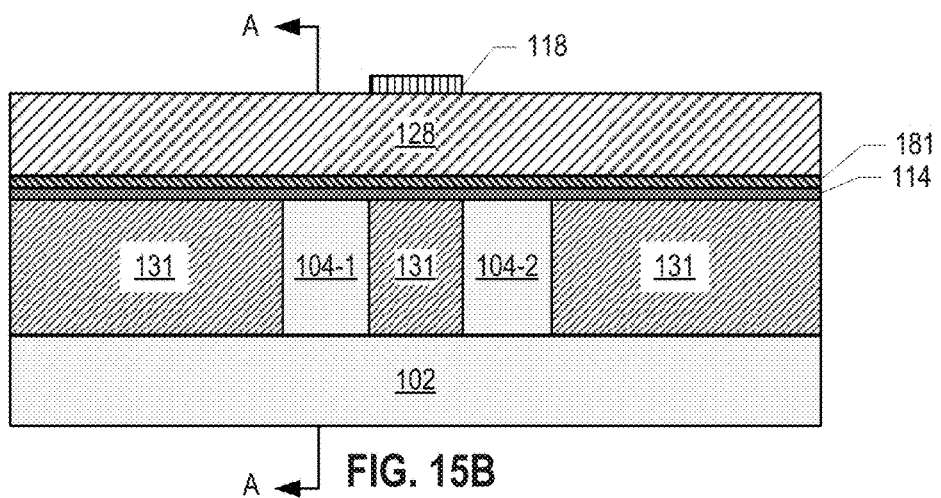

FIG. 15 illustrates an assembly 217 subsequent to removing the first resist material 183-1 and the spacers 195 from the assembly 216 (FIG. 14). In some embodiments, an ashing procedure may be used to remove the first resist material 183-1 and the spacers 195. The patterned hardmask 118 may remain in the assembly 217.

Figure 16A:
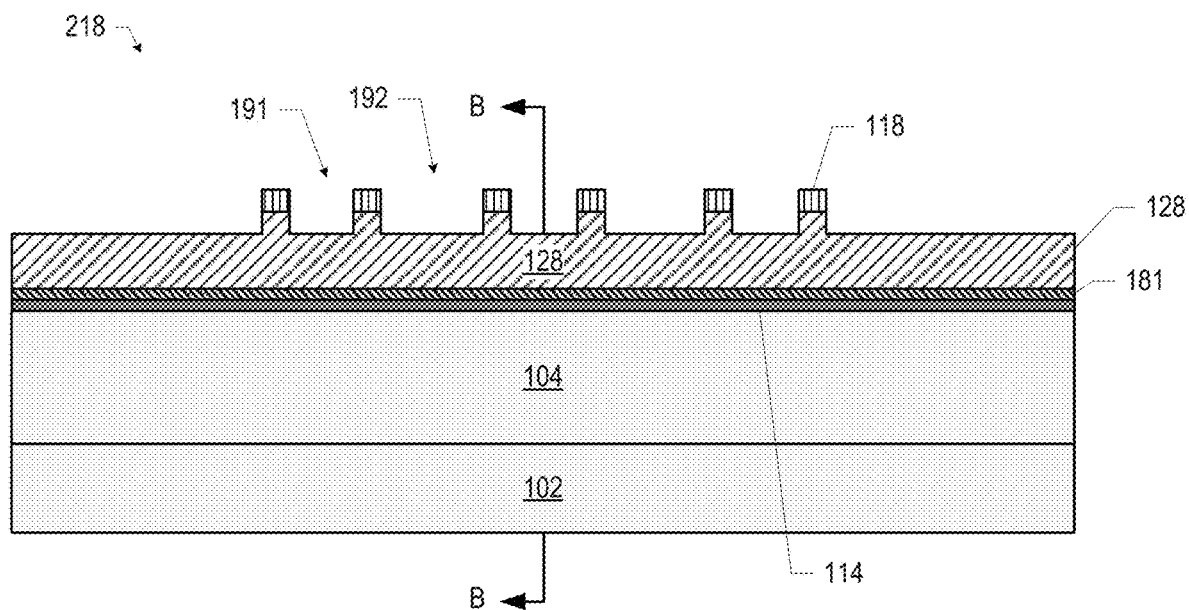
Figure 16B:
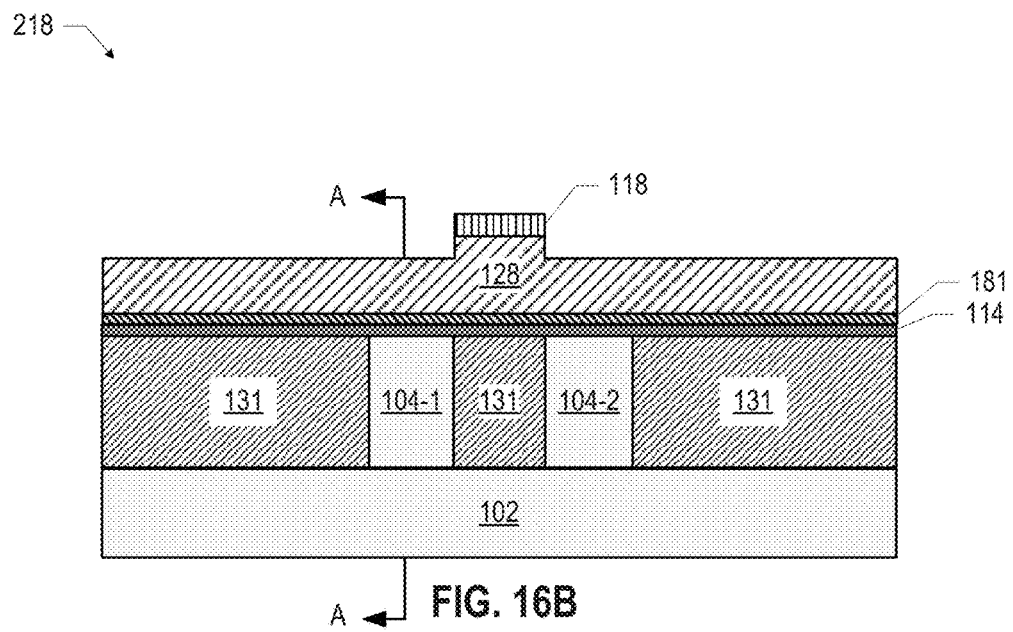

FIG. 16 illustrates an assembly 218 subsequent recessing the exposed surface (i.e., the portions of the surface not covered by the patterned hardmask 118) of the insulating material 128 of the assembly 217 (FIG. 15). In some embodiments, a timed etch may be used to recess the insulating material 128 to a desired depth.

Figure 17A:
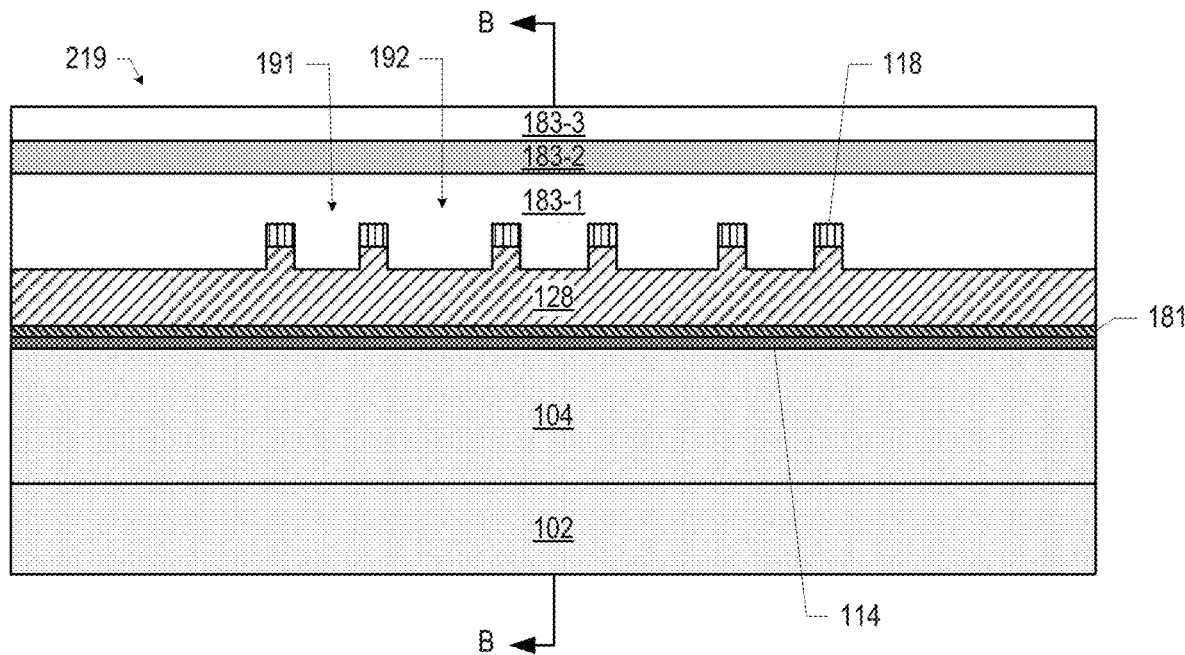
Figure 17B:
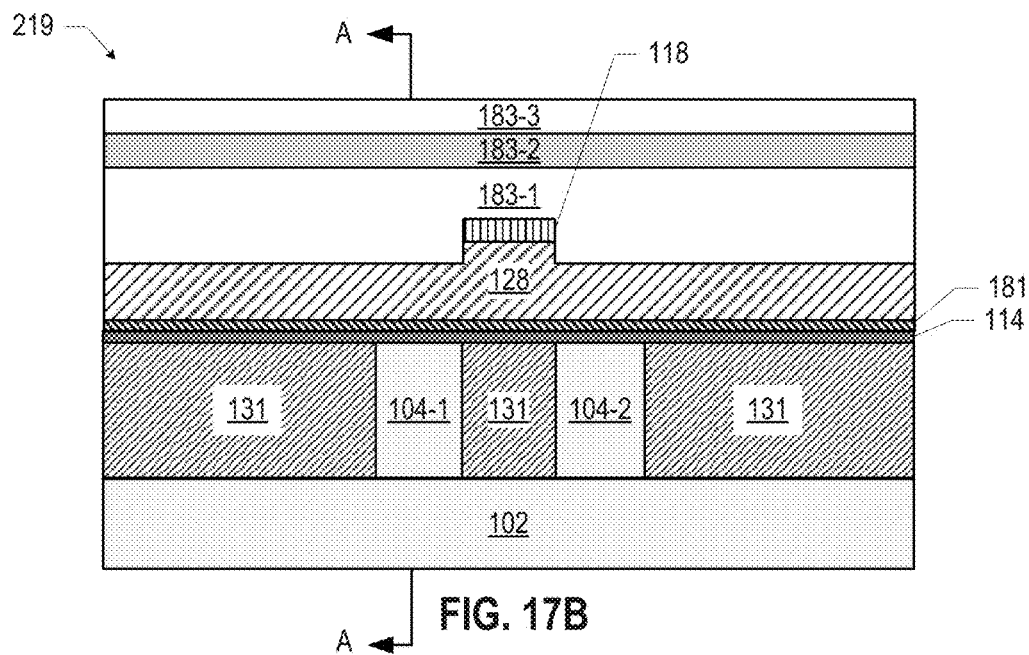

FIG. 17 illustrates an assembly 219 subsequent to depositing a layer of first resist material 183-1, a layer of second resist material 183-2, and a layer of third resist material 183-3 on the assembly 218 (FIG. 16). The first resist material 183-1 in the assembly 219 may be deposited to enough depth to cover the hardmask 118, as shown. The resist materials 183 of the assembly 219 may be the same or different from the resist materials 183 used in others of the assemblies disclosed herein. The first resist material 183-1, the second resist material 183-2, and the third resist material 183-3 may be a lithographic tri-layer, as known in the art, and may be deposited using any suitable technique.

Figure 18A:
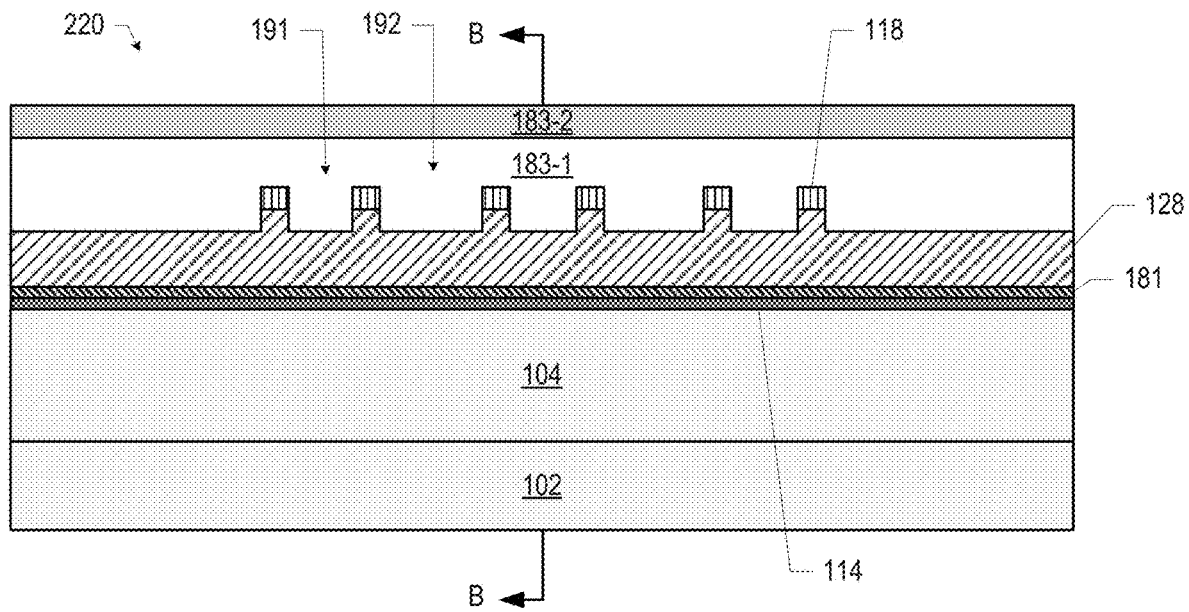
Figure 18B:
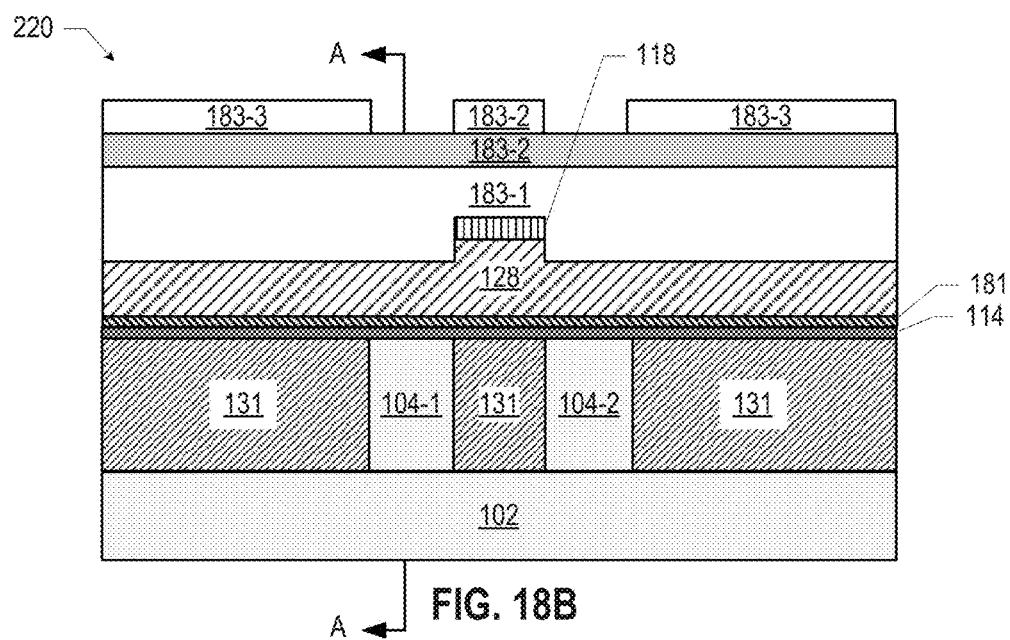

FIG. 18 illustrates an assembly 220 subsequent to patterning the third resist material 183-3 of the assembly 219 (FIG. 17) so as to remove the third resist material 183-1 above areas corresponding to the trench regions 107.

Figure 19A:
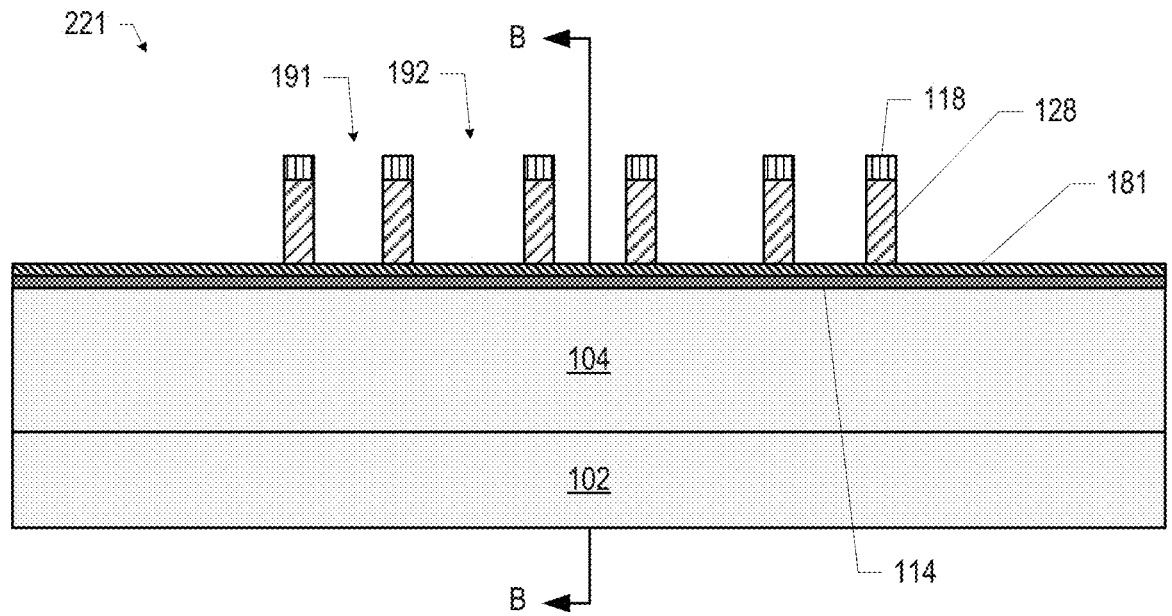
Figure 19B:
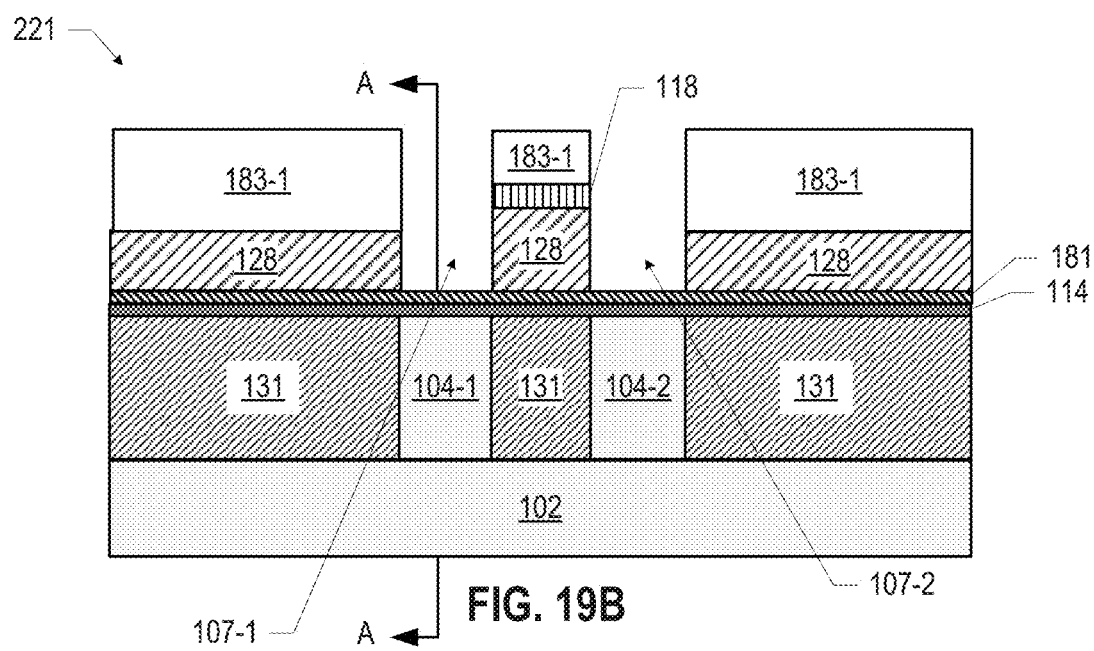

FIG. 19 illustrates an assembly 221 subsequent to patterning the second resist material 183-2 and the first resist material 183-1 in accordance with the pattern of the third resist material 183-3 in the assembly 220 (FIG. 18), patterning the insulating material 128 accordingly to form the trench regions 107, then removing the remaining second resist material 183-2 and third resist material 183-3. The patterning of the insulating material 128 may stop at the etch stop material 181 (when such material is used). The gaps 191 and 192 may thus take the form of vias through the insulating material 128, extending towards the quantum well stack 146 (e.g., in the fins 104).

Figure 20A:
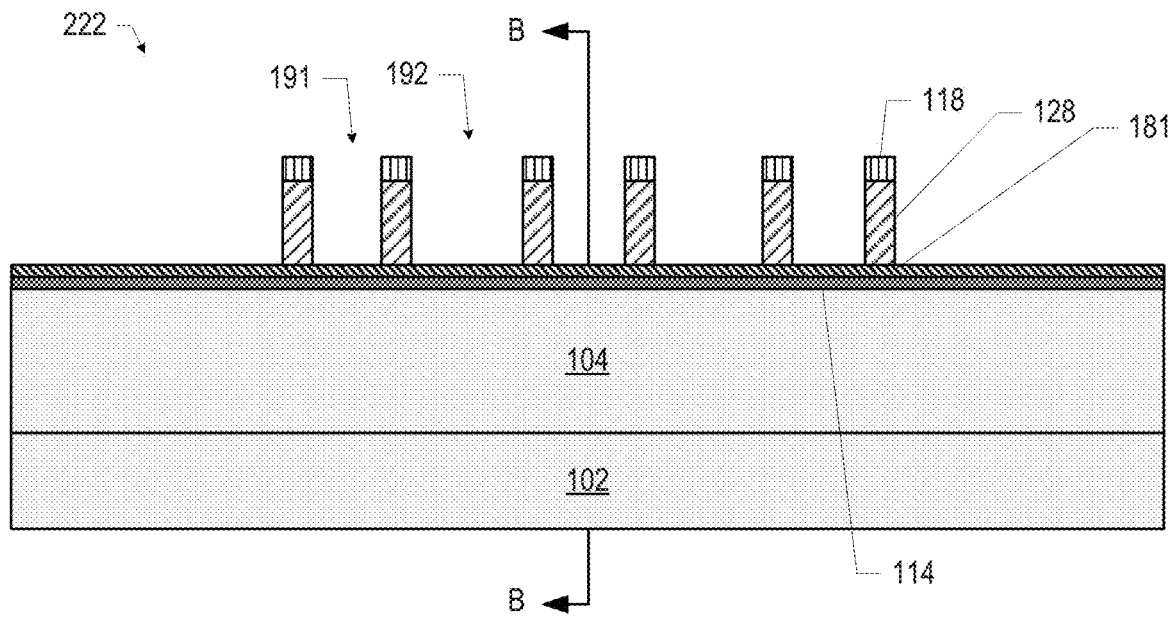
Figure 20B:
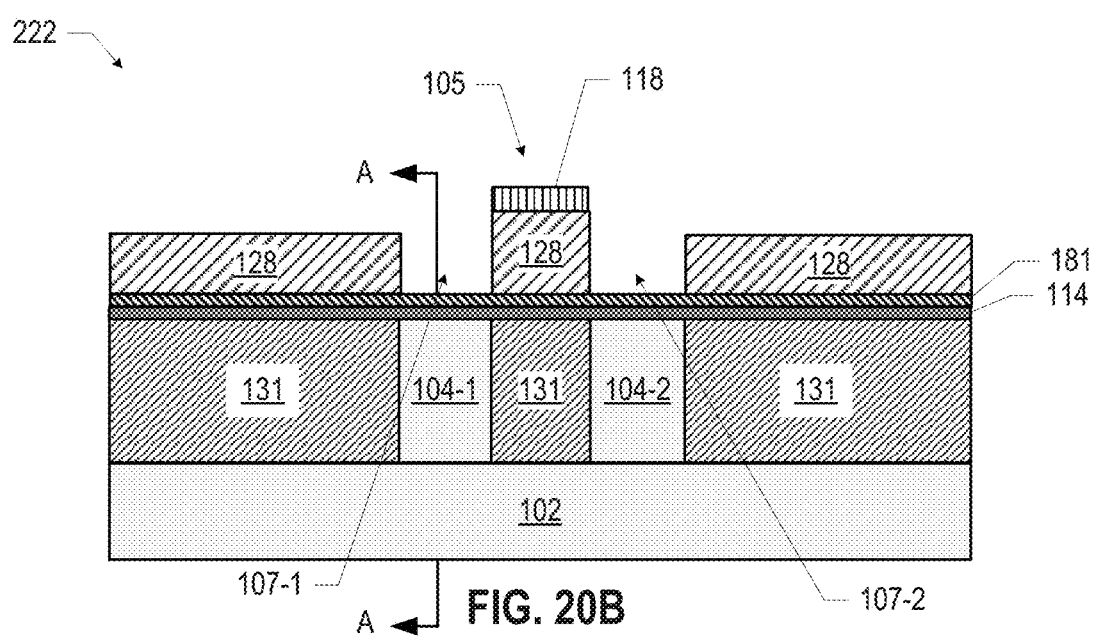

FIG. 20 illustrates an assembly 222 subsequent to removing the first resist material 183-1 from the assembly 221 (FIG. 19). In some embodiments, an ashing procedure may be used to remove the first resist material 183-1.

Figure 21A:
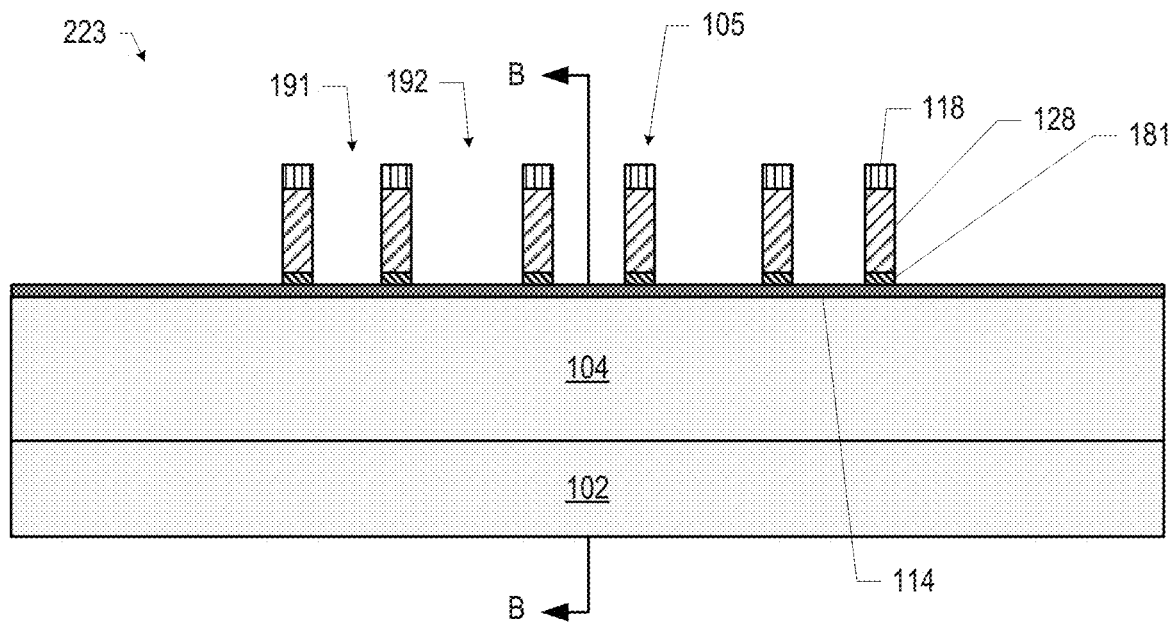
Figure 21B:
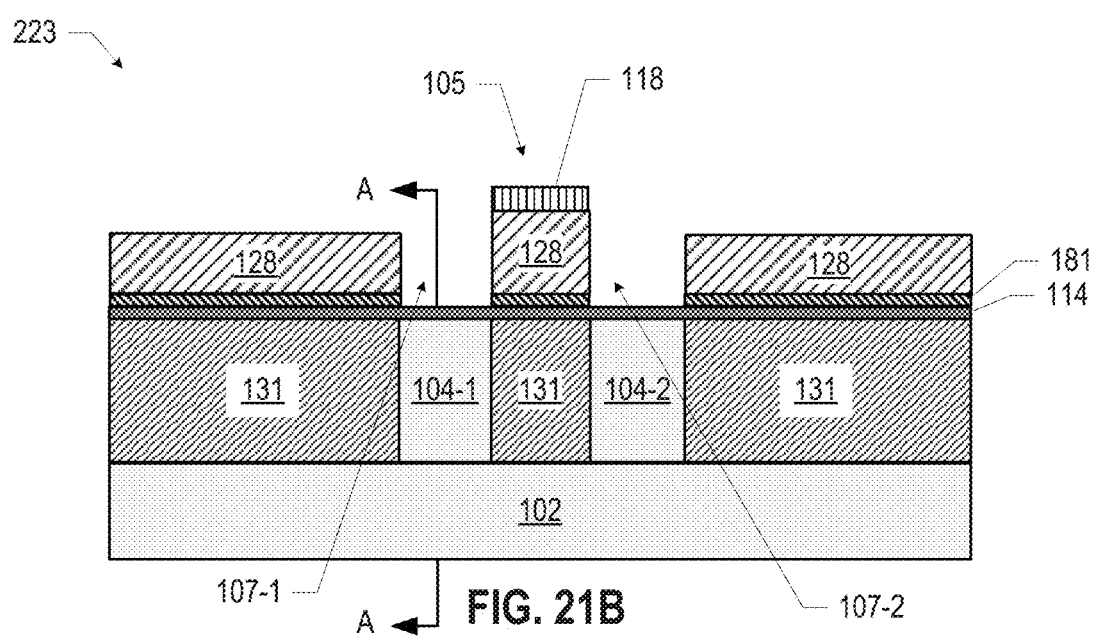
Figure 22A:
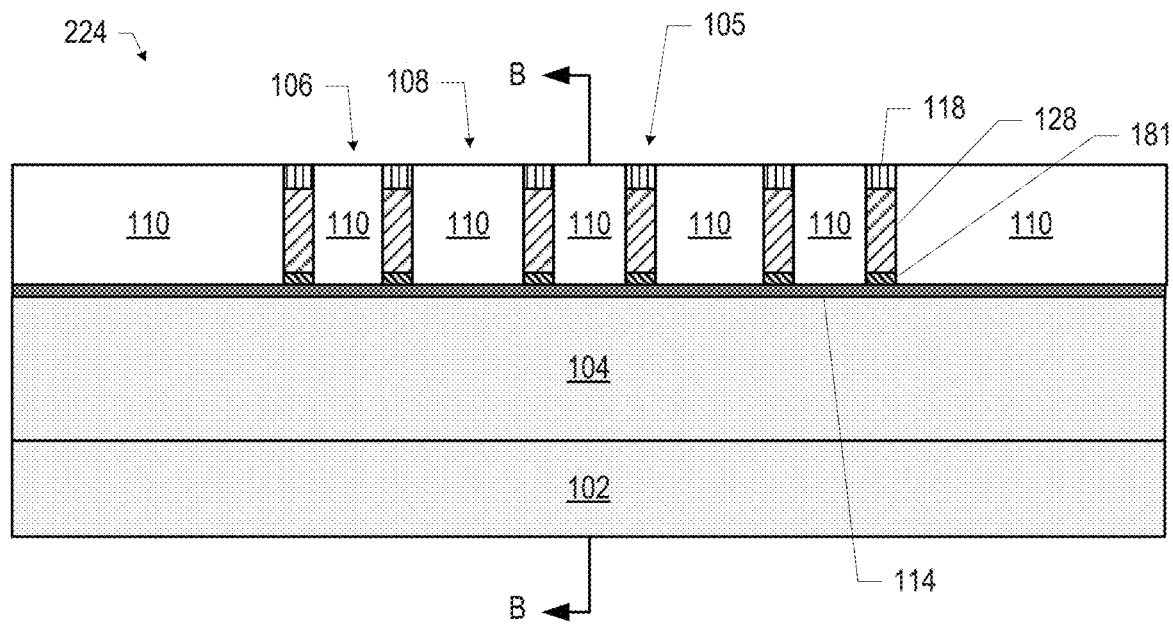
Figure 22B:
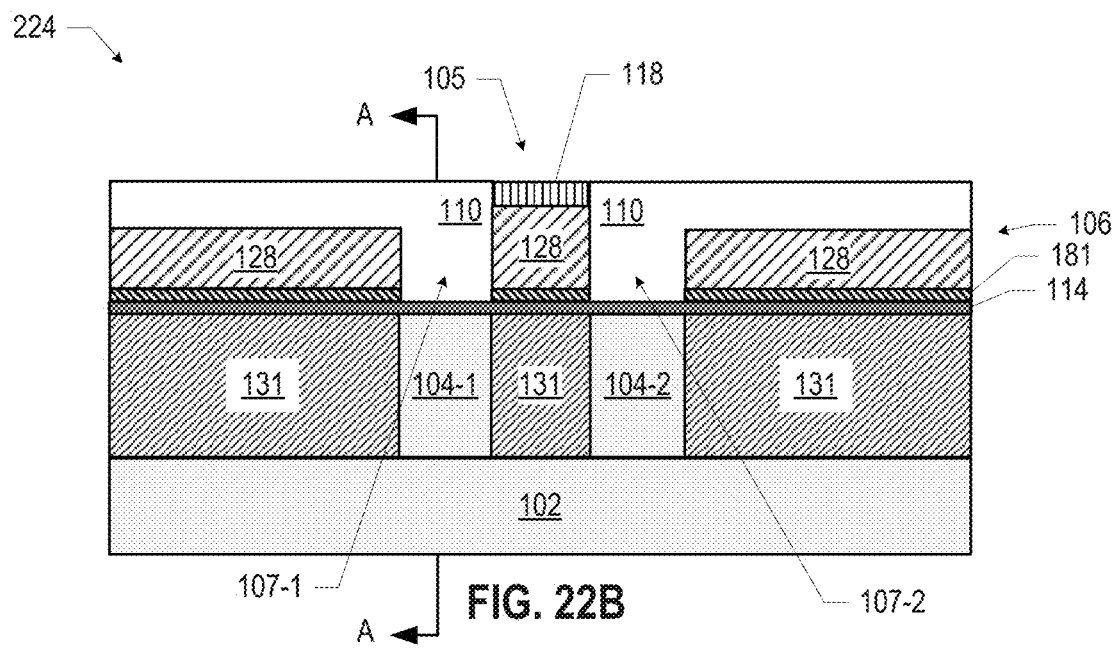

FIG. 21 illustrates an assembly 223 subsequent to patterning the etch stop material 181 of the assembly 222 (FIG. 20) in accordance with the pattern of the hardmask 118 and the insulating material 128, forming the gate walls 105. Any suitable removal technique may be used to pattern the etch stop material 181. As noted above, in some embodiments, the etch stop material 181 may not be used. FIG. 22 illustrates an assembly 224 subsequent to depositing the gate metal 110 on the assembly 223 (FIG. 21), filling the areas between the gate walls 105 in the trench regions 107. Any suitable metal fill technique may be used to deposit the gate metal 110 (e.g., a damascene technique). Forming the gate metal 110 after the formation of the gate walls 105 and trench regions 107 may result in the gate metal 110 having a damascene fill grain structure, as discussed above. In some embodiments, the top surface of the gate metal 110 may be planarized after deposition (e.g., using a CMP technique). In some embodiments in which the hardmask 118 is not present in the quantum dot device 100, the hardmask 118 may be removed during this planarization. As noted above, in some embodiments, deposition of the gate metal 110 may be preceded by deposition of a conformal liner material (not shown) to improve adhesion and/or reduce undesirable material diffusion. The gate metal 110 filling the gaps 191 may be the gate metal 110 of the gates 106, while the gate metal 110 filling the gaps 192 may be the gate metal 110 of the gates 108.

Figure 23:
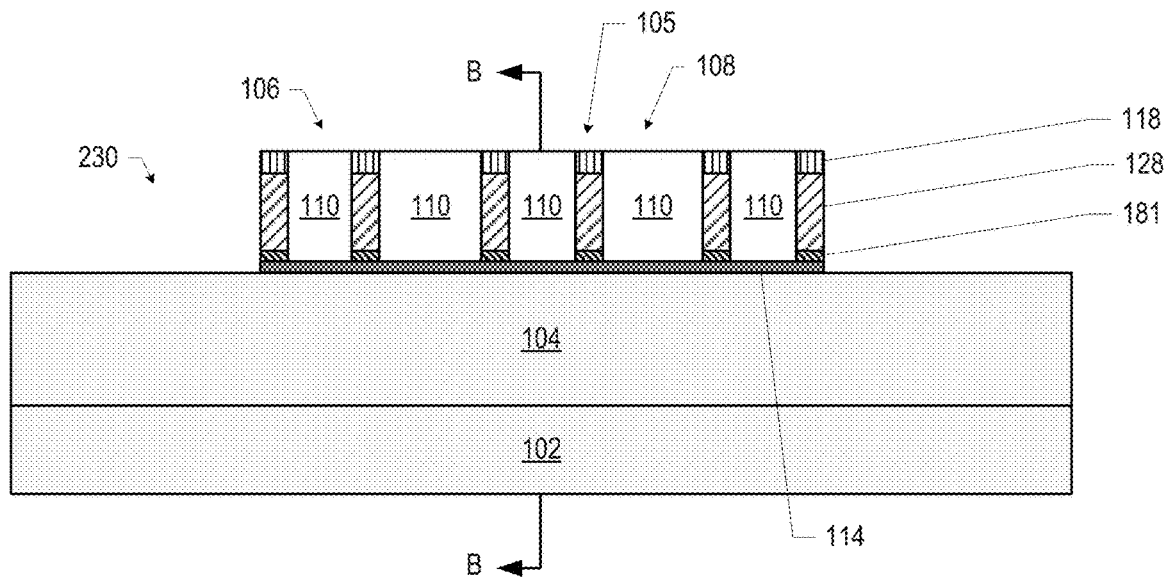

FIG. 23 is a cross-sectional view of an assembly 230 subsequent to etching the assembly 224 (FIG. 22) to remove the gate metal 110 and gate dielectric 114 "outside" the outermost gate wall 105. The excess gate dielectric 114 may be removed using any suitable technique, such as chemical etching or silicon bombardment.

Figure 24:
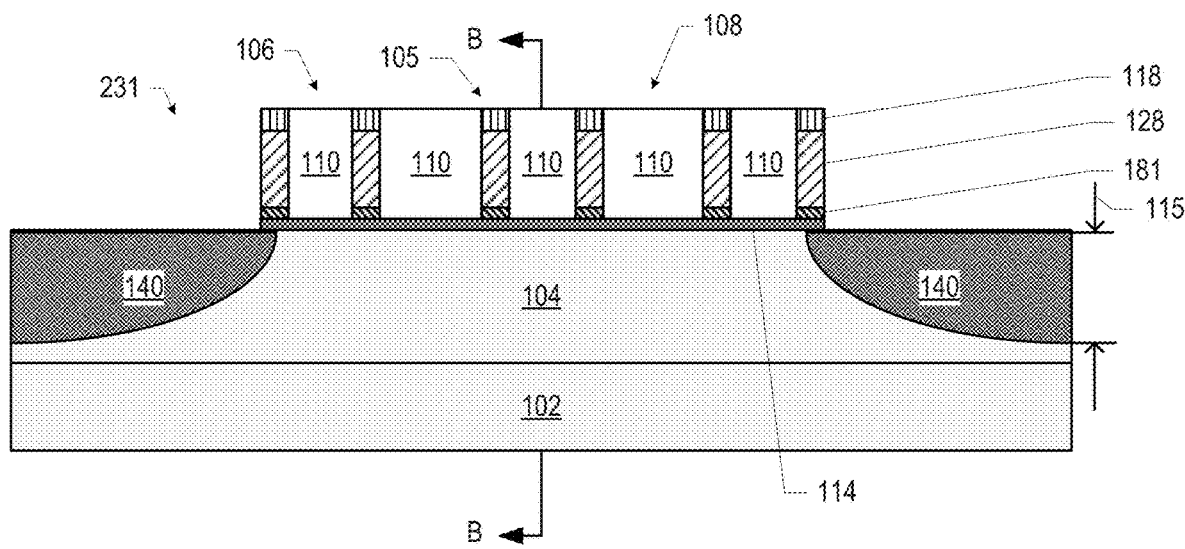

FIG. 24 is a cross-sectional view of an assembly 231 subsequent to doping the fins 104 of the assembly 230 (FIG. 23) to form doped regions 140 in the portions of the fins 104 "outside" of the gates 106/108. The type of dopant used to form the doped regions 140 may depend on the type of quantum dot desired, as discussed above. In some embodiments, the doping may be performed by ion implantation. For example, when the quantum dot 142 is to be an electron-type quantum dot 142, the doped regions 140 may be formed by ion implantation of phosphorous, arsenic, or another n-type material. When the quantum dot 142 is to be a hole-type quantum dot 142, the doped regions 140 may be formed by ion implantation of boron or another p-type material. An annealing process that activates the dopants and causes them to diffuse farther into the fins 104 may follow the ion implantation process. The depth of the doped regions 140 may take any suitable value; for example, in some embodiments, the doped regions 140 may extend into the fin 104 to a depth 115 between 100 Angstroms and 1000 Angstroms.

The "outermost" gate walls 105 may provide a doping boundary, limiting diffusion of the dopant from the doped regions 140 into the area under the gates 106/108. As shown, the doped regions 140 may extend under the adjacent outer gate walls 105. In some embodiments, the doped regions 140 may extend past the outer gate walls 105 and under the gate dielectric 114 of the outer gates 106, may extend only to the boundary between the outer gate walls 105 and the adjacent gate metal 110, or may terminate under the outer gate walls 105 and not reach the boundary between the outer gate walls 105 and the adjacent gate dielectric 114. The doping concentration of the doped regions 140 may, in some embodiments, be between $10^{17}/cm^3$ and $10^{20}/cm^3$.

Alternate techniques may be used to form the doped regions 140. For example, a patterned implant may be performed prior to deposition of the gate dielectric 114 (e.g., as discussed above with reference to FIG. 7).

Figure 25:
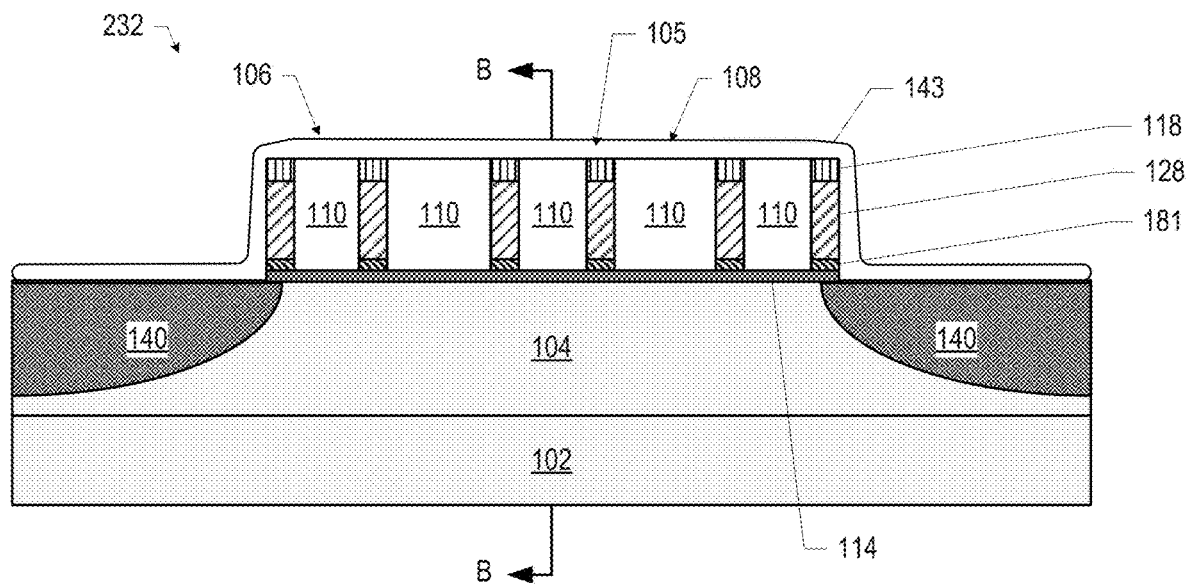

FIG. 25 is a cross-sectional side view of an assembly 232 subsequent to providing a layer of nickel or other material 143 over the assembly 231 (FIG. 24). The nickel or other material 143 may be deposited on the assembly 231 using any suitable technique (e.g., a plating technique, CVD, or ALD).

Figure 26:
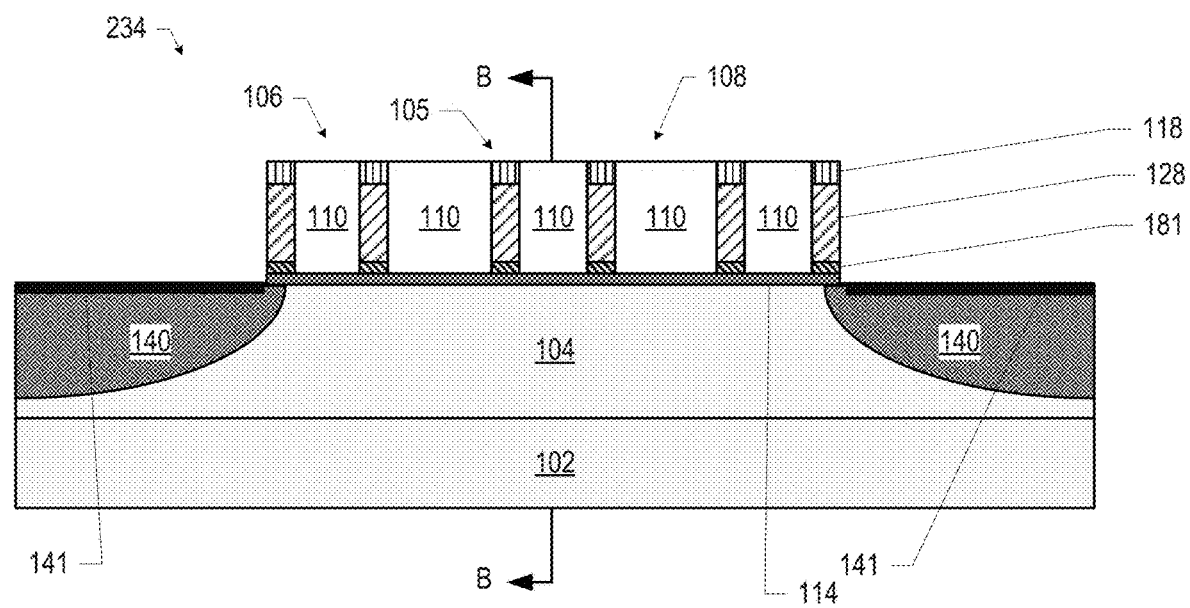

FIG. 26 is a cross-sectional side view of an assembly 234 subsequent to annealing the assembly 232 (FIG. 25) to cause the material 143 to interact with the doped regions 140 to form the interface material 141, then removing the unreacted material 143. When the doped regions 140 include silicon and the material 143 includes nickel, for example, the interface material 141 may be nickel silicide. Materials other than nickel may be deposited in the operations discussed above with reference to FIG. 25 in order to form other interface materials 141, including titanium, aluminum, molybdenum, cobalt, tungsten, or platinum, for example. More generally, the interface material 141 of the assembly 234 may include any of the materials discussed herein with reference to the interface material 141.

Figure 27A:
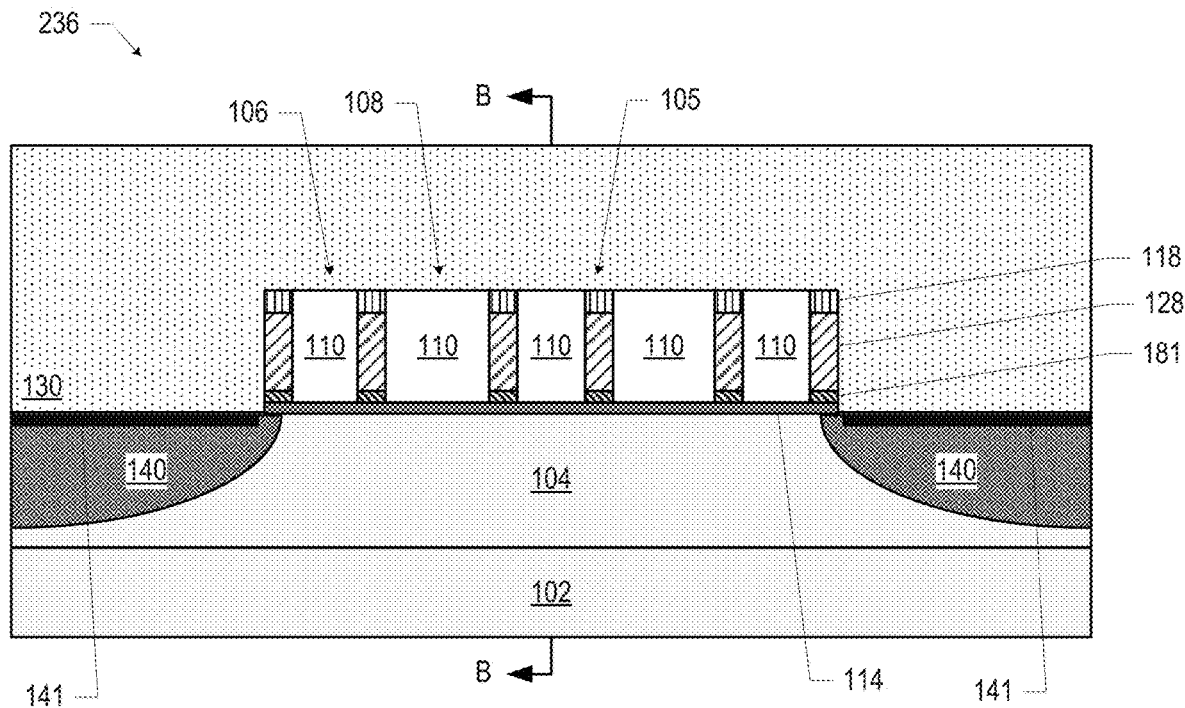
Figure 27B:
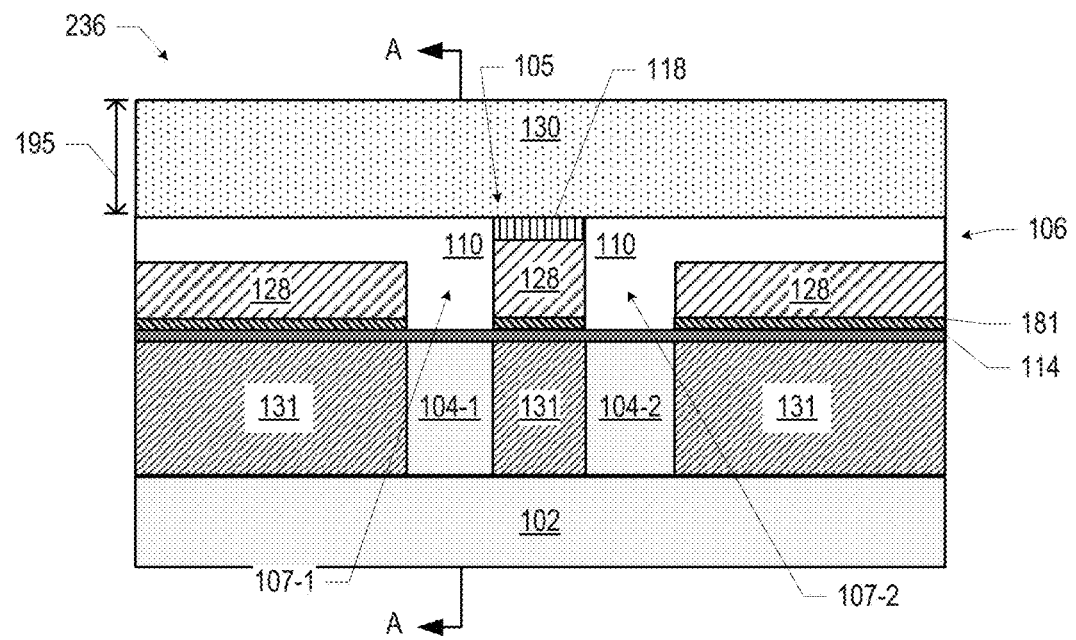

FIG. 27 illustrates an assembly 236 subsequent to providing an insulating material 130 on the assembly 234 (FIG. 26). The insulating material 130 may take any of the forms discussed above. For example, the insulating material 130 may be a dielectric material, such as silicon oxide. The insulating material 130 may have the same material composition as the insulating material 128. The insulating material 130 may be provided on the assembly 234 using any suitable technique, such as spin coating, CVD, or plasma-enhanced CVD (PECVD). In some embodiments, the insulating material 130 may be polished back after deposition, and before further processing. In some embodiments, the thickness 195 of the insulating material 130 provided on the assembly 236 (as measured from the top surface of the gate metal 110, as indicated in FIG. 27B) may be between 50 nanometers and 1.2 microns (e.g., between 50 nanometers and 300 nanometers).

Figure 28A:
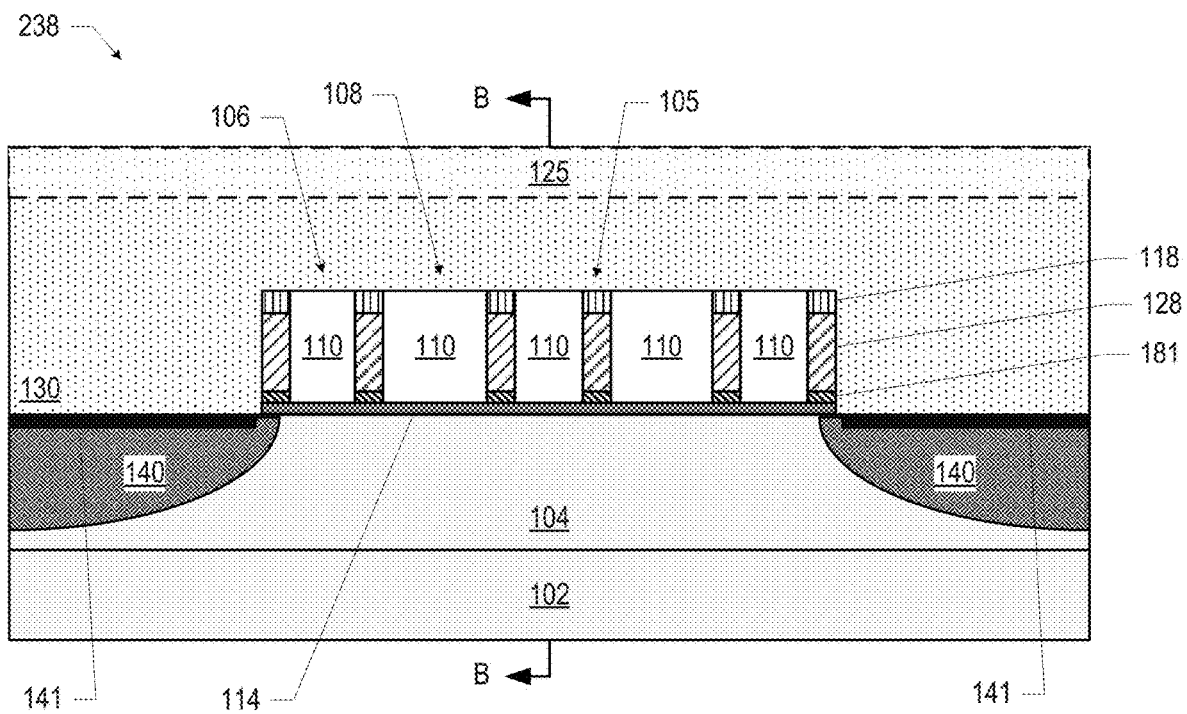
Figure 28B:
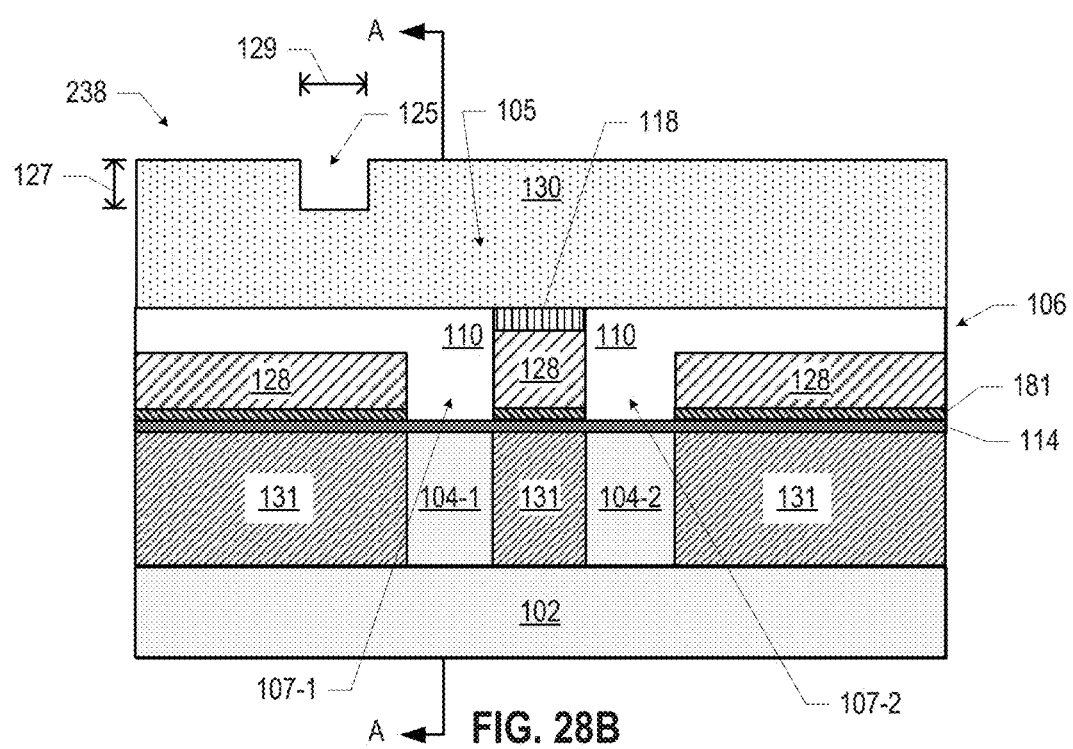

FIG. 28 illustrates an assembly 238 subsequent to forming a trench 125 in the insulating material 130 of the assembly 236 (FIG. 27). The trench 125 may be formed using any desired techniques (e.g., resist patterning followed by etching), and may have a depth 127 and a width 129 that may take the form of any of the embodiments of the thickness 169 and the width 171, respectively, discussed above with reference to the magnet line 121.

Figure 29A:
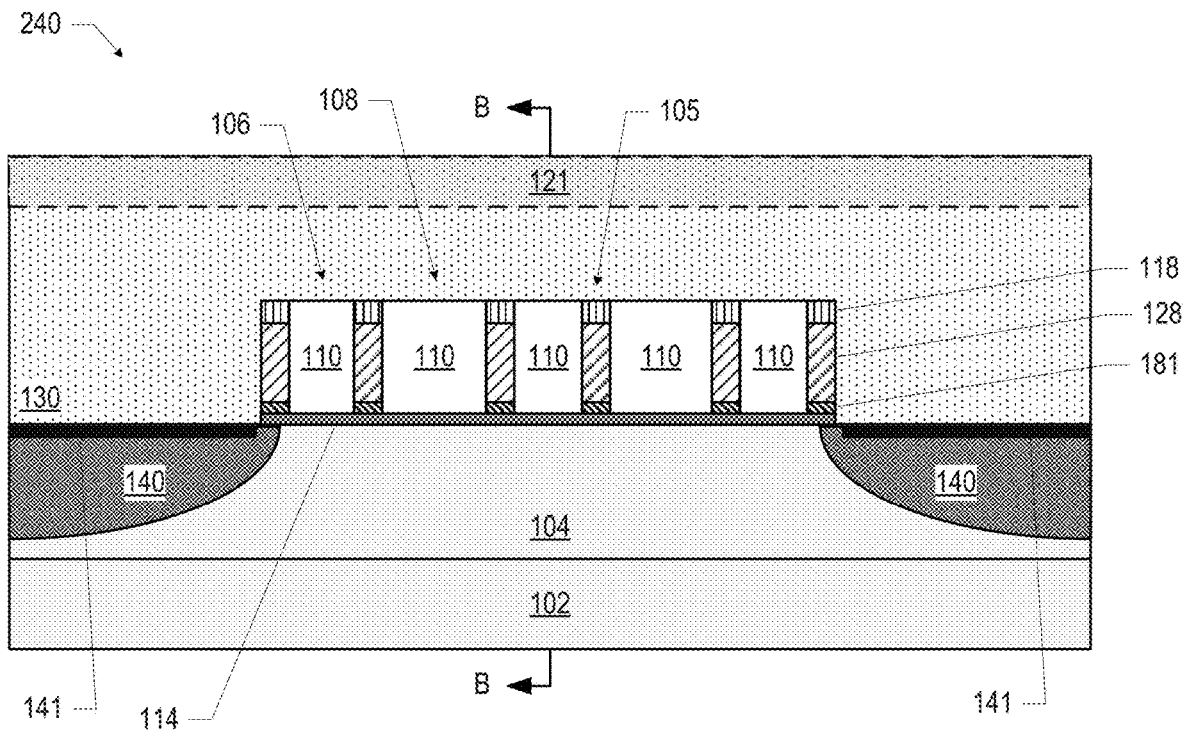
Figure 29B:
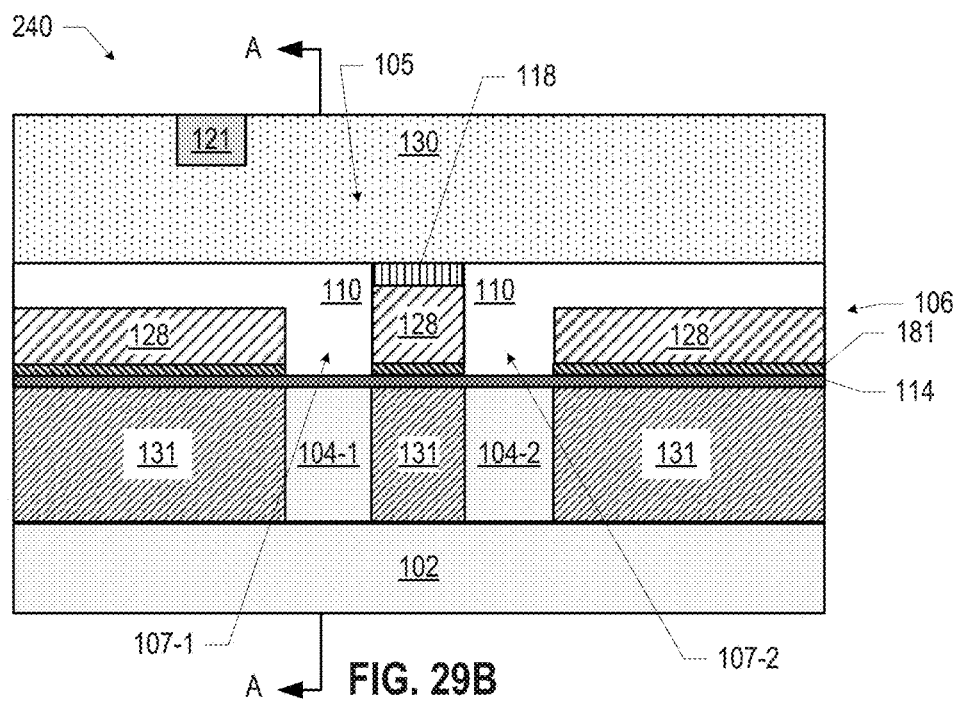

FIG. 29 illustrates an assembly 240 subsequent to filling the trench 125 of the assembly 238 (FIG. 28) with a conductive material to form the magnet line 121. The magnet line 121 may be formed using any desired techniques (e.g., plating followed by planarization, or a semi-additive process), and may take the form of any of the embodiments disclosed herein.

Figure 30A:
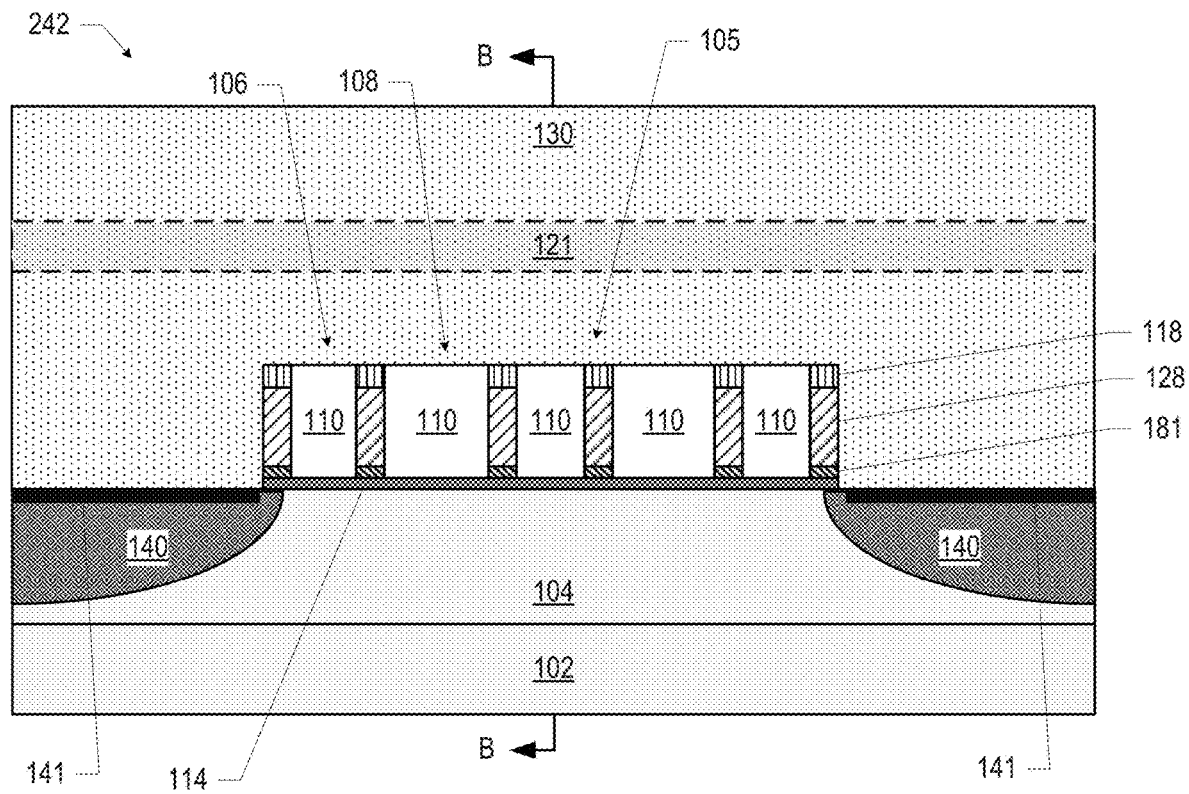
Figure 30B:
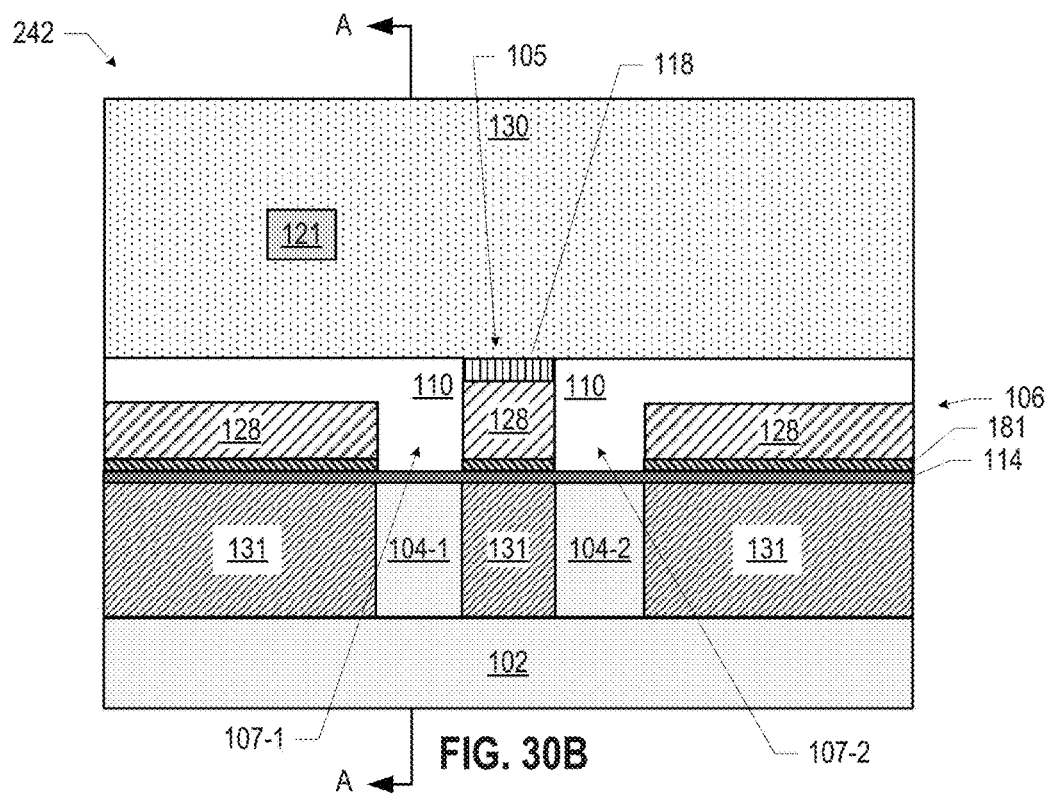

FIG. 30 illustrates an assembly 242 subsequent to providing additional insulating material 130 on the assembly 240 (FIG. 29). The insulating material 130 provided on the assembly 240 may take any of the forms of the insulating material 130 discussed above.

Figure 31A:
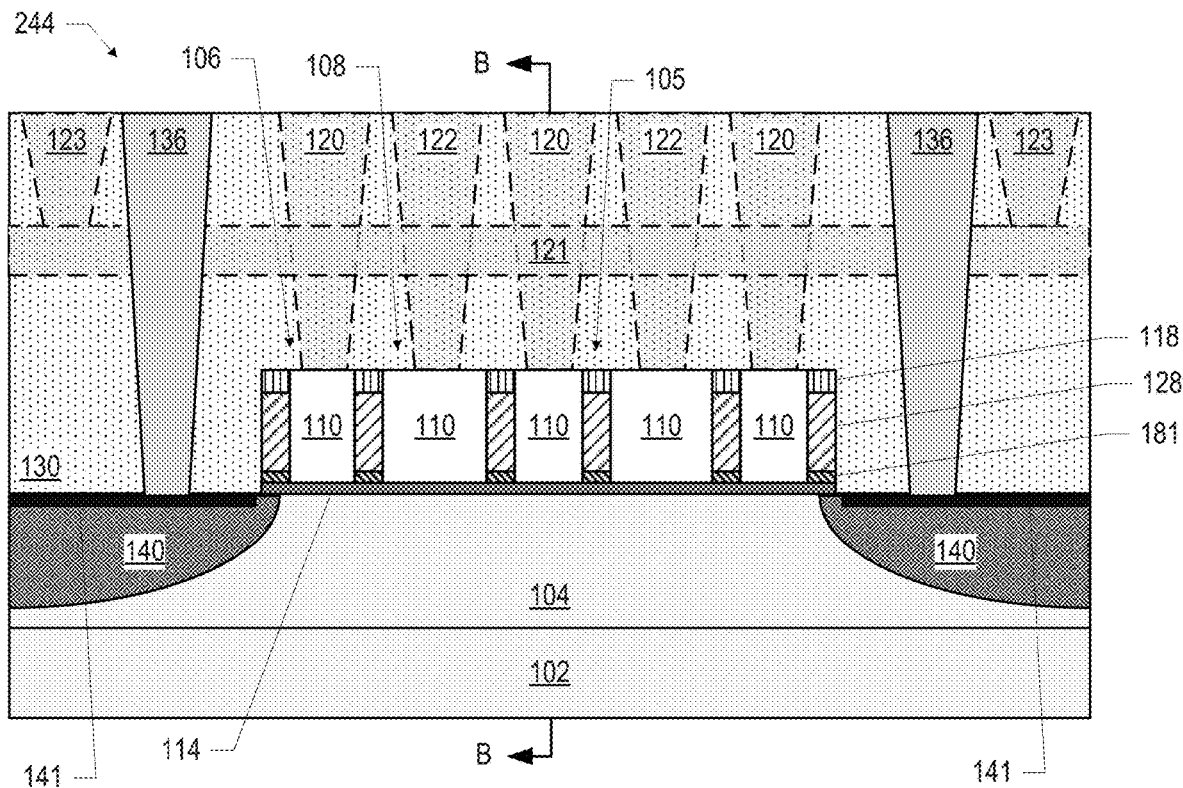
Figure 31B:
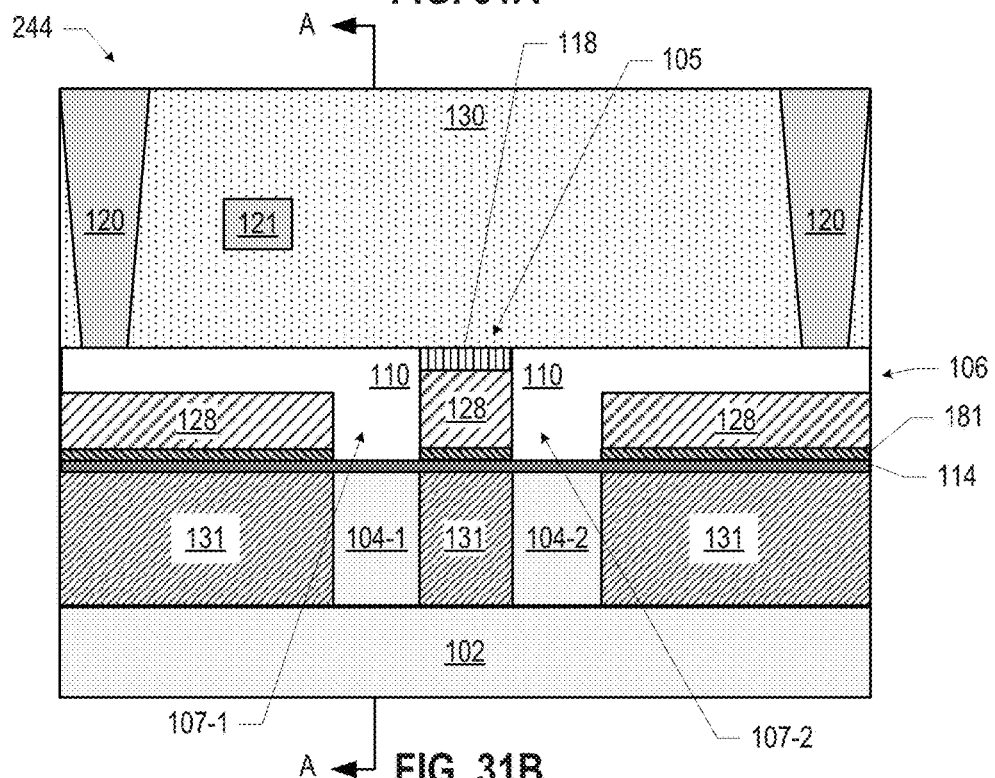

FIG. 31 illustrates an assembly 244 subsequent to forming, in the assembly 242 (FIG. 30), conductive vias 120 through the insulating material 130 to contact the gate metal 110 of the gates 106, conductive vias 122 through the insulating material 130 to contact the gate metal 110 of the gates 108, conductive vias 136 through the insulating material 130 to contact the interface material 141 of the doped regions 140, and conductive vias 123 through the insulating material 130 to contact the magnet line 121. Further conductive vias and/or lines may be formed in the assembly 244 using conventional interconnect techniques, if desired. The resulting assembly 244 may take the form of the quantum dot device 100 discussed above with reference to FIG. 1.

Figure 32:
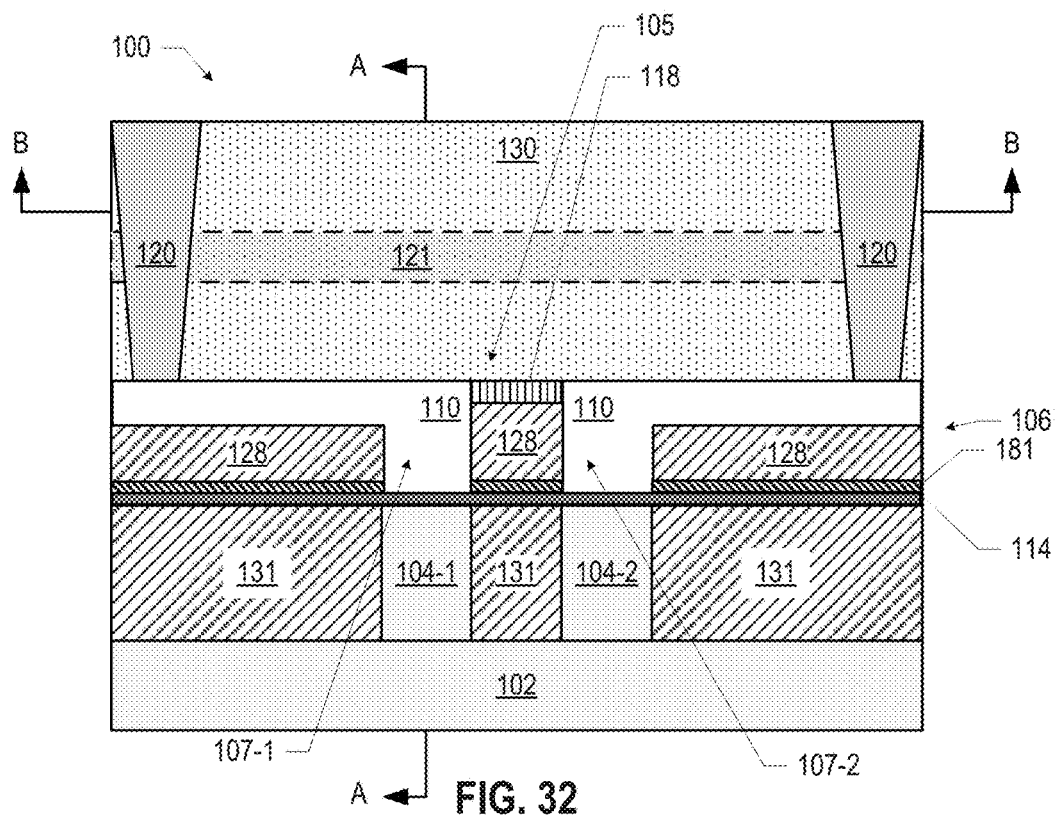
FIGS. 32-34 are cross-sectional views of another quantum dot device, in accordance with various embodiments.
Figure 33:
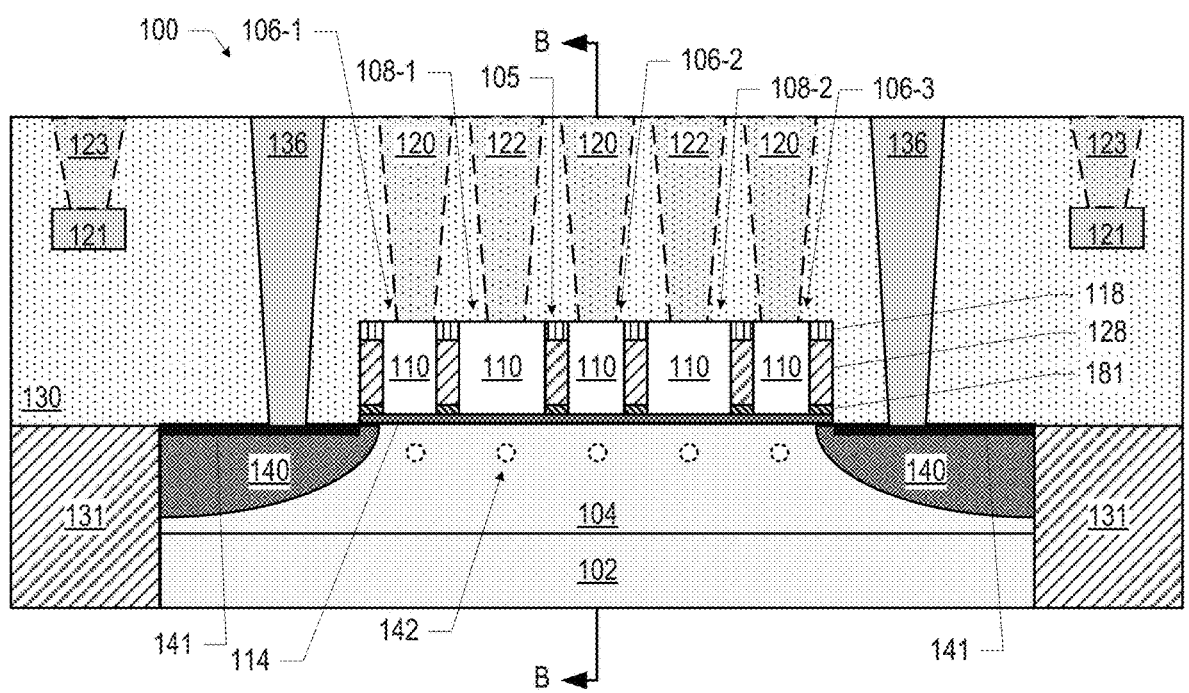
Figure 34:
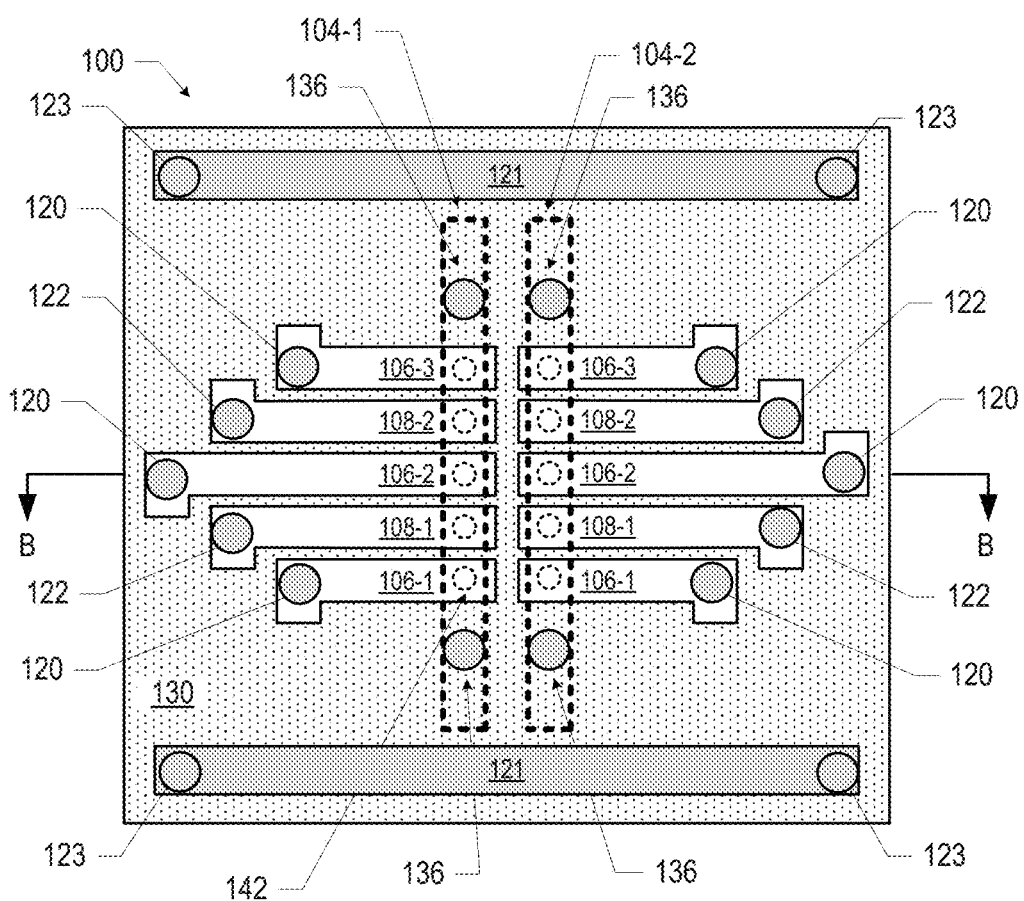

In the embodiment of the quantum dot device 100 illustrated in FIG. 1, the magnet line 121 is oriented parallel to the longitudinal axes of the fins 104. In other embodiments, the magnet line 121 may not be oriented parallel to the longitudinal axes of the fins 104. For example, FIGS. 32-34 are various cross-sectional views of an embodiment of a quantum dot device 100 having multiple magnet lines 121, each proximate to the fins 104 and oriented perpendicular to the longitudinal axes of the fins 104. Other than orientation, the magnet lines 121 of the embodiment of FIGS. 32-34 may take the form of any of the embodiments of the magnet line 121 discussed above. The other elements of the quantum dot devices 100 of FIGS. 32-34 may take the form of any of those elements discussed herein. The manufacturing operations discussed above with reference to FIGS. 2-31 may be used to manufacture the quantum dot device 100 of FIGS. 32-34.

Although a single magnet line 121 is illustrated in FIG. 1, multiple magnet lines 121 may be included in that embodiment of the quantum dot device 100 (e.g., multiple magnet lines 121 parallel to the longitudinal axes of the fins 104). For example, the quantum dot device 100 of FIG. 1 may include a second magnet line 121 proximate to the fin 104-2 in a symmetric manner to the magnet line 121 illustrated proximate to the fin 104-1. In some embodiments, multiple magnet lines 121 may be included in a quantum dot device 100, and these magnet lines 121 may or may not be parallel to one another. For example, in some embodiments, a quantum dot device 100 may include two (or more) magnet lines 121 that are oriented perpendicular to each other (e.g., one or more magnet lines 121 oriented like those illustrated in FIG. 1, and one or more magnet lines 121 oriented like those illustrated in FIGS. 32-34).

As discussed above, the base 102 and the fin 104 of a quantum dot device 100 may be formed from a substrate 144 and a quantum well stack 146 disposed on the substrate 144. The quantum well stack 146 may include a quantum well layer in which a 2DEG may form during operation of the quantum dot device 100. The quantum well stack 146 may take any of a number of forms, several of which are discussed below with reference to FIGS. 35-37. The various layers in the quantum well stacks 146 discussed below may be grown on the substrate 144 (e.g., using epitaxial processes). Although the singular term "layer" may be used to refer to various components of the quantum well stack 146 of FIGS. 35-37, any of the layers discussed below may include multiple materials arranged in any suitable manner. Layers other than the quantum well layer 152 in a quantum well stack 146 may have higher threshold voltages for conduction than the quantum well layer 152 so that when the quantum well layer 152 is biased at its threshold voltage, the quantum well layer 152 conducts and the other layers of the quantum well stack 146 do not. This may avoid parallel conduction in both the quantum well layer 152 and the other layers, and thus avoid compromising the strong mobility of the quantum well layer 152 with conduction in layers having inferior mobility. In some embodiments, silicon used in a quantum well stack 146 (e.g., in a quantum well layer 152) may be grown from precursors enriched with the 28Si isotope. In some embodiments, germanium used in a quantum well stack 146 (e.g., in a quantum well layer 152) may be grown from precursors enriched with the 70Ge, 72Ge, or 74Ge isotope. As noted above, different regions of a quantum well layer 152 of a quantum dot device 100 may be relaxed or strained. Further, when additional material layers in a quantum well stack are disposed between the quantum well layer 152 and the gate metal 110 (e.g., a barrier layer 156, as discussed below), different regions of those material layers may be relaxed or strained.

Figure 35:
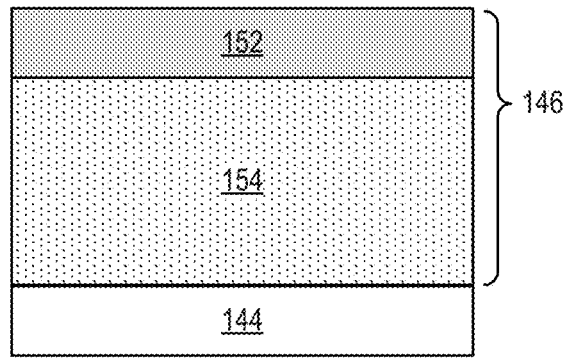
FIGS. 35-37 are cross-sectional views of example quantum well stacks and substrates that may be used in a quantum dot device, in accordance with various embodiments.

FIG. 35 is a cross-sectional view of a quantum well stack 146 on a substrate 144. The quantum well stack 146 may include a buffer layer 154 on the substrate 144, and a quantum well layer 152 on the buffer layer 154. In some embodiments of the quantum dot device 100 including the arrangement of FIG. 35, the gate dielectric 114 (not shown) may be directly on the quantum well layer 152. The quantum well layer 152 may be formed of a material such that, during operation of the quantum dot device 100, a 2DEG may form in the quantum well layer 152 proximate to the upper surface of the quantum well layer 152.

In some embodiments, the quantum well layer 152 of FIG. 35 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 35 is formed of intrinsic silicon may be particularly advantageous for electron-type quantum dot devices 100. In some embodiments, the quantum well layer 152 of FIG. 35 may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. Such embodiments may be particularly advantageous for hole-type quantum dot devices 100. The quantum well layers 152 disclosed herein may be differentially strained, with its strain induced by the gate metal 110, as discussed above.

The buffer layer 154 may be formed of the same material as the quantum well layer 152 (e.g., silicon or germanium), and may be present to trap defects that form in this material as it is grown on the substrate 144. In some embodiments, the buffer layer 154 may be grown under different conditions (e.g., deposition temperature or growth rate) from the quantum well layer 152. In particular, the quantum well layer 152 may be grown under conditions that achieve fewer defects than in the buffer layer 154.

Figure 36:
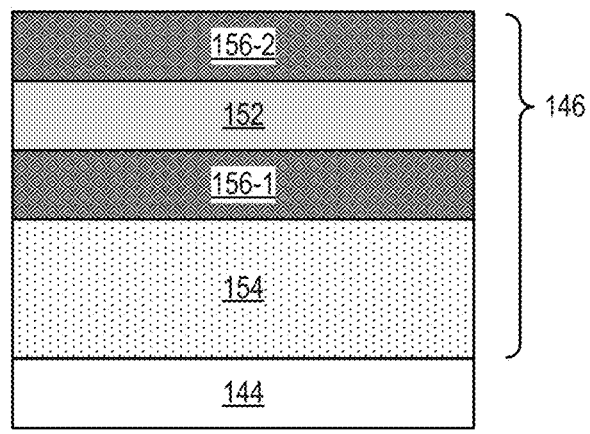

FIG. 36 is a cross-sectional view of an arrangement including a quantum well stack 146 that includes a buffer layer 154, a barrier layer 156-1, a quantum well layer 152, and an additional barrier layer 156-2. The barrier layer 156-1 (156-2) may provide a potential barrier between the quantum well layer 152 and the buffer layer 154 (gate dielectric 114, not shown). In some embodiments in which the quantum well layer 152 includes silicon or germanium, the barrier layers 156 may include silicon germanium. The germanium content of this silicon germanium may be between 20 atomic-percent and 80 atomic-percent (e.g., between 30 atomic-percent and 70 atomic-percent).

In some embodiments of the arrangement of FIG. 36, the buffer layer 154 and the barrier layer 156-1 may be formed of silicon germanium. In some such embodiments, the silicon germanium of the buffer layer 154 may have a germanium content that varies (e.g., continuously or in a stepwise manner) from the substrate 144 to the barrier layer 156-1; for example, the silicon germanium of the buffer layer 154 may have a germanium content that varies from zero percent at the substrate to a nonzero percent (e.g., between 30 atomic-percent and 70 atomic-percent) at the barrier layer 156-1. The barrier layer 156-1 may in turn have a germanium content equal to the nonzero percent. In other embodiments, the buffer layer 154 may have a germanium content equal to the germanium content of the barrier layer 156-1 but may be thicker than the barrier layer 156-1 to absorb the defects that arise during growth. In some embodiments of the quantum well stack 146 of FIG. 36, the barrier layer 156-2 may be omitted.

Figure 37:
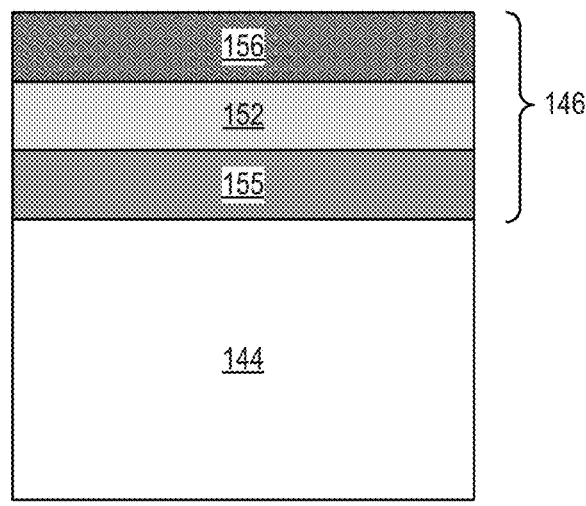

FIG. 37 is a cross-sectional view of another example quantum well stack 146 on an example substrate 144. The quantum well stack 146 of FIG. 37 may include an insulating layer 155 on the substrate 144, a quantum well layer 152 on the insulating layer 155, and a barrier layer 156 on the quantum well layer 152. The presence of the insulating layer 155 may help confine carriers to the quantum well layer 152, providing high valley splitting during operation.

In some embodiments, the substrate 144 of FIG. 37 may include silicon. The insulating layer 155 may include any suitable electrically insulating material. For example, in some embodiments, the insulating layer 155 may be an oxide (e.g., silicon oxide or hafnium oxide). The substrate 144, the quantum well layer 152, and/or the barrier layer 156 of FIG. 37 may take the form of any of the embodiments disclosed herein. In some embodiments, the quantum well layer 152 may be formed on the insulating layer 155 by a layer transfer technique. In some embodiments, the barrier layer 156 may be omitted from the quantum well stack 146 of FIG. 37.

The thicknesses (i.e., z-heights) of the layers in the quantum well stacks 146 of FIGS. 35-37 may take any suitable values. For example, in some embodiments, the thickness of the quantum well layer 152 may be between 5 nanometers and 15 nanometers (e.g., approximately equal to 10 nanometers). In some embodiments, the thickness of a buffer layer 154 may be between 0.3 microns and 4 microns (e.g., between 0.3 microns and 2 microns, or approximately 0.5 microns). In some embodiments, the thickness of the barrier layers 156 may be between 0 nanometers and 300 nanometers. In some embodiments, the thickness of the insulating layer 155 in the quantum well stack 146 of FIG. 37 may be between 5 nanometers and 200 nanometers.

The substrate 144 and the quantum well stack 146 may be distributed between the base 102 and the fins 104 of the quantum dot device 100, as discussed above. This distribution may occur in any of a number of ways. For example, FIGS. 38-44 illustrate example base/fin arrangements 158 that may be used in a quantum dot device 100, in accordance with various embodiments.

Figure 38:
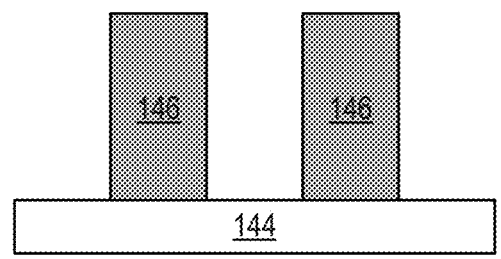
FIGS. 38-44 illustrate example base/fin arrangements that may be used in a quantum dot device, in accordance with various embodiments.

In the base/fin arrangement 158 of FIG. 38, the quantum well stack 146 may be included in the fins 104, but not in the base 102. The substrate 144 may be included in the base 102, but not in the fins 104. When the base/fin arrangement 158 of FIG. 38 is used in the manufacturing operations discussed with reference to FIGS. 3-4, the fin etching may etch through the quantum well stack 146, and stop when the substrate 144 is reached.

Figure 39:
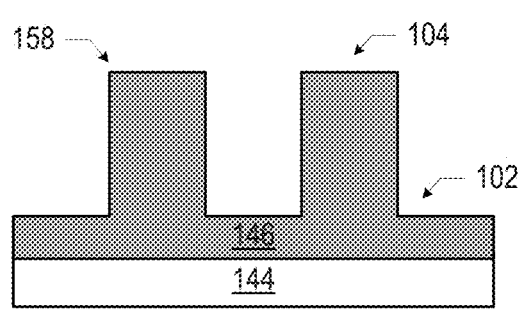
Figure 40:
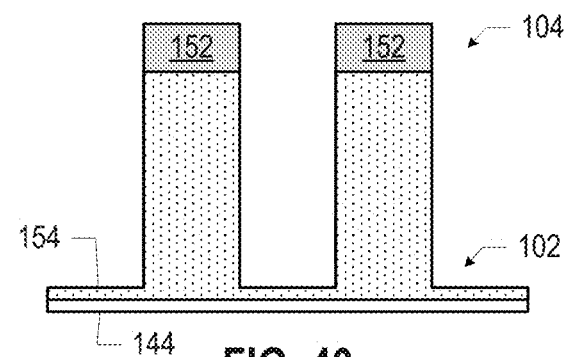

In the base/fin arrangement 158 of FIG. 39, the quantum well stack 146 may be included in the fins 104, as well as in a portion of the base 102. A substrate 144 may be included in the base 102 as well, but not in the fins 104. When the base/fin arrangement 158 of FIG. 39 is used in the manufacturing operations discussed with reference to FIGS. 3-4, the fin etching may etch partially through the quantum well stack 146, and stop before the substrate 144 is reached. FIG. 40 illustrates a particular embodiment of the base/fin arrangement 158 of FIG. 39. In the embodiment of FIG. 40, the quantum well stack 146 of FIG. 35 is used; the base 102 includes the substrate 144 and a portion of the buffer layer 154 of the quantum well stack 146, while the fins 104 include the remainder of the quantum well stack 146.

Figure 41:
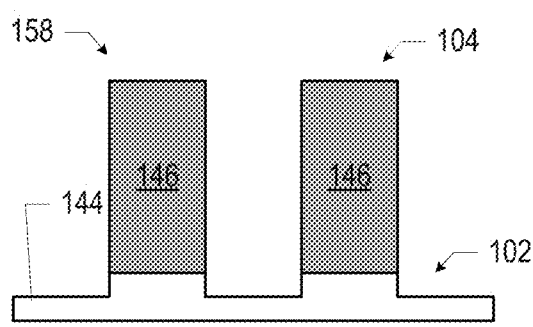
Figure 42:
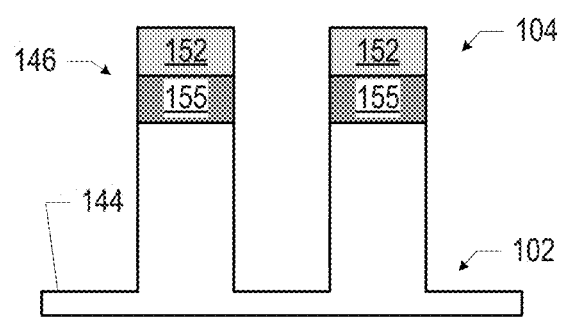

In the base/fin arrangement 158 of FIG. 41, the quantum well stack 146 may be included in the fins 104, but not the base 102. The substrate 144 may be partially included in the fins 104, as well as in the base 102. When the base/fin arrangement 158 of FIG. 41 is used in the manufacturing operations discussed with reference to FIGS. 3-4, the fin etching may etch through the quantum well stack 146 and into the substrate 144 before stopping. FIG. 42 illustrates a particular embodiment of the base/fin arrangement 158 of FIG. 41. In the embodiment of FIG. 42, the quantum well stack 146 of FIG. 37 is used; the fins 104 include the quantum well stack 146 and a portion of the substrate 144, while the base 102 includes the remainder of the substrate 144.

Figure 43:
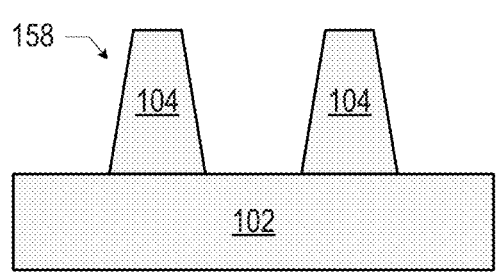
Figure 44:
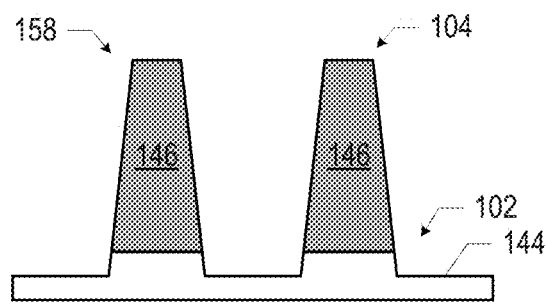

Although the fins 104 have been illustrated in many of the preceding figures as substantially rectangular with parallel sidewalls, this is simply for ease of illustration, and the fins 104 may have any suitable shape (e.g., shape appropriate to the manufacturing processes used to form the fins 104). For example, as illustrated in the base/fin arrangement 158 of FIG. 43, in some embodiments, the fins 104 may be tapered. In some embodiments, the fins 104 may taper by 3 nanometers-10 nanometers in x-width for every 100 nanometers in z-height (e.g., 5 nanometers in x-width for every 100 nanometers in z-height). When the fins 104 are tapered, the wider end of the fins 104 may be the end closer to the base 102, as illustrated in FIG. 43. FIG. 44 illustrates a particular embodiment of the base/fin arrangement 158 of FIG. 43. In FIG. 44, the quantum well stack 146 is included in the tapered fins 104 while a portion of the substrate 144 is included in the tapered fins and a portion of the substrate 144 provides the base 102.

Figure 45A:
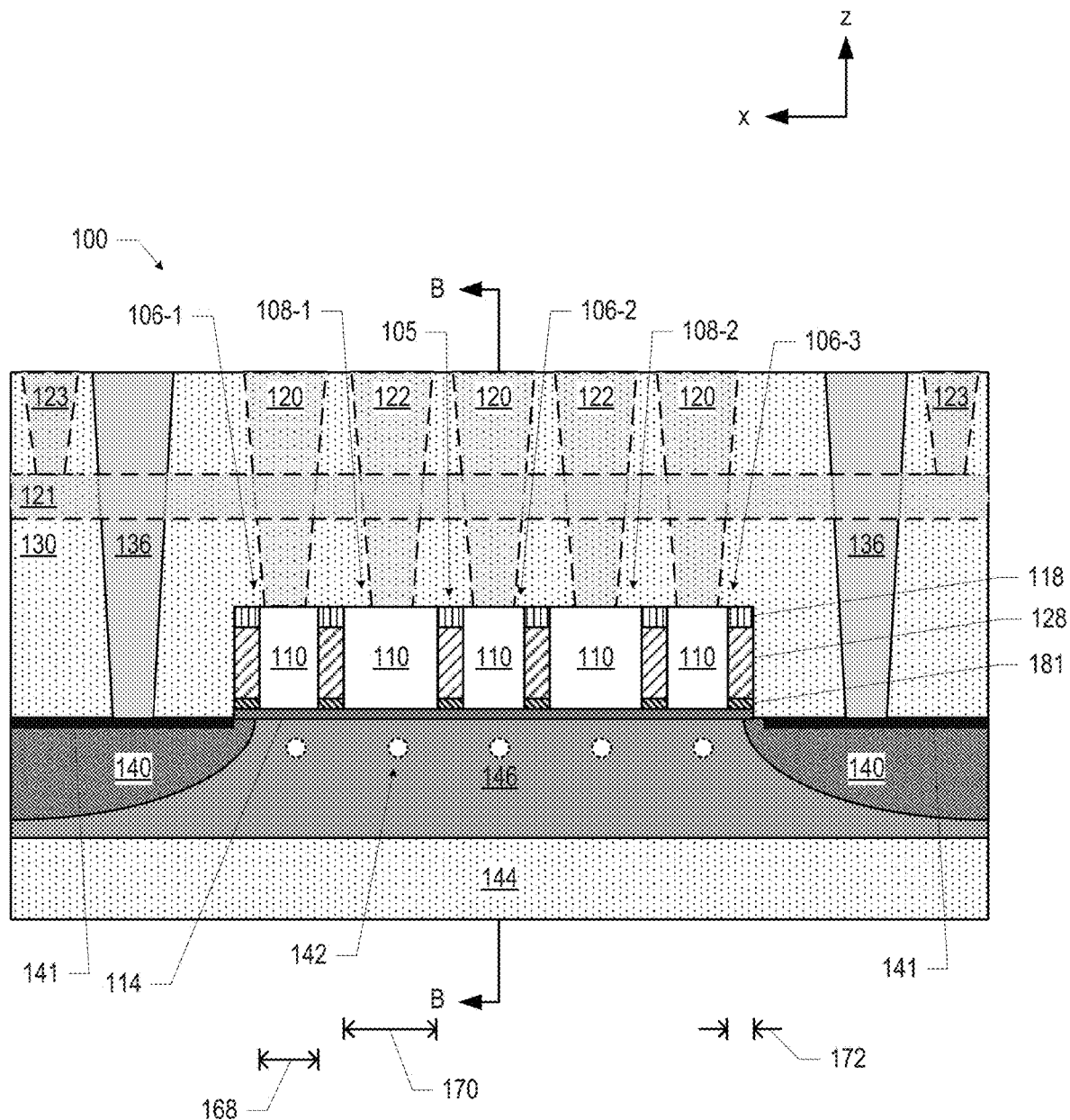
FIGS. 45A-45B are cross-sectional views of a quantum dot device, in accordance with various embodiments.
Figure 45B:
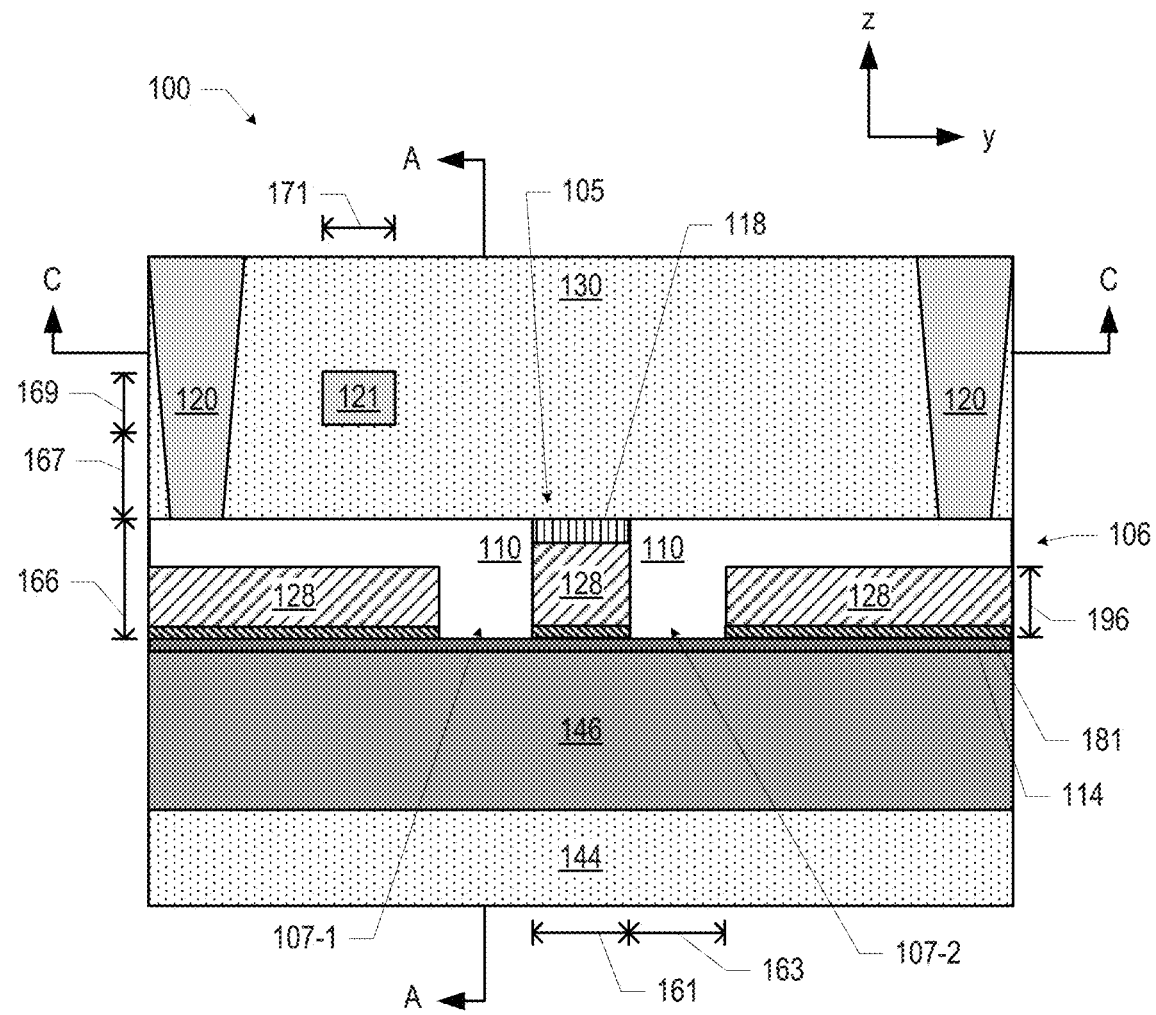

FIG. 45 provides cross-sectional views of another embodiment of a quantum dot device 100, in accordance with various embodiments. In particular, FIG. 45A illustrates the quantum dot device 100 taken along the section A-A of FIG. 45B (while FIG. 45B illustrates the quantum dot device 100 taken along the section B-B of FIG. 45A). The quantum dot device 100 of FIG. 45, taken along the section C-C of FIG. 45B, may be the same as illustrated in FIG. 10. Although FIG. 45B indicates that the cross-section illustrated in FIG. 45A is taken through the trench region 107-1, an analogous cross-section taken through the trench region 107-2 may be identical, and thus the discussion of FIG. 45A refers generally to the "trench region 107."

The quantum dot device 100 may include a quantum well stack 146 disposed on a substrate 144. An insulating material 128 may be disposed above the quantum well stack 146, and multiple trench regions 107 in the insulating material 128 may extend towards the quantum well stack 146. In the embodiment illustrated in FIG. 45, a gate dielectric 114 may be disposed at the "bottom" of the trench regions 107 and may extend up the "side walls" of the trench regions 107 and over adjacent portions of insulating material 128. In the embodiment of FIG. 45, the gate dielectric 114 may be disposed on the quantum well stack 146 (under the insulating material 128 and the gate metal 110), but in other embodiments, the gate dielectric 114 may take different forms (e.g., may have a U-shaped cross-section, as discussed below with reference to FIG. 47). The quantum well stack 146 of the quantum dot device 100 of FIG. 45 may take the form of any of the quantum well stacks disclosed herein (e.g., as discussed above with reference to FIGS. 35-37). The various layers in the quantum well stack 146 of FIG. 45 may be grown on the substrate 144 (e.g., using epitaxial processes).

Figure 48:
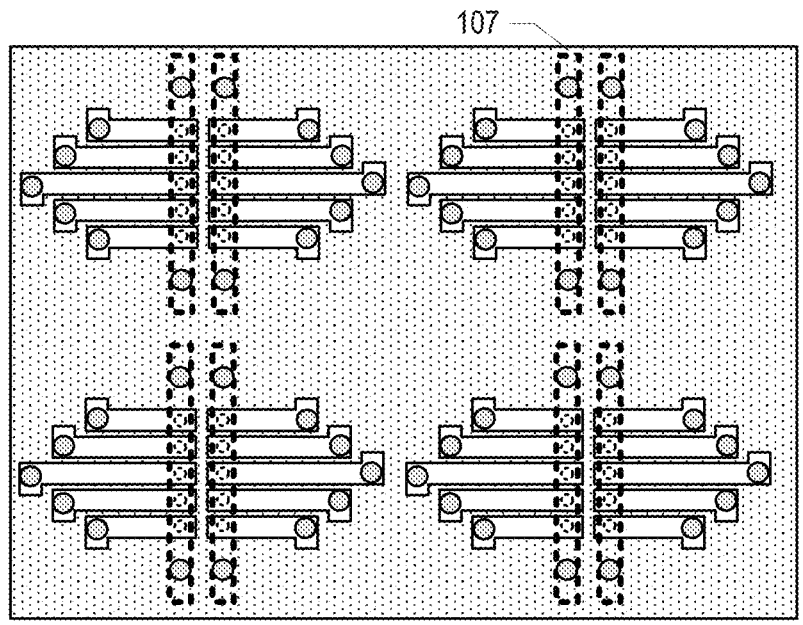
FIG. 48 illustrates an embodiment of a quantum dot device having multiple trenches arranged in a two-dimensional array, in accordance with various embodiments.

Although only two trenches, 107-1 and 107-2, are shown in FIG. 45, this is simply for ease of illustration, and more than two trench regions 107 may be included in the quantum dot device 100. In some embodiments, the total number of trench regions 107 included in the quantum dot device 100 is an even number, with the trench regions 107 organized into pairs including one active trench region 107 and one read trench region 107, as discussed in detail below. When the quantum dot device 100 includes more than two trench regions 107, the trench regions 107 may be arranged in pairs in a line (e.g., 2N trenches total may be arranged in a 1×2N line, or a 2×N line) or in pairs in a larger array (e.g., 2N trenches total may be arranged as a 4×N/2 array, a 6×N/3 array, etc.). For example, FIG. 48 illustrates a quantum dot device 100 including an example two-dimensional array of trench regions 107. As illustrated in FIG. 45B, in some embodiments, multiple trench regions 107 may be oriented in parallel. The discussion herein will largely focus on a single pair of trench regions 107 for ease of illustration, but all the teachings of the present disclosure apply to quantum dot devices 100 with more trench regions 107.

As discussed above with reference to FIG. 1, in the quantum dot device 100 of FIG. 45, a quantum well layer itself may provide a geometric constraint on the z-location of quantum dots in the quantum well stack 146. To control the x- and y-location of quantum dots in the quantum well stack 146, voltages may be applied to gates disposed at least partially in the trench regions 107 above the quantum well stack 146 to adjust the energy profile along the trench regions 107 in the x- and y-direction and thereby constrain the x- and y-location of quantum dots within quantum wells (discussed in detail below with reference to the gates 106/108). The dimensions of the trench regions 107 may take any suitable values. For example, in some embodiments, the trench regions 107 may each have a width 163 between 10 nanometers and 30 nanometers. In some embodiments, the trench regions 107 may each have a vertical dimension 196 between 20 nanometers and 200 nanometers (e.g., between 250 nanometers and 350 nanometers, or equal to 300 nanometers). The insulating material 128 may be a dielectric material (e.g., an ILD), such as silicon oxide. In some embodiments, the insulating material 128 may be a CVD oxide or a flowable CVD oxide. In some embodiments, the trench regions 107 may be spaced apart by a gate wall 105 with a width 161 between 50 nanometers and 250 nanometers.

Multiple gates may be disposed at least partially in each of the trench regions 107. In the embodiment illustrated in FIG. 45A, three gates 106 and two gates 108 are shown as distributed at least partially in a single trench region 107. This particular number of gates is simply illustrative, and any suitable number of gates may be used. Additionally, as discussed below with reference to FIG. 49, multiple groups of gates (like the gates illustrated in FIG. 45A) may be disposed at least partially in the trench region 107.

As shown in FIG. 45A, the gate 108-1 may be disposed between the gates 106-1 and 106-2, and the gate 108-2 may be disposed between the gates 106-2 and 106-3. As discussed above with reference to the quantum dot device 100 of FIG. 1, a gate 106 may be spaced apart from an adjacent gate 108 by a gate wall 105, which may take any of the forms disclosed herein.

Each of the gates 106/108 may include a gate dielectric 114 and a gate metal 110, which may take any of the forms disclosed herein. As shown in FIG. 45B, the gate metal 110 of a gate 106/108 may extend over the insulating material 128 and into a trench region 107 in the insulating material 128. The dimensions of the gates 106/108 may take any suitable values, such as any of the values discussed above with reference to FIG. 1.

As shown in FIG. 45A, the gates 106 and 108 may be alternately arranged in the x-direction. During operation of the quantum dot device 100, voltages may be applied to the gates 106/108 to adjust the potential energy in the quantum well stack 146 to create quantum wells of varying depths in which quantum dots 142 may form, as discussed above with reference to the quantum dot device 100 of FIG. 1. Only one quantum dot 142 is labeled with a reference numeral in FIG. 45A for ease of illustration, but five are indicated as dotted circles below each trench region 107.

The quantum well stack 146 of the quantum dot device 100 of FIG. 45 may include doped regions 140 that may serve as a reservoir of charge carriers for the quantum dot device 100, in accordance with any of the embodiments discussed above. The quantum dot devices 100 discussed with reference to FIG. 45 may be used to form electron-type or hole-type quantum dots 142, as discussed above with reference to FIG. 1.

Conductive vias and lines may contact the gates 106/108 of the quantum dot device 100 of FIG. 45, and to the doped regions 140, to enable electrical connection to the gates 106/108 and the doped regions 140 to be made in desired locations. As shown in FIG. 45, the gates 106 may extend both "vertically" and "horizontally" away from the quantum well stack 146, and conductive vias 120 may contact the gates 106 (and are drawn in dashed lines in FIG. 45A to indicate their location behind the plane of the drawing). The conductive vias 120 may contact the gate metal 110 of the gates 106. The gates 108 may similarly extend away from the quantum well stack 146, and conductive vias 122 may contact the gates 108 (also drawn in dashed lines in FIG. 45A to indicate their location behind the plane of the drawing). The conductive vias 122 may contact the gate metal 110 of the gates 108. Conductive vias 136 may contact the interface material 141 and may thereby make electrical contact with the doped regions 140. The quantum dot device 100 of FIG. 45 may include further conductive vias and/or lines (not shown) to make electrical contact to the gates 106/108 and/or the doped regions 140, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

In some embodiments, the quantum dot device 100 of FIG. 45 may include one or more magnet lines 121. For example, a single magnet line 121 is illustrated in FIG. 45, proximate to the trench region 107-1. The magnet line(s) 121 of the quantum dot device of FIG. 45 may take the form of any of the embodiments of the magnet lines 121 discussed herein.

The conductive vias 120, 122, 136, and 123 may be electrically isolated from each other by an insulating material 130, all of which may take any of the forms discussed above with reference to FIG. 1. In some embodiments, the insulating material 130 may have a same material composition as the insulating material 128. The particular arrangement of conductive vias shown in FIG. 45 is simply illustrative, and any electrical routing arrangement may be implemented.

As discussed above, the structure of the trench region 107-1 may be the same as the structure of the trench region 107-2; similarly, the construction of gates 106/108 in and around the trench region 107-1 may be the same as the construction of gates 106/108 in and around the trench region 107-2. The gates 106/108 associated with the trench region 107-1 may be mirrored by corresponding gates 106/108 associated with the parallel trench region 107-2, and the insulating material 130 may separate the gates 106/108 associated with the different trench regions 107-1 and 107-2. In particular, quantum dots 142 formed in the quantum well stack 146 under the trench region 107-1 (under the gates 106/108) may have counterpart quantum dots 142 in the quantum well stack 146 under the trench region 107-2 (under the corresponding gates 106/108). In some embodiments, the quantum dots 142 under the trench region 107-1 may be used as "active" quantum dots in the sense that these quantum dots 142 act as qubits and are controlled (e.g., by voltages applied to the gates 106/108 associated with the trench region 107-1) to perform quantum computations. The quantum dots 142 associated with the trench region 107-2 may be used as "read" quantum dots in the sense that these quantum dots 142 may sense the quantum state of the quantum dots 142 under the trench region 107-1 by detecting the electric field generated by the charge in the quantum dots 142 under the trench region 107-1, and may convert the quantum state of the quantum dots 142 under the trench region 107-1 into electrical signals that may be detected by the gates 106/108 associated with the trench region 107-2. Each quantum dot 142 under the trench region 107-1 may be read by its corresponding quantum dot 142 under the trench region 107-2. Thus, the quantum dot device 100 enables both quantum computation and the ability to read the results of a quantum computation.

The quantum dot devices 100 disclosed herein may be manufactured using any suitable techniques. In some embodiments, the manufacture of the quantum dot device 100 of FIG. 45 may substantially follow the operations described above with reference to FIGS. 2-31; however, instead of forming fins 104 in the quantum well stack 146 of the assembly 202 (as discussed above with reference to FIGS. 4-6), the operations associated with FIGS. 4-6 may be omitted and the insulating material 128 and gates 106/108 may be formed above the quantum well stack 146.

Figure 46A:
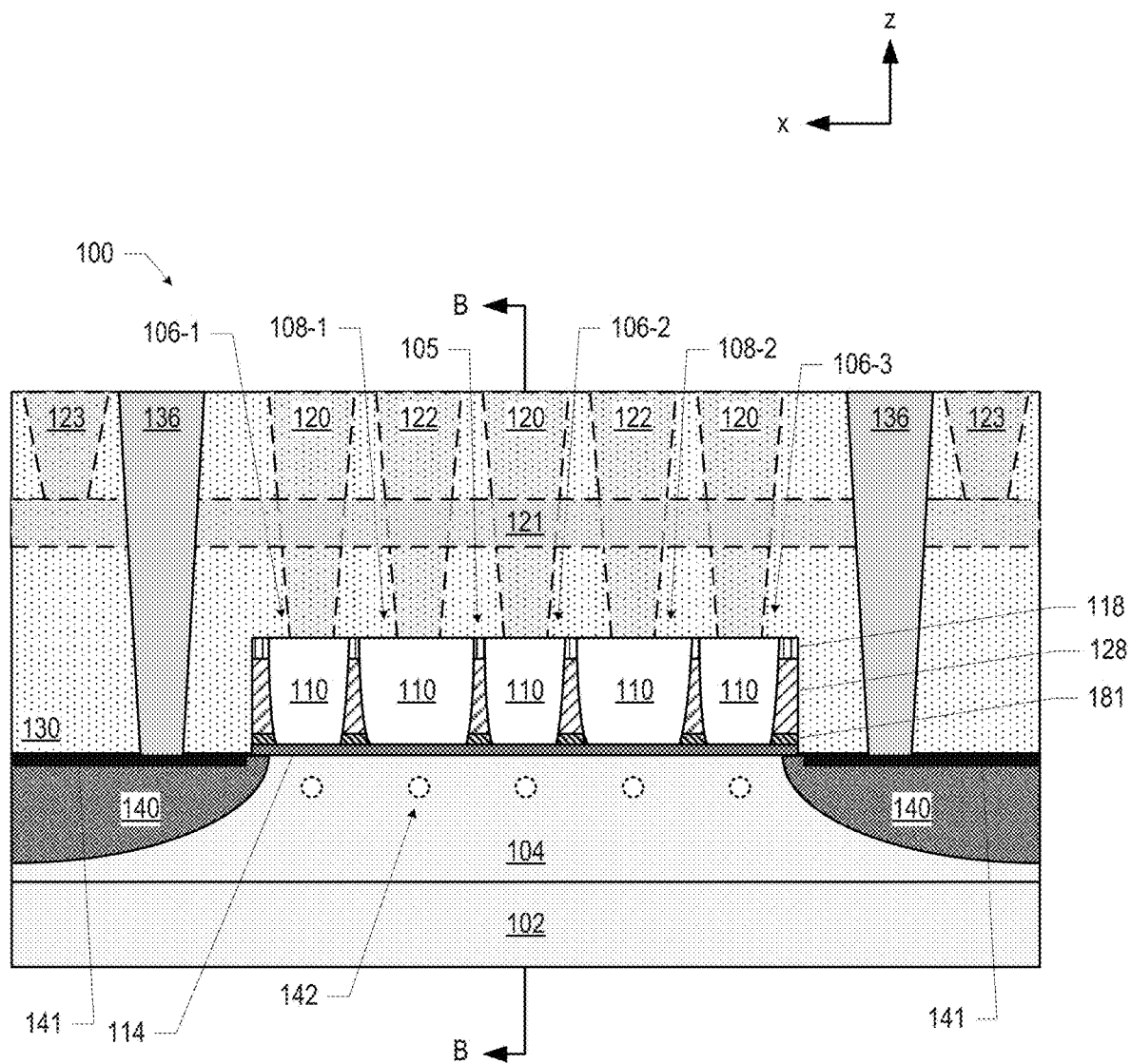
FIGS. 46A and 46B are cross-sectional views of an example quantum dot device, in accordance with various embodiments.
Figure 46B:
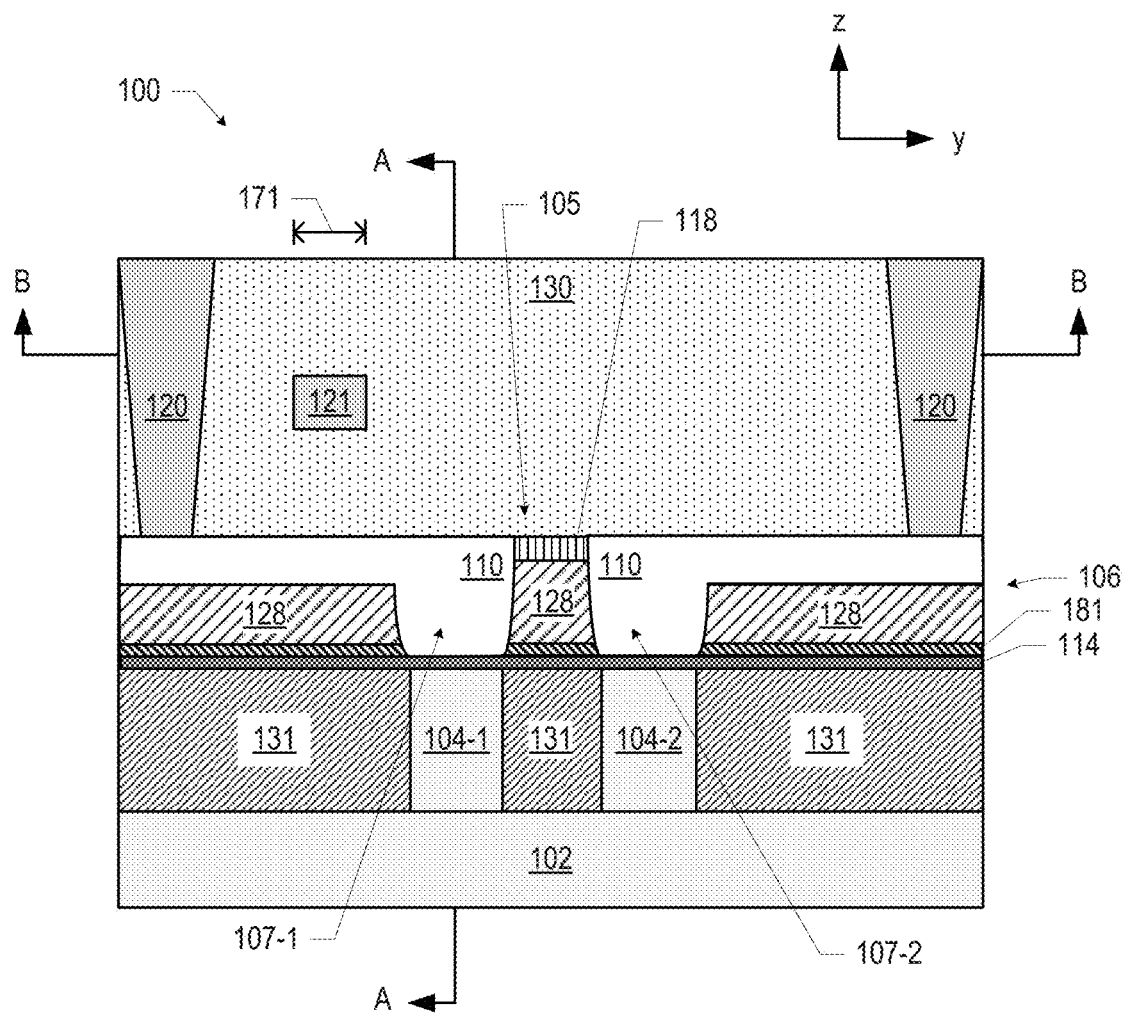

Although various ones of the accompanying drawings illustrate features of the quantum dot devices 100 disclosed herein as having perfectly straight sides, perfectly perpendicular corners, etc., it is understood that this is simply for ease of illustration, and actual devices made using practical manufacturing techniques will exhibit rounded corners, surface roughness, and other features. For example, when the trench regions 107 are formed in the insulating material 128 (e.g., as described in the manufacturing operations discussed above), the result may be cavities in the insulating material 128 that are bowed outwards (or tapered inwards, not shown). FIG. 46 provides an example of such outward bowing. Any of the quantum dot devices 100 presented herein may exhibit such bowed or tapered cavities.

Figure 47A:
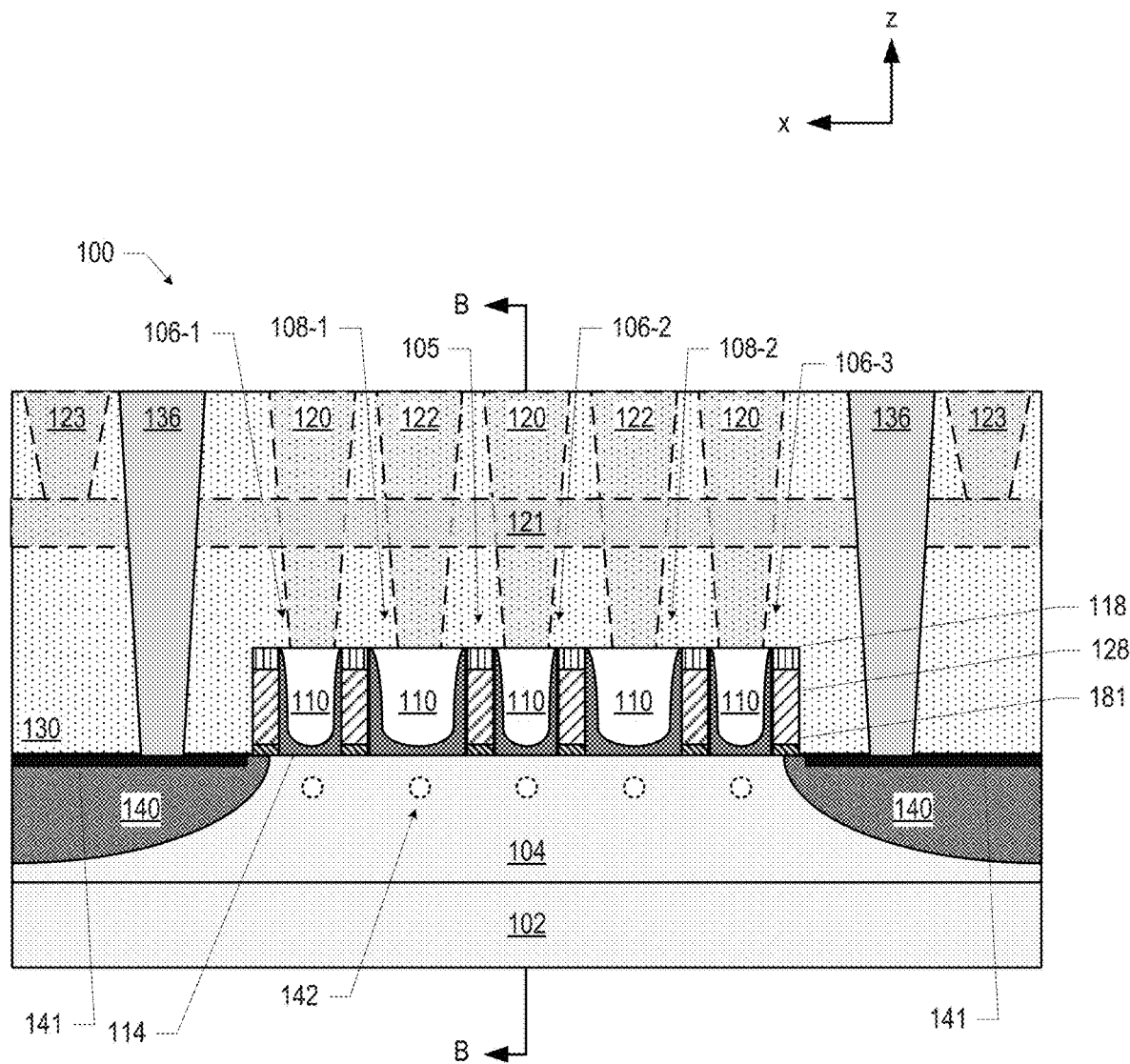
FIGS. 47A and 47B are cross-sectional views of an example quantum dot device, in accordance with various embodiments.
Figure 47B:
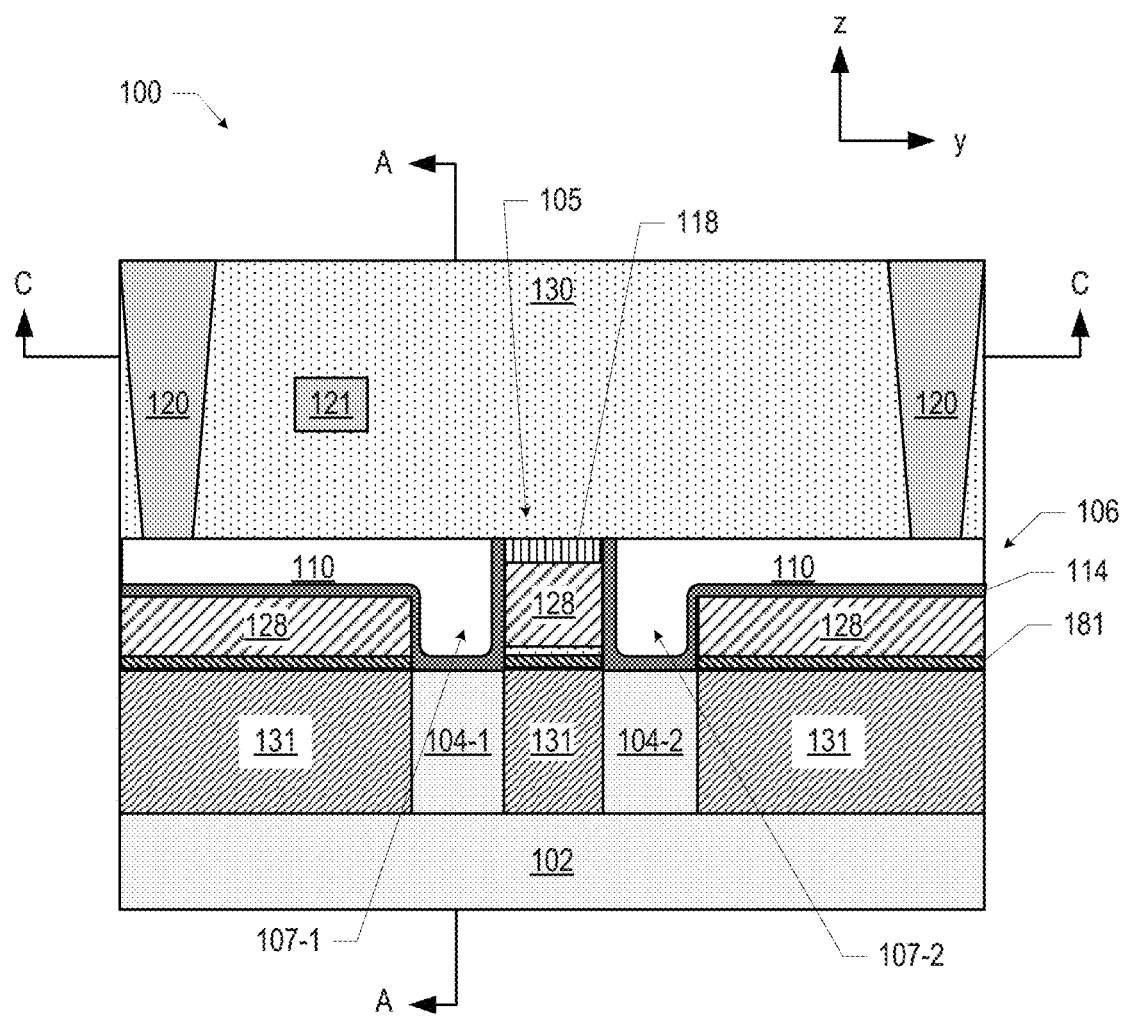

As noted above, in some embodiments, the gate dielectric 114 may not be deposited on the quantum well stack 146 before deposition of the insulating material 128 (e.g., as illustrated in FIGS. 1 and 45), but may instead be deposited after the insulating material 128 and gate walls are patterned. For example, the gate dielectric 114 may be conformally deposited over the assembly 223 (FIG. 21), prior to deposition of the gate metal 110. The resulting gate dielectric 114 for each gate 106/108 may extend at least partially up the sides of the adjacent gate wall 105 (forming a "U" shape), and the gate metal 110 may extend between the portions of gate dielectric 114 on the adjacent gate walls 105. An example of such an embodiment is shown in FIG. 47. Although a single reference numeral 114 is used to refer to gate dielectrics herein, in some embodiments, the gate dielectric 114 of the gates 106 disclosed herein may have a different material composition than the gate dielectric 114 of the gates 108 disclosed herein. In other embodiments, the gate dielectric 114 of the gates 106 disclosed herein may have a same material composition as the gate dielectric 114 of the gates 108 disclosed herein.

As noted above, a quantum dot device 100 may include multiple trench regions 107 arranged in an array of any desired size. For example, FIG. 48 is a top cross-sectional view, like the view of FIG. 10, of a quantum dot device 100 having multiple trench regions 107 arranged in a two-dimensional array. Magnet lines 121 are not depicted in FIG. 48, although they may be included in any desired arrangements. In the particular example illustrated in FIG. 48, the trench regions 107 may be arranged in pairs, each pair including an "active" trench region 107 and a "read" trench region 107, as discussed above. The particular number and arrangement of trench regions 107 in FIG. 48 is simply illustrative, and any desired arrangement may be used. Similarly, a quantum dot device 100 may include multiple sets of fins 104 (and accompanying gates, as discussed above with reference to FIG. 1) arranged in a two-dimensional array.

Figure 49:
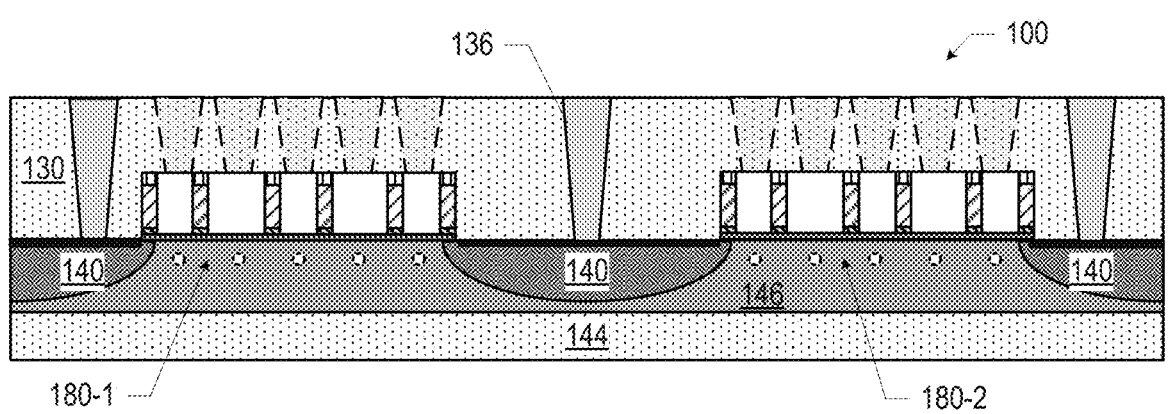
FIG. 49 illustrates an embodiment of a quantum dot device having multiple groups of gates in a single trench on a quantum well stack, in accordance with various embodiments.

As noted above, a single trench region 107 may include multiple groups of gates 106/108, spaced apart along the trench by a doped region 140. FIG. 49 is a cross-sectional view of an example of such a quantum dot device 100 having multiple groups of gates 180 at least partially disposed in a single trench region 107 above a quantum well stack 146, in accordance with various embodiments. Each of the groups 180 may include gates 106/108 (not labeled in FIG. 49 for ease of illustration) that may take the form of any of the embodiments of the gates 106/108 discussed herein. A doped region 140 (and its interface material 141) may be disposed between two adjacent groups 180 (labeled in FIG. 49 as groups 180-1 and 180-2), and may provide a common reservoir for both groups 180. In some embodiments, this "common" doped region 140 may be electrically contacted by a single conductive via 136. The particular number of gates 106/108 illustrated in FIG. 49, and the particular number of groups 180, is simply illustrative, and a trench region 107 may include any suitable number of gates 106/108 arranged in any suitable number of groups 180. The quantum dot device 100 of FIG. 49 may also include one or more magnet lines 121, arranged as desired. Similarly, in embodiments of the quantum dot device 100 that include fins, a single fin 104 may include multiple groups of gates 106/108, spaced apart along the fin.

Figure 50:
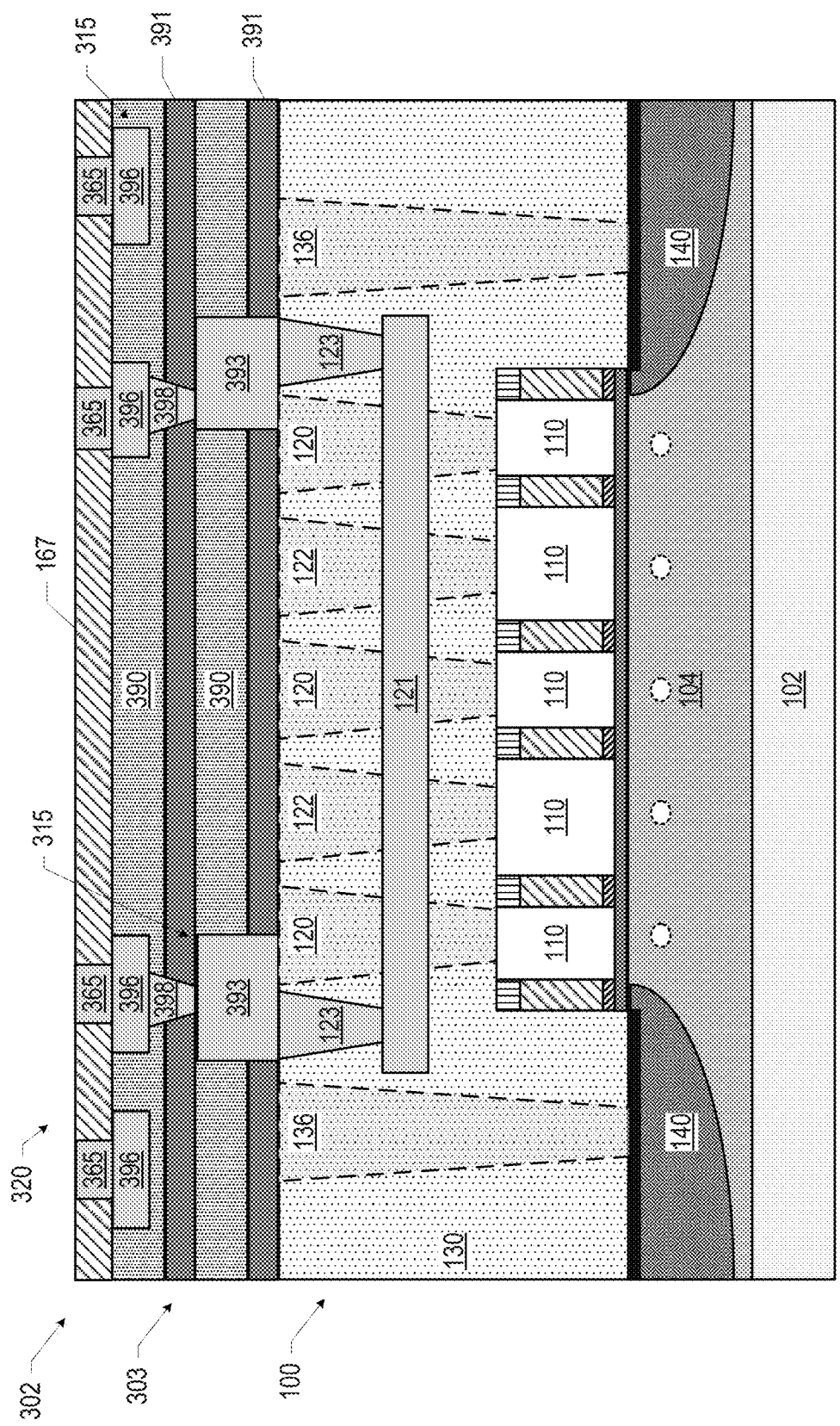
FIG. 50 is a cross-sectional view of a quantum dot device with multiple interconnect layers, in accordance with various embodiments.
Figure 51:
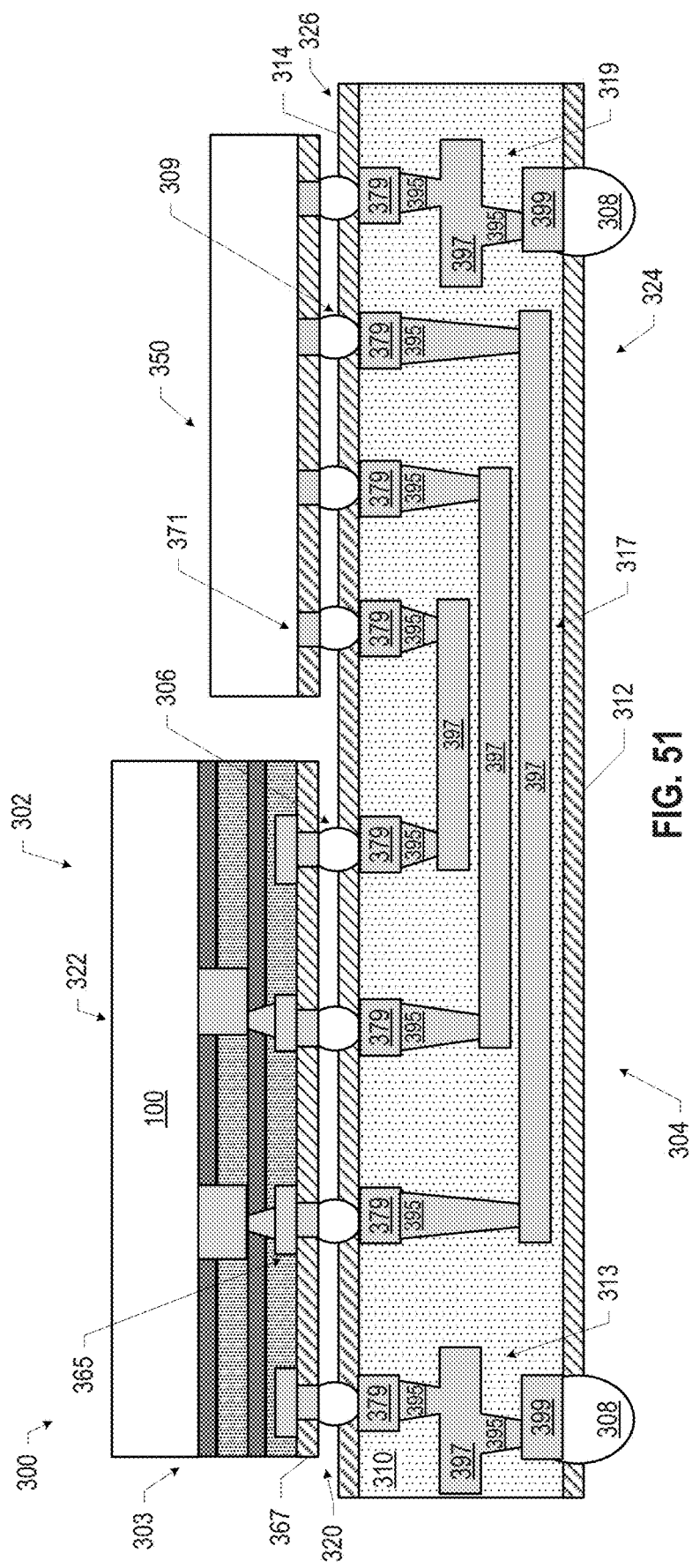
FIG. 51 is a cross-sectional view of a quantum dot device package, in accordance with various embodiments.

In some embodiments, the quantum dot device 100 may be included in a die and coupled to a package substrate to form a quantum dot device package. For example, FIG. 50 is a side cross-sectional view of a die 302 including the quantum dot device 100 of FIG. 45A and conductive pathway layers 303 disposed thereon, while FIG. 51 is a side cross-sectional view of a quantum dot device package 300 in which the die 302 and another die 350 are coupled to a package substrate 304 (e.g., in a system-on-a-chip (SoC) arrangement). Details of the quantum dot device 100 are omitted from FIG. 51 for economy of illustration. As noted above, the particular quantum dot device 100 illustrated in FIGS. 50 and 51 may take a form similar to the embodiments illustrated in FIGS. 1A and 45A, but any of the quantum dot devices 100 disclosed herein may be included in a die (e.g., the die 302) and coupled to a package substrate (e.g., the package substrate 304). In particular, any number of fins 104 or trench regions 107, gates 106/108, doped regions 140, magnet lines 121, and other components discussed herein with reference to various embodiments of the quantum dot device 100 may be included in the die 302.

The die 302 may include a first face 320 and an opposing second face 322. The base 102 may be proximate to the second face 322, and conductive pathways 315 from various components of the quantum dot device 100 may extend to conductive contacts 365 disposed at the first face 320. The conductive pathways 315 may include conductive vias, conductive lines, and/or any combination of conductive vias and lines. For example, FIG. 50 illustrates an embodiment in which one conductive pathway 315 (extending between a magnet line 121 and associated conductive contact 365) includes a conductive via 123, a conductive line 393, a conductive via 398, and a conductive line 396. More or fewer structures may be included in the conductive pathways 315, and analogous conductive pathways 315 may be provided between ones of the conductive contacts 365 and the gates 106/108, doped regions 140, or other components of the quantum dot device 100. In some embodiments, conductive lines of the die 302 (and the package substrate 304, discussed below) may extend into and out of the plane of the drawing, providing conductive pathways to route electrical signals to and/or from various elements in the die 302.

The conductive vias and/or lines that provide the conductive pathways 315 in the die 302 may be formed using any suitable techniques. Examples of such techniques may include subtractive fabrication techniques, additive or semi-additive fabrication techniques, single damascene fabrication techniques, dual damascene fabrication techniques, or any other suitable technique. In some embodiments, layers of oxide material 390 and layers of nitride material 391 may insulate various structures in the conductive pathways 315 from proximate structures, and/or may serve as etch stops during fabrication. In some embodiments, an adhesion layer (not shown) may be disposed between conductive material and proximate insulating material of the die 302 to improve mechanical adhesion between the conductive material and the insulating material.

The gates 106/108, the doped regions 140, and the quantum well stack 146 (as well as the proximate conductive vias/lines) may be referred to as part of the "device layer" of the quantum dot device 100. The conductive lines 393 may be referred to as a Metal 1 or "M1" interconnect layer, and may couple the structures in the device layer to other interconnect structures. The conductive vias 398 and the conductive lines 396 may be referred to as a Metal 2 or "M2" interconnect layer, and may be formed directly on the M1 interconnect layer.

A solder resist material 367 may be disposed around the conductive contacts 365, and, in some embodiments, may extend onto the conductive contacts 365. The solder resist material 367 may be a polyimide or similar material, or may be any appropriate type of packaging solder resist material. In some embodiments, the solder resist material 367 may be a liquid or dry film material including photoimageable polymers. In some embodiments, the solder resist material 367 may be non-photoimageable (and openings therein may be formed using laser drilling or masked etch techniques). The conductive contacts 365 may provide the contacts to couple other components (e.g., a package substrate 304, as discussed below, or another component) to the conductive pathways 315 in the quantum dot device 100, and may be formed of any suitable conductive material (e.g., a superconducting material). For example, solder bonds may be formed on the one or more conductive contacts 365 to mechanically and/or electrically couple the die 302 with another component (e.g., a circuit board), as discussed below. The conductive contacts 365 illustrated in FIG. 50 take the form of bond pads, but other first-level interconnect structures may be used (e.g., posts) to route electrical signals to/from the die 302, as discussed below.

The combination of the conductive pathways and the proximate insulating material (e.g., the insulating material 130, the oxide material 390, and the nitride material 391) in the die 302 may provide an ILD stack of the die 302. As noted above, interconnect structures may be arranged within the quantum dot device 100 to route electrical signals according to a wide variety of designs (in particular, the arrangement is not limited to the particular configuration of interconnect structures depicted in FIG. 50 or any of the other accompanying figures, and may include more or fewer interconnect structures). During operation of the quantum dot device 100, electrical signals (such as power and/or input/output (I/O) signals) may be routed to and/or from the gates 106/108, the magnet line(s) 121, and/or the doped regions 140 (and/or other components) of the quantum dot device 100 through the interconnects provided by conductive vias and/or lines, and through the conductive pathways of the package substrate 304 (discussed below).

Example superconducting materials that may be used for the structures in the conductive pathways 313, 317, 319 (discussed below), and 315, and/or conductive contacts of the die 302 and/or the package substrate 304, may include aluminum, niobium, tin, titanium, osmium, zinc, molybdenum, tantalum, vanadium, or composites of such materials (e.g., niobium titanium, niobium aluminum, or niobium tin). In some embodiments, the conductive contacts 365, 379, and/or 399 may include aluminum, and the first-level interconnects 306 and/or the second-level interconnects 308 may include an indium-based solder.

As noted above, the quantum dot device package 300 of FIG. 51 may include a die 302 (including one or more quantum dot devices 100) and a die 350. As discussed in detail below, the quantum dot device package 300 may include electrical pathways between the die 302 and the die 350 so that the dies 302 and 350 may communicate during operation. In some embodiments, the die 350 may be a non-quantum logic device that may provide support or control functionality for the quantum dot device(s) 100 of the die 302. For example, as discussed further below, in some embodiments, the die 350 may include a switching matrix to control the writing and reading of data from the die 302 (e.g., using any known word line/bit line or other addressing architecture). In some embodiments, the die 350 may control the voltages (e.g., microwave pulses) applied to the gates 106/108, and/or the doped regions 140, of the quantum dot device(s) 100 included in the die 302. In some embodiments, the die 350 may include magnet line control logic to provide microwave pulses to the magnet line(s) 121 of the quantum dot device(s) 100 in the die 302. The die 350 may include any desired control circuitry to support operation of the die 302. By including this control circuitry in a separate die, the manufacture of the die 302 may be simplified and focused on the needs of the quantum computations performed by the quantum dot device(s) 100, and conventional manufacturing and design processes for control logic (e.g., switching array logic) may be used to form the die 350.

Although a singular "die 350" is illustrated in FIG. 51 and discussed herein, the functionality provided by the die 350 may, in some embodiments, be distributed across multiple dies 350 (e.g., multiple dies coupled to the package substrate 304, or otherwise sharing a common support with the die 302). Similarly, one or more dies providing the functionality of the die 350 may support one or more dies providing the functionality of the die 302; for example, the quantum dot device package 300 may include multiple dies having one or more quantum dot devices 100, and a die 350 may communicate with one or more such "quantum dot device dies."

The die 350 may take any of the forms discussed below with reference to the non-quantum processing device 2028 of FIG. 55. Mechanisms by which the control logic of the die 350 may control operation of the die 302 may be take the form of an entirely hardware embodiment or an embodiment combining software and hardware aspects. For example, the die 350 may implement an algorithm executed by one or more processing units, e.g. one or more microprocessors. In various embodiments, aspects of the present disclosure may take the form of a computer program product embodied in one or more computer readable medium(s), preferably non-transitory, having computer readable program code embodied (e.g., stored) in or coupled to the die 350. In various embodiments, such a computer program may, for example, be downloaded (updated) to the die 350 (or attendant memory) or be stored upon manufacturing of the die 350. In some embodiments, the die 350 may include at least one processor and at least one memory element, along with any other suitable hardware and/or software to enable its intended functionality of controlling operation of the die 302 as described herein. A processor of the die 350 may execute software or an algorithm to perform the activities discussed herein. A processor of the die 350 may be communicatively coupled to other system elements via one or more interconnects or buses (e.g., through one or more conductive pathways 319). Such a processor may include any combination of hardware, software, or firmware providing programmable logic, including by way of non-limiting example, a microprocessor, a digital signal processor (DSP), a field-programmable gate array (FPGA), a programmable logic array (PLA), an application-specific integrated circuit (ASIC), or a virtual machine processor. The processor of the die 350 may be communicatively coupled to the memory element of the die 350, for example, in a direct-memory access (DMA) configuration. A memory element of the die 350 may include any suitable volatile or nonvolatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. In some embodiments, the memory element and the processor of the "die 350" may themselves be provided by separate physical dies that are in electrical communication. The information being tracked or sent to the die 350 could be provided in any database, register, control list, cache, or storage structure, all of which can be referenced at any suitable timeframe. The die 350 can further include suitable interfaces for receiving, transmitting, and/or otherwise communicating data or information in a network environment (e.g., via the conductive pathways 319).

In some embodiments, the die 350 may be configured to apply appropriate voltages to any one of the gates 106/108 (acting as, e.g., plunger gates, barrier gates, and/or accumulation gates) in order to initialize and manipulate the quantum dots 142, as discussed above. For example, by controlling the voltage applied to a gate 106/108 acting as a plunger gate, the die 350 may modulate the electric field underneath that gate to create an energy valley between the tunnel barriers created by adjacent barrier gates. In another example, by controlling the voltage applied to a gate 106/108 acting as a barrier gate, the die 350 may change the height of the tunnel barrier. When a barrier gate is used to set a tunnel barrier between two plunger gates, the barrier gate may be used to transfer charge carriers between quantum dots 142 that may be formed under these plunger gates. When a barrier gate is used to set a tunnel barrier between a plunger gate and an accumulation gate, the barrier gate may be used to transfer charge carriers in and out of the quantum dot array via the accumulation gate. The term "accumulation gate" may refer to a gate used to form a 2DEG in an area that is between the area where the quantum dots 142 may be formed and a charge carrier reservoir (e.g., the doped regions 140). Changing the voltage applied to the accumulation gate may allow the die 350 to control the number of charge carriers in the area under the accumulation gate. For example, changing the voltage applied to the accumulation gate may reduce the number of charge carriers in the area under the gate so that single charge carriers can be transferred from the reservoir into the quantum well layer 152, and vice versa. In some embodiments, the "outermost" gates 106 in a quantum dot device 100 may serve as accumulation gates. In some embodiments, these outermost gates 106 may have a greater length 168 than "inner" gates 106.

As noted above, the die 350 may provide electrical signals to control spins of charge carriers in quantum dots 142 of the quantum dot device(s) 100 of the die 302 by controlling a magnetic field generated by one or more magnet line(s) 121. In this manner, the die 350 may initialize and manipulate spins of the charge carriers in the quantum dots 142 to implement qubit operations. If the magnetic field for a die 302 is generated by a microwave transmission line, then the die 350 may set/manipulate the spins of the charge carriers by applying appropriate pulse sequences to manipulate spin precession. Alternatively, the magnetic field for a quantum dot device 100 of the die 302 may be generated by a magnet with one or more pulsed gates; the die 350 may apply the pulses to these gates.

In some embodiments, the die 350 may be configured to determine the values of the control signals applied to the elements of the die 302 (e.g. determine the voltages to be applied to the various gates 106/108) to achieve desired quantum operations (communicated to the die 350 through the package substrate 304 via the conductive pathways 319). In other embodiments, the die 350 may be preprogrammed with at least some of the control parameters (e.g. with the values for the voltages to be applied to the various gates 106/108) during the initialization of the die 350.

In the quantum dot device package 300 (FIG. 51), first-level interconnects 306 may be disposed between the first face 320 of the die 302 and the second face 326 of a package substrate 304. Having first-level interconnects 306 disposed between the first face 320 of the die 302 and the second face 326 of the package substrate 304 (e.g., using solder bumps as part of flip chip packaging techniques) may enable the quantum dot device package 300 to achieve a smaller footprint and higher die-to-package-substrate connection density than could be achieved using conventional wirebond techniques (in which conductive contacts between the die 302 and the package substrate 304 are constrained to be located on the periphery of the die 302). For example, a die 302 having a square first face 320 with side length N may be able to form only 4N wirebond interconnects to the package substrate 304, versus $N^2$ flip chip interconnects (utilizing the entire "full field" surface area of the first face 320). Additionally, in some applications, wirebond interconnects may generate unacceptable amounts of heat that may damage or otherwise interfere with the performance of the quantum dot device 100. Using solder bumps as the first-level interconnects 306 may enable the quantum dot device package 300 to have much lower parasitic inductance relative to using wirebonds to couple the die 302 and the package substrate 304, which may result in an improvement in signal integrity for high speed signals communicated between the die 302 and the package substrate 304. Similarly, first-level interconnects 309 may be disposed between conductive contacts 371 of the die 350 and conductive contacts 379 at the second face 326 of the package substrate 304, as shown, to couple electronic components (not shown) in the die 350 to conductive pathways in the package substrate 304.

The package substrate 304 may include a first face 324 and an opposing second face 326. Conductive contacts 399 may be disposed at the first face 324, and conductive contacts 379 may be disposed at the second face 326. Solder resist material 314 may be disposed around the conductive contacts 379, and solder resist material 312 may be disposed around the conductive contacts 399; the solder resist materials 314 and 312 may take any of the forms discussed above with reference to the solder resist material 367. In some embodiments, the solder resist material 312 and/or the solder resist material 314 may be omitted. Conductive pathways may extend through the insulating material 310 between the first face 324 and the second face 326 of the package substrate 304, electrically coupling various ones of the conductive contacts 399 to various ones of the conductive contacts 379, in any desired manner. The insulating material 310 may be a dielectric material (e.g., an ILD), and may take the form of any of the embodiments of the insulating material 130 disclosed herein, for example. The conductive pathways may include one or more conductive vias 395 and/or one or more conductive lines 397, for example.

For example, the package substrate 304 may include one or more conductive pathways 313 to electrically couple the die 302 to conductive contacts 399 on the first face 324 of the package substrate 304; these conductive pathways 313 may be used to allow the die 302 to electrically communicate with a circuit component to which the quantum dot device package 300 is coupled (e.g., a circuit board or interposer, as discussed below). The package substrate 304 may include one or more conductive pathways 319 to electrically couple the die 350 to conductive contacts 399 on the first face 324 of the package substrate 304; these conductive pathways 319 may be used to allow the die 350 to electrically communicate with a circuit component to which the quantum dot device package 300 is coupled (e.g., a circuit board or interposer, as discussed below).

The package substrate 304 may include one or more conductive pathways 317 to electrically couple the die 302 to the die 350 through the package substrate 304. In particular, the package substrate 304 may include conductive pathways 317 that couple different ones of the conductive contacts 379 on the second face 326 of the package substrate 304 so that, when the die 302 and the die 350 are coupled to these different conductive contacts 379, the die 302 and the die 350 may communicate through the package substrate 304. Although the die 302 and the die 350 are illustrated in FIG. 51 as being disposed on the same second face 326 of the package substrate 304, in some embodiments, the die 302 and the die 350 may be disposed on different faces of the package substrate 304 (e.g., one on the first face 324 and one on the second face 326), and may communicate via one or more conductive pathways 317.

In some embodiments, the conductive pathways 317 may be microwave transmission lines. Microwave transmission lines may be structured for the effective transmission of microwave signals, and may take the form of any microwave transmission lines known in the art. For example, a conductive pathway 317 may be a coplanar waveguide, a stripline, a microstrip line, or an inverted microstrip line. The die 350 may provide microwave pulses along the conductive pathways 317 to the die 302 to provide electron spin resonance (ESR) pulses to the quantum dot device(s) 100 to manipulate the spin states of the quantum dots 142 that form therein. In some embodiments, the die 350 may generate a microwave pulse that is transmitted over a conductive pathway 317 and induces a magnetic field in the magnet line(s) 121 of a quantum dot device 100 and causes a transition between the spin-up and spin-down states of a quantum dot 142. In some embodiments, the die 350 may generate a microwave pulse that is transmitted over a conductive pathway 317 and induces a magnetic field in a gate 106/108 to cause a transition between the spin-up and spin-down states of a quantum dot 142. The die 350 may enable any such embodiments, or any combination of such embodiments.

The die 350 may provide any suitable control signals to the die 302 to enable operation of the quantum dot device(s) 100 included in the die 302. For example, the die 350 may provide voltages (through the conductive pathways 317) to the gates 106/108, and thereby tune the energy profile in the quantum well stack 146.

In some embodiments, the quantum dot device package 300 may be a cored package, one in which the package substrate 304 is built on a carrier material (not shown) that remains in the package substrate 304. In such embodiments, the carrier material may be a dielectric material that is part of the insulating material 310; laser vias or other through-holes may be made through the carrier material to allow conductive pathways 313 and/or 319 to extend between the first face 324 and the second face 326.

In some embodiments, the package substrate 304 may be or may otherwise include a silicon interposer, and the conductive pathways 313 and/or 319 may be through-silicon vias. Silicon may have a desirably low coefficient of thermal expansion compared with other dielectric materials that may be used for the insulating material 310, and thus may limit the degree to which the package substrate 304 expands and contracts during temperature changes relative to such other materials (e.g., polymers having higher coefficients of thermal expansion). A silicon interposer may also help the package substrate 304 achieve a desirably small line width and maintain high connection density to the die 302 and/or the die 350.

Limiting differential expansion and contraction may help preserve the mechanical and electrical integrity of the quantum dot device package 300 as the quantum dot device package 300 is fabricated (and exposed to higher temperatures) and used in a cooled environment (and exposed to lower temperatures). In some embodiments, thermal expansion and contraction in the package substrate 304 may be managed by maintaining an approximately uniform density of the conductive material in the package substrate 304 (so that different portions of the package substrate 304 expand and contract uniformly), using reinforced dielectric materials as the insulating material 310 (e.g., dielectric materials with silicon dioxide fillers), or utilizing stiffer materials as the insulating material 310 (e.g., a prepreg material including glass cloth fibers). In some embodiments, the die 350 may be formed of semiconductor materials or compound semiconductor materials (e.g., group III-group V compounds) to enable higher efficiency amplification and signal generation to minimize the heat generated during operation and reduce the impact on the quantum operations of the die 302. In some embodiments, the metallization in the die 350 may use superconducting materials (e.g., titanium nitride, niobium, niobium nitride, and niobium titanium nitride) to minimize heating.

The conductive contacts 365 of the die 302 may be electrically coupled to the conductive contacts 379 of the package substrate 304 via the first-level interconnects 306, and the conductive contacts 371 of the die 350 may be electrically coupled to the conductive contacts 379 of the package substrate 304 via the first-level interconnects 309. In some embodiments, the first-level interconnects 306/309 may include solder bumps or balls (as illustrated in FIG. 51); for example, the first-level interconnects 306/309 may be flip chip (or controlled collapse chip connection, "C4") bumps disposed initially on the die 302/die 350 or on the package substrate 304. Second-level interconnects 308 (e.g., solder balls or other types of interconnects) may couple the conductive contacts 399 on the first face 324 of the package substrate 304 to another component, such as a circuit board (not shown). Examples of arrangements of electronics packages that may include an embodiment of the quantum dot device package 300 as discussed below with reference to FIG. 53. The die 302 and/or the die 350 may be brought in contact with the package substrate 304 using a pick-and-place apparatus, for example, and a reflow or thermal compression bonding operation may be used to couple the die 302 and/or the die 350 to the package substrate 304 via the first-level interconnects 306 and/or the first-level interconnects 309, respectively.

The conductive contacts 365, 371, 379, and/or 399 may include multiple layers of material that may be selected to serve different purposes. In some embodiments, the conductive contacts 365, 371, 379, and/or 399 may be formed of aluminum, and may include a layer of gold (e.g., with a thickness of less than 1 micron) between the aluminum and the adjacent interconnect to limit the oxidation of the surface of the contacts and improve the adhesion with adjacent solder. In some embodiments, the conductive contacts 365, 371, 379, and/or 399 may be formed of aluminum, and may include a layer of a barrier metal such as nickel, as well as a layer of gold, wherein the layer of barrier metal is disposed between the aluminum and the layer of gold, and the layer of gold is disposed between the barrier metal and the adjacent interconnect. In such embodiments, the gold may protect the barrier metal surface from oxidation before assembly, and the barrier metal may limit the diffusion of solder from the adjacent interconnects into the aluminum.

In some embodiments, the structures and materials in the quantum dot device 100 may be damaged if the quantum dot device 100 is exposed to the high temperatures that are common in conventional integrated circuit processing (e.g., greater than 100 degrees Celsius, or greater than 200 degrees Celsius). In particular, in embodiments in which the first-level interconnects 306/309 include solder, the solder may be a low temperature solder (e.g., a solder having a melting point below 100 degrees Celsius) so that it can be melted to couple the conductive contacts 365/371 and the conductive contacts 379 without having to expose the die 302 to higher temperatures and risk damaging the quantum dot device 100. Examples of solders that may be suitable include indium-based solders (e.g., solders including indium alloys). When low temperature solders are used, however, these solders may not be fully solid during handling of the quantum dot device package 300 (e.g., at room temperature or temperatures between room temperature and 100 degrees Celsius), and thus the solder of the first-level interconnects 306/309 alone may not reliably mechanically couple the die 302/die 350 and the package substrate 304 (and thus may not reliably electrically couple the die 302/die 350 and the package substrate 304). In some such embodiments, the quantum dot device package 300 may further include a mechanical stabilizer to maintain mechanical coupling between the die 302/die 350 and the package substrate 304, even when solder of the first-level interconnects 306/309 is not solid. Examples of mechanical stabilizers may include an underfill material disposed between the die 302/die 350 and the package substrate 304, a corner glue disposed between the die 302/die 350 and the package substrate 304, an overmold material disposed around the die 302/die 350 on the package substrate 304, and/or a mechanical frame to secure the die 302/die 350 and the package substrate 304.

In some embodiments of the quantum dot device package 300, the die 350 may not be included in the package 300; instead, the die 350 may be electrically coupled to the die 302 through another type of common physical support. For example, the die 350 may be separately packaged from the die 302 (e.g., the die 350 may be mounted to its own package substrate), and the two packages may be coupled together through an interposer, a printed circuit board, a bridge, a package-on-package arrangement, or in any other manner. Examples of device assemblies that may include the die 302 and the die 350 in various arrangements are discussed below with reference to FIG. 53.

FIGS. 52A-52B are top views of a wafer 450 and dies 452 that may be formed from the wafer 450; the dies 452 may be included in any of the quantum dot device packages (e.g., the quantum dot device package 300) disclosed herein. The wafer 450 may include semiconductor material and may include one or more dies 452 having conventional and quantum dot device elements formed on a surface of the wafer 450. Each of the dies 452 may be a repeating unit of a semiconductor product that includes any suitable conventional and/or quantum dot device. After the fabrication of the semiconductor product is complete, the wafer 450 may undergo a singulation process in which each one of the dies 452 is separated from the others to provide discrete "chips" of the semiconductor product. A die 452 may include one or more quantum dot devices 100 and/or supporting circuitry to route electrical signals to the quantum dot devices 100 (e.g., interconnects including conductive vias and lines), as well as any other integrated circuit (IC) components. In some embodiments, the wafer 450 or the die 452 may include a memory device (e.g., a static random access memory (SRAM) device), a logic device (e.g., AND, OR, NAND, or NOR gate), or any other suitable circuit element. Multiple ones of these devices may be combined on a single die 452. For example, a memory array formed by multiple memory devices may be formed on a same die 452 as a processing device (e.g., the processing device 2002 of FIG. 55) or other logic that is configured to store information in the memory devices or execute instructions stored in the memory array.

FIG. 53 is a cross-sectional side view of a device assembly 400 that may include any of the embodiments of the quantum dot device packages 300 disclosed herein. The device assembly 400 includes a number of components disposed on a circuit board 402. The device assembly 400 may include components disposed on a first face 440 of the circuit board 402 and an opposing second face 442 of the circuit board 402; generally, components may be disposed on one or both faces 440 and 442.

In some embodiments, the circuit board 402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 402. In other embodiments, the circuit board 402 may be a package substrate or flexible board. In some embodiments, the die 302 and the die 350 (FIG. 51) may be separately packaged and coupled together via the circuit board 402 (e.g., the conductive pathways 317 may run through the circuit board 402).

The device assembly 400 illustrated in FIG. 53 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 51), male and female portions of a socket, an adhesive, an underfill material, and/or any other suitable electrical and/or mechanical coupling structure.

The package-on-interposer structure 436 may include a package 420 coupled to an interposer 404 by coupling components 418. The coupling components 418 may take any suitable form for the application, such as the forms discussed above with reference to the coupling components 416. For example, the coupling components 418 may be the second-level interconnects 308. Although a single package 420 is shown in FIG. 53, multiple packages may be coupled to the interposer 404; indeed, additional interposers may be coupled to the interposer 404. The interposer 404 may provide an intervening substrate used to bridge the circuit board 402 and the package 420. The package 420 may be a quantum dot device package 300 or may be a conventional IC package, for example. In some embodiments, the package 420 may take the form of any of the embodiments of the quantum dot device package 300 disclosed herein, and may include a quantum dot device die 302 coupled to a package substrate 304 (e.g., by flip chip connections). Generally, the interposer 404 may spread a connection to a wider pitch or reroute a connection to a different connection. For example, the interposer 404 may couple the package 420 (e.g., a die) to a ball grid array (BGA) of the coupling components 416 for coupling to the circuit board 402. In the embodiment illustrated in FIG. 53, the package 420 and the circuit board 402 are attached to opposing sides of the interposer 404; in other embodiments, the package 420 and the circuit board 402 may be attached to a same side of the interposer 404. In some embodiments, three or more components may be interconnected by way of the interposer 404. In some embodiments, a quantum dot device package 300 including the die 302 and the die 350 (FIG. 51) may be one of the packages disposed on an interposer like the interposer 404. In some embodiments, the die 302 and the die 350 (FIG. 51) may be separately packaged and coupled together via the interposer 404 (e.g., the conductive pathways 317 may run through the interposer 404).

The interposer 404 may be formed of an epoxy resin, a fiberglass-reinforced epoxy resin, a ceramic material, or a polymer material such as polyimide. In some embodiments, the interposer 404 may be formed of alternate rigid or flexible materials that may include the same materials described above for use in a semiconductor substrate, such as silicon, germanium, and other group III-group V compounds and group IV materials. The interposer 404 may include metal interconnects 408 and vias 410, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The device assembly 400 may include a package 424 coupled to the first face 440 of the circuit board 402 by coupling components 422. The coupling components 422 may take the form of any of the embodiments discussed above with reference to the coupling components 416, and the package 424 may take the form of any of the embodiments discussed above with reference to the package 420. The package 424 may be a quantum dot device package 300 (e.g., including the die 302 and the die 350, or just the die 302) or may be a conventional IC package, for example. In some embodiments, the package 424 may take the form of any of the embodiments of the quantum dot device package 300 disclosed herein, and may include a quantum dot device die 302 coupled to a package substrate 304 (e.g., by flip chip connections).

The device assembly 400 illustrated in FIG. 53 includes a package-on-package structure 434 coupled to the second face 442 of the circuit board 402 by coupling components 428. The package-on-package structure 434 may include a package 426 and a package 432 coupled together by coupling components 430 such that the package 426 is disposed between the circuit board 402 and the package 432. The coupling components 428 and 430 may take the form of any of the embodiments of the coupling components 416 discussed above, and the packages 426 and 432 may take the form of any of the embodiments of the package 420 discussed above. Each of the packages 426 and 432 may be a quantum dot device package 300 or may be a conventional IC package, for example. In some embodiments, one or both of the packages 426 and 432 may take the form of any of the embodiments of the quantum dot device package 300 disclosed herein, and may include a die 302 coupled to a package substrate 304 (e.g., by flip chip connections). In some embodiments, a quantum dot device package 300 including the die 302 and the die 350 (FIG. 51) may be one of the packages in a package-on-package structure like the package-on-package structure 434. In some embodiments, the die 302 and the die 350 (FIG. 51) may be separately packaged and coupled together using a package-on-package structure like the package-on-package structure 434 (e.g., the conductive pathways 317 may run through a package substrate of one or both of the packages of the dies 302 and 350).

Figure 54:
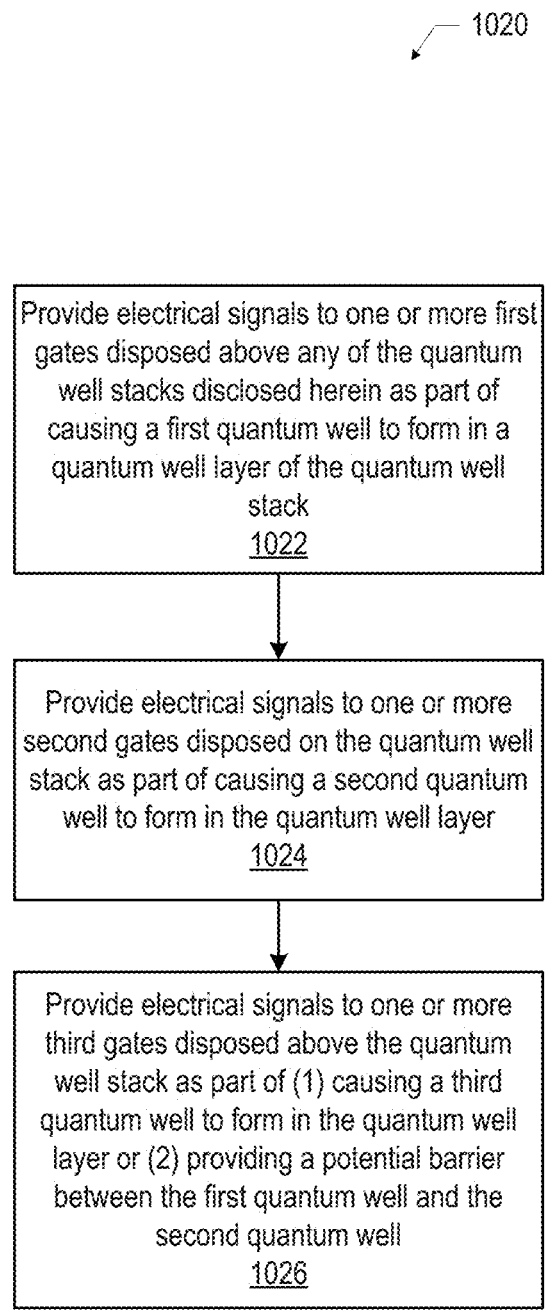
FIG. 54 is a flow diagram of an illustrative method of operating a quantum dot device, in accordance with various embodiments.

A number of techniques are disclosed herein for operating a quantum dot device 100. FIG. 54 is a flow diagram of a particular illustrative method 1020 of operating a quantum dot device, in accordance with various embodiments. Although the operations discussed below with reference to the method 1020 are illustrated in a particular order and depicted once each, these operations may be repeated or performed in a different order (e.g., in parallel), as suitable. Additionally, various operations may be omitted, as suitable. Various operations of the method 1020 may be illustrated with reference to one or more of the embodiments discussed above, but the method 1020 may be used to operate any suitable quantum dot device (including any suitable ones of the embodiments disclosed herein).

At 1022, electrical signals may be provided to one or more first gates disposed above a quantum well stack as part of causing a first quantum well to form in a quantum well layer in the quantum well stack. The quantum well stack may take the form of any of the embodiments disclosed herein (e.g., the quantum well stacks 146 discussed above with reference to FIGS. 35-37), and may be included in any of the quantum dot devices 100 disclosed herein. For example, a voltage may be applied to a gate 108-11 as part of causing a first quantum well (for a first quantum dot 142) to form in the quantum well stack 146 below the gate 108-11.

At 1024, electrical signals may be provided to one or more second gates disposed above the quantum well stack as part of causing a second quantum well to form in the quantum well layer. For example, a voltage may be applied to the gate 108-12 as part of causing a second quantum well (for a second quantum dot 142) to form in the quantum well stack 146 below the gate 108-12.

At 1026, electrical signals may be provided to one or more third gates disposed above the quantum well stack as part of (1) causing a third quantum well to form in the quantum well layer or (2) providing a potential barrier between the first quantum well and the second quantum well. For example, a voltage may be applied to the gate 106-12 as part of (1) causing a third quantum well (for a third quantum dot 142) to form in the quantum well stack 146 below the gate 106-12 (e.g., when the gate 106-12 acts as a "plunger" gate) or (2) providing a potential barrier between the first quantum well (under the gate 108-11) and the second quantum well (under the gate 108-12) (e.g., when the gate 106-12 acts as a "barrier" gate).

Figure 55:
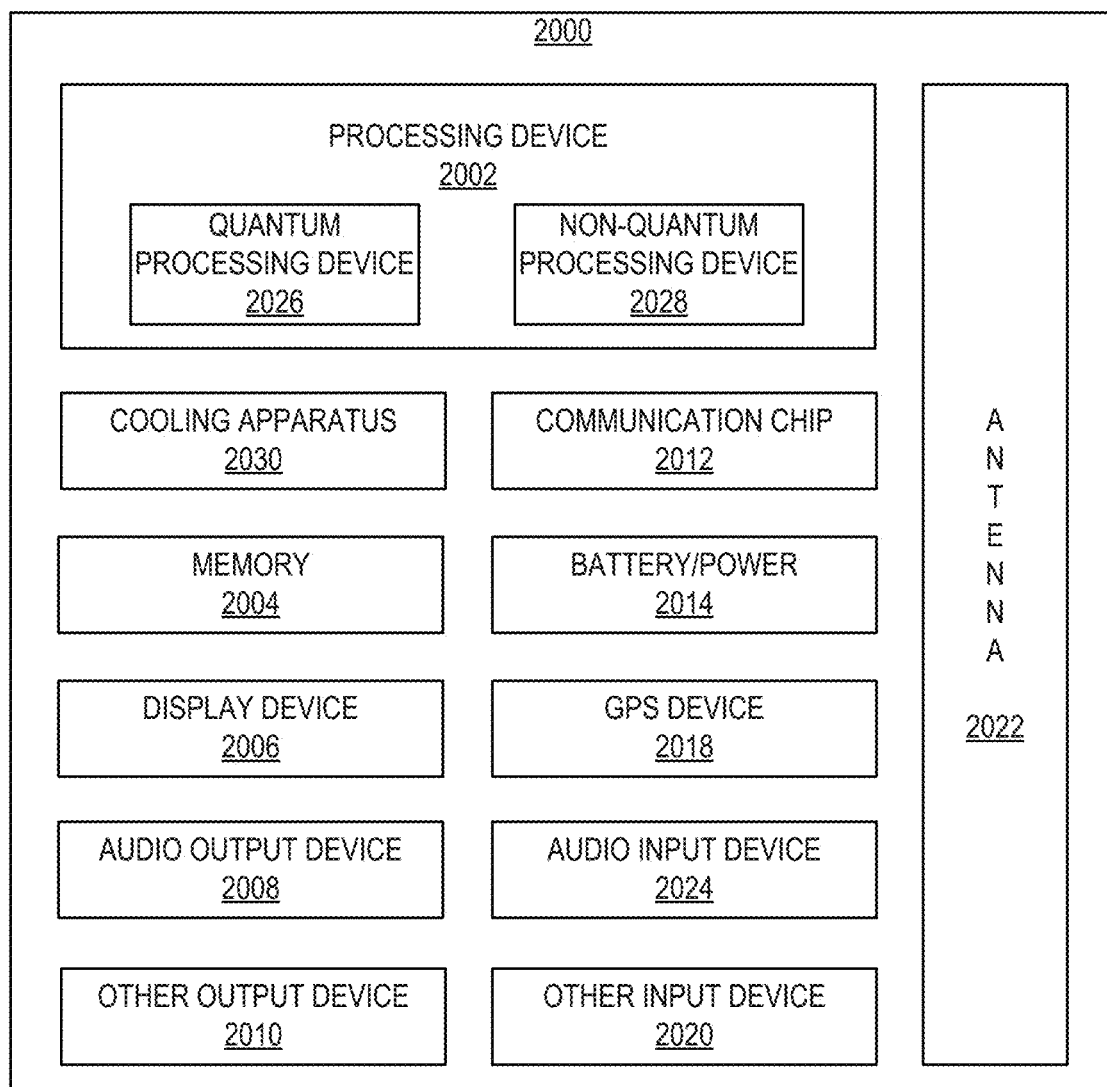
FIG. 55 is a block diagram of an example quantum computing device that may include any of the quantum dot devices disclosed herein, in accordance with various embodiments.

FIG. 55 is a block diagram of an example quantum computing device 2000 that may include any of the quantum dot devices disclosed herein. A number of components are illustrated in FIG. 55 as included in the quantum computing device 2000, but any one or more of these components may be omitted or duplicated, as suitable for the application. In some embodiments, some or all of the components included in the quantum computing device 2000 may be attached to one or more PCBs (e.g., a motherboard). In some embodiments, various ones of these components may be fabricated onto a single SoC die. Additionally, in various embodiments, the quantum computing device 2000 may not include one or more of the components illustrated in FIG. 55, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters. For example, the quantum processing device 2026 may include circuitry (e.g., a current source) to provide current pulses to one or more magnet lines 121 included in the quantum dot device 100.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more DSPs, ASICs, central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., ROM), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random access memory (STT-MRAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as global positioning system (GPS), EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a GPS device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide various examples of the embodiments disclosed herein.

Example 1 is a quantum dot device, including: a quantum well stack; an insulating material above the quantum well stack, wherein the insulating material includes a trench region; a first gate and an adjacent second gate above the quantum well stack, wherein the first gate and the second gate are above the insulating material and extend into the trench region; and a gate wall in the trench region between the first gate and the second gate, wherein the gate wall includes the insulating material.

Example 2 includes the subject matter of Example 1, and further specifies that the gate wall includes a hardmask.

Example 3 includes the subject matter of Example 2, and further specifies that the insulating material is between the hardmask and the quantum well stack.

Example 4 includes the subject matter of any of Examples 1-3, and further specifies that the gate wall includes an etch stop layer.

Example 5 includes the subject matter of Example 4, and further specifies that the etch stop layer is between the insulating material and the quantum well stack.

Example 6 includes the subject matter of any of Examples 1-5, and further specifies that the first gate includes a first gate metal, the second gate includes a second gate metal, and the first gate metal has a same material composition as the second gate metal.

Example 7 includes the subject matter of Example 6, and further specifies that the first gate metal has a damascene fill grain structure.

Example 8 includes the subject matter of Example 7, and further specifies that the second gate metal has a damascene fill grain structure.

Example 9 includes the subject matter of any of Examples 6-8, and further specifies that the first gate includes a first gate dielectric, the second gate includes a second gate dielectric, and the first gate dielectric has a same material composition as the second gate dielectric.

Example 10 includes the subject matter of Example 9, and further specifies that the first gate dielectric and the second gate dielectric are part of a single planar layer of gate dielectric material above the quantum well stack.

Example 11 includes the subject matter of Example 10, and further specifies that the first gate dielectric has a U-shaped cross-section.

Example 12 includes the subject matter of Example 11, and further specifies that the second gate dielectric has a U-shaped cross-section.

Example 13 includes the subject matter of any of Examples 6-12, and further specifies that the first gate includes a first liner material, the second gate includes a second liner material, and the first liner material has a same material composition as the second liner material.

Example 14 includes the subject matter of any of Examples 1-13, and further specifies that the trench region is bowed outwards or tapered inwards.

Example 15 includes the subject matter of any of Examples 1-14, and further specifies that the insulating material includes an interlayer dielectric.

Example 16 includes the subject matter of any of Examples 1-15, and further specifies that the insulating material is a first insulating material, and the quantum dot device further includes: a second insulating material above the first gate and the second gate.

Example 17 includes the subject matter of Example 16, and further specifies that the second insulating material has a same material composition as the first insulating material.

Example 18 includes the subject matter of any of Examples 1-17, and further specifies that the quantum well stack includes a quantum well layer.

Example 19 includes the subject matter of any of Examples 1-18, and further specifies that the quantum well stack is at least partially included in a fin.

Example 20 includes the subject matter of any of Examples 1-19, and further specifies that the trench region is a first trench region, the insulating material includes a second trench region parallel to the first trench region, and the quantum dot device further includes: a third gate and an adjacent fourth gate above the quantum well stack, wherein the third gate and the fourth gate are above the insulating material and extend into the second trench region.

Example 21 includes the subject matter of Example 20, and further specifies that the gate wall is a first gate wall, and the quantum dot device further includes: a second gate wall in the second trench region between the third gate and the fourth gate, wherein the second gate wall includes the insulating material.

Example 22 includes the subject matter of Example 21, and further specifies that the insulating material is between the first gate and the third gate.

Example 23 is a method of operating a quantum dot device, including: providing electrical signals to one or more first gates in a linear gate array above a quantum well stack as part of causing a first quantum well to form in a quantum well layer in the quantum well stack; providing electrical signals to one or more second gates in the linear gate array above the quantum well stack as part of causing a second quantum well to form in the quantum well layer in the quantum well stack; and providing electrical signals to one or more third gates in the linear gate array above the quantum well stack to (1) cause a third quantum well to form in the quantum well layer in the quantum well stack or (2) provide a potential barrier between the first quantum well and the second quantum well; wherein the linear gate array is in a trench region in an insulating material, gate walls are between adjacent gates in the linear gate array, and the gate walls include the insulating material.

Example 24 includes the subject matter of Example 23, and further specifies that gate metal of gates of the linear gate array has a damascene fill grain structure.

Example 25 includes the subject matter of any of Examples 23-24, and further includes: populating the first quantum well with a quantum dot.

Example 26 is a method of manufacturing a quantum dot device, including: forming a quantum well stack; forming a layer of insulating material above the quantum well stack; forming via openings through the layer of insulating material; and forming gates that extend over the layer of insulating material and into the via openings.

Example 27 includes the subject matter of Example 26, and further specifies that forming gates includes: forming gate metal in the via openings.

Example 28 includes the subject matter of any of Examples 26-27, and further specifies that forming gates includes: forming a conformal layer of liner material in the via openings.

Example 29 includes the subject matter of any of Examples 26-28, and further specifies that forming gates includes: forming a conformal layer of gate dielectric in the via openings.

Example 30 is a quantum computing device, including: a quantum processing device, wherein the quantum processing device includes a quantum well stack, a plurality of linear arrays of gates above the quantum well stack to control quantum dot formation in the quantum well stack, wherein an insulating material is between a first linear array of gates and a second linear array of gates, the insulating material is between individual gates in the first linear array of gates, and gate metal of the first linear array of gates extends over the insulating material; and a non-quantum processing device, coupled to the quantum processing device, to control voltages applied to the plurality of linear arrays of gates.

Example 31 includes the subject matter of Example 30, and further includes: a memory device to store data generated by quantum dots formed in the quantum well stack during operation of the quantum processing device.

Example 32 includes the subject matter of Example 31, and further specifies that the memory device is to store instructions for a quantum computing algorithm to be executed by the quantum processing device.

Example 33 includes the subject matter of any of Examples 30-32, and further includes: a cooling apparatus to maintain a temperature of the quantum processing device below 5 Kelvin.

Example 34 includes the subject matter of any of Examples 30-33, and further specifies that the gate metal has a damascene fill grain structure.

Example 35 includes the subject matter of any of Examples 30-34, and further specifies that gates of the first linear array of gates include via portions that extend down to the quantum well stack.

The invention claimed is:

1. A quantum computing device, comprising:
    a quantum processing device, wherein the quantum processing device includes a quantum well stack, a plurality of linear arrays of gates above the quantum well stack to control quantum dot formation in the quantum well stack, wherein an insulating material is between a first linear array of gates and a second linear array of gates, the insulating material is between individual gates in the first linear array of gates, and gate metal of the first linear array of gates extends over the insulating material; and
    a non-quantum processing device, coupled to the quantum processing device, to control voltages applied to the plurality of linear arrays of gates.

2. The quantum computing device of claim 1, further comprising:
    a memory device to store data generated by quantum dots formed in the quantum well stack during operation of the quantum processing device.

3. The quantum computing device of claim 1, wherein the gate metal has a damascene fill grain structure.

4. The quantum computing device of claim 1, wherein gates of the first linear array of gates include via portions that extend down to the quantum well stack.

5. The quantum computing device of claim 1, wherein:
    the individual gates in the first linear array of gates include a first gate and an adjacent second gate,
    a gate wall is between the first gate and the second gate,
    the gate wall includes the insulating material and a hardmask, and
    the insulating material is between the hardmask and the quantum well stack.

6. The quantum computing device of claim 5, wherein:
    the gate wall further includes an etch stop material, and
    the etch stop material is between the insulating material and the quantum well stack.

7. A quantum dot device, comprising:
    a quantum well stack;
    a first linear array of gates and a second linear array of gates above the quantum well stack; and
    an insulating material between the first linear array of gates and the second linear array of gates,
    wherein the insulating material is further between individual gates in the first linear array of gates, and wherein gate metal of the first linear array of gates extends over the insulating material.

8. The quantum dot device according to claim 7, wherein:
    the individual gates in the first linear array of gates include a first gate and an adjacent second gate,
    a gate wall is between the first gate and the second gate,
    the gate wall includes the insulating material and a hardmask, and
    the insulating material is between the hardmask and the quantum well stack.

9. The quantum dot device according to claim 8, wherein:
    the gate wall further includes an etch stop material, and
    the etch stop material is between the insulating material and the quantum well stack.

10. The quantum dot device according to claim 7, wherein the gate metal of the first linear array of gates has a damascene fill grain structure.

11. The quantum dot device according to claim 7, wherein gates of the first linear array of gates include via portions that extend down to the quantum well stack.

12. The quantum dot device according to claim 7, wherein the quantum well stack includes a quantum well layer.

13. The quantum dot device according to claim 7, wherein the insulating material is a first insulating material, and the quantum dot device further includes:
- a second insulating material above the first linear array of gates and the second linear array of gates.

14. A quantum dot device, comprising:
- a base;
- a fin extending away from the base, the fin comprising a quantum well layer;
- a first insulating material in contact with sidewalls of the fin;
- a second insulating material above the fin, wherein the second insulating material includes a trench region;
- a gate dielectric, wherein a portion of the gate dielectric that is on a top of the fin is a bottom of the trench region; and
- a first gate and an adjacent second gate above the second insulating material and extending into the trench region.

15. The quantum dot device according to claim 14, wherein the second insulating material is further in the trench region, between a portion of the first gate that extends into the trench region and a portion of the second gate that extends into the trench region.

16. The quantum dot device according to claim 15, further comprising an etch stop material in the trench region, wherein the etch stop material is between the portion of the gate dielectric that is the bottom of the trench region and the second insulating material in the trench region.

17. The quantum dot device according to claim 14, wherein the gate dielectric is further between the first insulating material and the second insulating material.

18. The quantum dot device according to claim 14, wherein a distance between a portion of the first gate that extends into the trench region and a portion of the second gate that extends into the trench region is between 3 nanometers and 30 nanometers.

19. The quantum dot device according to claim 14, wherein a projection of the fin onto the base overlaps with a projection of the trench region onto the base.

20. The quantum dot device according to claim 19, wherein a longitudinal axis of the fin is parallel to a longitudinal axis of the trench region.

21. The quantum dot device according to claim 14, wherein a width of the fin is between 5 and 30 nanometers.

22. The quantum dot device according to claim 14, wherein:
- the fin is a first fin,
- the quantum well layer is a first quantum well layer,
- the quantum dot device further includes a second fin comprising a second quantum well layer, and
- a longitudinal axis of the first fin and a longitudinal axis of the first fin are parallel.

* * * * *